US006403459B1

(12) United States Patent
Ohashi et al.

(10) Patent No.: US 6,403,459 B1
(45) Date of Patent: Jun. 11, 2002

(54) FABRICATION PROCESS OF SEMICONDUCTOR INTEGRATED CIRCUIT DEVICE

(75) Inventors: Naofumi Ohashi, Hannou; Hizuru Yamaguchi, Akishima; Junji Noguchi; Nobuo Owada, both of Ohme, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/669,672

(22) Filed: Sep. 26, 2000

Related U.S. Application Data

(63) Continuation of application No. 09/123,319, filed on Jul. 28, 1998, now Pat. No. 6,184,143.

(30) Foreign Application Priority Data

Sep. 8, 1997 (JP) .............................. 9-242825
Mar. 27, 1998 (JP) .............................. 10-81415

(51) Int. Cl.⁷ ......................................... H01L 21/4763
(52) U.S. Cl. ..................... 438/618; 438/626; 438/624
(58) Field of Search ................... 438/618–640

(56) References Cited

U.S. PATENT DOCUMENTS

| | | | |
|---|---|---|---|
| 5,312,512 A | 5/1994 | Allman ........................ 154/636 |
| 5,650,360 A | 7/1997 | Tomita ........................ 437/235 |
| 5,702,982 A | * 12/1997 | Lee et al. |
| 5,739,579 A | * 4/1998 | Chiang et al. ............... 257/635 |
| 5,872,043 A | 2/1999 | Chen ........................... 438/424 |
| 5,883,014 A | 3/1999 | Chen et al. .................. 438/782 |
| 5,891,513 A | * 4/1999 | Dubin et al. ................. 427/98 |
| 5,902,752 A | 5/1999 | Sun .............................. 437/195 |
| 5,904,557 A | 5/1999 | Komiya ........................ 438/633 |
| 5,918,146 A | 6/1999 | Yamashita .................... 438/631 |
| 5,926,713 A | 7/1999 | Hause .......................... 438/296 |
| 5,926,723 A | 7/1999 | Wang ........................... 438/437 |
| 5,928,960 A | 7/1999 | Greco .......................... 438/692 |
| 5,960,317 A | 9/1999 | Jeong .......................... 438/633 |
| 6,037,664 A | * 3/2000 | Zhao et al. .................. 257/758 |
| 6,090,710 A | * 7/2000 | Andricacos et al. ........ 438/687 |
| 6,143,646 A | * 11/2000 | Wetzel ......................... 438/637 |

FOREIGN PATENT DOCUMENTS

JP    7297183    11/1995

OTHER PUBLICATIONS

G. Bai, et al., "Copper Interconnection Deposition Techniques and Integration", 1996 Symposium on VLSI Technology Digest of Technical Papers, pp. 48–49.

Licata, et al., "Interconnected Fabrication Processes and the Development of Low–Cost Wiring for CMOS Products", IBM J. Res. Develop., vol. 39, No. 4, Jul. 1995.

* cited by examiner

Primary Examiner—Jey Tsai
(74) Attorney, Agent, or Firm—Antonelli, Terry, Stout & Kraus, LLP

(57) ABSTRACT

In a semiconductor integrated circuit wherein an interlayer insulating film is formed over a semiconductor substrate having a semiconductor device formed thereover; and an interconnection embedded in an interconnection groove in the interlayer insulating film is formed by the deposition of a metal film such as copper and polishing by the CMP method, another interlayer insulating film over the interconnection and interlayer insulating film is formed to have a blocking film, a planarizing film and an insulating film. As the planarizing film, a film having fluidity such as SOG is employed.

36 Claims, 59 Drawing Sheets

FABRICATION PROCESS OF SEMICONDUCTOR INTEGRATED CIRCUIT DEVICE

This application is a Continuation application of application Ser. No. 09/123,319, filed Jul. 28, 1998 U.S. Pat. No. 6,184,143.

BACKGROUND OF THE INVENTION

This invention relates to a technique for fabrication of a semiconductor integrated circuit device and the semiconductor integrated circuit device fabricated by using this technique. Particularly, the present invention pertains to a technique which is effective when applied to a semiconductor integrated circuit device having a metal interconnection, which has, as a main conductive film, copper or the like, and is formed by depositing a thin copper film in a groove and removing a portion of the thin copper film from a region outside the groove by the CMP (Chemical Mechanical Polishing) method.

In the conventional semiconductor integrated circuit device, an interconnection film was formed, for example, by forming a thin film of a high-melting-point metal, such as aluminum (Al) alloy or tungsten (W), over an insulating film, forming a resist pattern having the same shape as that of the interconnection pattern over a thin film for interconnection by photolithography and then forming the interconnection pattern by dry etching using the resist pattern as a mask.

The conventional process using an Al alloy or the like is, however-accompanied with a drawback in that, attendant on the miniaturization of the interconnection, the interconnection resistance shows a marked increase, which inevitably increases an interconnection delay, resulting in a deterioration in the performance of the semiconductor integrated circuit device. Such a drawback has led to a serious problem particularly in a high-performance logic LSI and represents a factor for disturbing its performance.

The IBM J. Res. Develop., 39(4), the July issue, 419–435 (1995) or 1996 Symposium on VLSI Technology Digest of Technical Papers, pp48–49, describes a process (so-called damascene method) for forming an interconnection pattern in a groove, which comprises embedding an interconnection metal, which has copper (Cu) as a main conductive film, formed in an insulating film and then removing an unnecessary portion of the metal outside the groove by the CMP (chemical machine polishing) method.

The Japanese Patent Application Laid-Open No. HEI 7-297183, describes a technique which comprises forming an interconnection groove on an insulating film formed over a semiconductor substrate, overlaying another insulating film, overlaying a conductive interconnection film, forming a planarizing film made of SOG (Spin On Glass) so as to embed the interconnection groove with the planarizing film, and polishing the planarizing film. The conductive interconnection film, thereby leaving an interconnection made of the conductive interconnection film in the interconnection groove.

SUMMARY OF THE INVENTION

As a result of investigation on the above process which comprises embedding an interconnection metal having copper (Cu) or the like as a main conductor film in a groove formed in an insulating film and then removing an unnecessary portion of the metal outside the groove by the CMP (Chemical Mechanical Polishing) method, however, the present inventors found that the process is accompanied with the following problems. The problems investigated by the present inventors will be described with reference to FIG. 73(a) to 73(c), in which FIG. 73(a) is a plain view, FIG. 73(b) is a cross-sectional view taken along a line b—b of FIG. FIG. 73(a) and FIG. 73(c) is a cross-sectional view taken along a line c—c of FIG. FIG. 73(a), and wherein only a problematic interconnection film is illustrated while other members are omitted.

For the formation of an interconnection 202 over an insulating film 201, first, an insulating film 203 for interconnection formation is deposited over the insulating film 201 and an interconnection groove 204 is formed in the insulating film 203. As the insulating film 203, a silicon oxide film is usually employed. Second, a metal film (for example, copper (Cu)) which is to constitute the interconnection 202 is deposited over the insulating film 203 so as to embed the interconnection groove 204, followed by the removal of a portion of the metal film over the insulating film 203 outside the interconnection groove 204 by polishing, whereby only the metal film inside the interconnection groove 204 remains and the interconnection 202 is formed. When the silicon oxide film used as the insulating film 203 is compared with the metal (ex. copper) which constitutes the interconnection film 202, the polishing rate of the latter by the CMP method is generally greater. Such a difference in the polishing rate inevitably results in a concave portion 205 being formed on the surface of the interconnection 202. This concave portion 205 is known as dishing (concave). In addition, scratches appear on the surface of the insulating film 203 as a result of polishing by the CMP method.

If an insulating film 206 is formed over such a concave portion 205 or a scratch without removing it from the surface of the insulating film 203, another concave portion 205 or a further concave portion attributable to the scratch also appears on the surface of the insulating film 206. If a plug 207 is formed in the insulating film 206 by the CMP method without removing the concave portion, the conductive substance 208 which constitutes the plug 207 remains in the concave portion on the surface of the insulating film 206. Described more specifically, the plug 207 is formed by embedding a metal film, which is to constitute the plug 207, inside a connecting hole opened in the insulating film 206 and, at the same time, depositing the metal film over the insulating film 206; and then removing the metal film over the insulating film 206 by the CMP method to leave only a portion-of the metal film inside of the connecting hole. If a concave portion (including a concave portion attributable to a scratch) exists on the surface of the insulating film 206, the conductive substance 208, which is a residue of the metal film, also remains inside of the concave portion. Incidentally, there is a possibility of that the metal film will remain in the concave portion attributable to a scratch, but this is not illustrated.

Such a residue of the conductive substance 208 is not intended and is undesired, because when an insulating film 209 is formed over the plug 207 and an interconnection 210 is formed in the interconnection groove of the insulating film 209, two adjacent interconnections 210, which are to be electrically disconnected, form a short circuit owing to the existence of the conductive substance 208, leading to a short-circuit problem in the semiconductor integrated circuit device.

Such a short circuit problem occurs similarly when an interconnection is formed by the so-called dual damascene method without using the plug 207.

An object of the present invention is to provide a technique for improving surface flatness of an interlayer insulating film over a first metal interconnection formed by the CMP method.

Another object of the present invention is to suppress a short circuit of a second metal interconnection over a first metal interconnection formed by the CMP method, thereby improving the yield and reliability of the semiconductor integrated circuit device.

The above-described and other objects and novel features of the present invention will be apparent from the description herein and the drawings attached.

Among the aspects of the inventions disclosed herein, representative ones will next be summarized simply.

(1) In one aspect of the present invention, there is provided a semiconductor integrated circuit device which comprises a semiconductor device formed over a principal surface of a semiconductor substrate; a first insulating film which is formed over the semiconductor device and has a first conductive member, which has been formed by the CMP method, embedded in each of first concave portions formed in the first insulating film; and a second insulating film which is formed over the first insulating film and has a second conductive member, which has been formed by the CMP method, embedded in each of second concave portions formed in the second. insulating film, the second insulating film including a fluid insulating film having self fluidity.

According to such a semiconductor integrated circuit device, even if dishing (concave) appears in the first conductive member, which has been embedded in the first insulating film, as a result of polishing by the CMP method or the first insulating film has a scratch on its surface as a result of polishing by the CMP method, the surface is planarized because the second insulating film includes a fluid insulating film, and influence of the above dishing or scratch is not observed from the surface of the second insulating film, whereby a conductive member to be embedded in the second insulating film is formed evenly by the CMP method. In other words, if the fluid insulating film is not formed, the second conductive member to be embedded in the second insulating film does not remain in the concave portion on the surface of the second insulating film, whereby a short circuit between two adjacent conductive members of the second insulating film, which otherwise occurs due to the residue, can be prevented. Consequently, the yield and reliability of the semiconductor integrated circuit can be improved.

When a concave portion exists on the surface of the second insulating film, it becomes necessary to excessively polish a portion of the second insulating film for the formation of the second conductive member. In the present invention, since such a concave portion is not formed on the surface of the second insulating film, excessive polishing is not required. As a result, a short circuit can be avoided by preventing dishing of the second conductive member embedded in the second insulating film and evenly forming the conductive member to be overlaid for reasons similar to the above described ones.

Incidentally, it is possible to form the first or second insulating film as an interconnection-forming insulating film which has an interconnection formed in its concave portion or an interconnection interlayer insulating film which insulates between interconnection films; to form the concave portion as an interconnection groove formed in the interconnection-forming insulating film or a connecting groove formed in the interconnection interlayer insulating film; and to form a conductive member as an interconnection formed in the interconnection groove or a plug formed in the connecting hole.

In addition, it is possible to form the fluid insulating film to be included only in the interconnection interlayer insulating film positioned on the interconnection formed in the interconnection groove of the interconnection-forming insulating film; to be contained only in the interconnection-forming insulating film positioned on the plug formed in the connecting hole of the interconnection interlayer insulating film; or to be contained in both the interconnection interlayer insulating film positioned on the interconnection formed in the interconnection groove of the interconnection-forming insulating film and the interconnection-forming insulating film positioned on the plug formed in the connecting hole of the interconnection interlayer insulating film.

The concave portion may be made of an interconnection groove formed in the vicinity of the surfaces of the first and second insulating films and a connecting hole formed below the interconnection groove, and in the conductive member, an interconnection portion formed in the interconnection groove may be integrally formed with a connecting portion formed in the connecting hole. In other words, the present invention can also be applied to an interconnection (interconnection by the so-called dual damascene method) wherein a connecting hole portion and an interconnection groove portion have been integrally formed.

The second insulating film, interconnection interlayer insulating film and interconnection-forming insulating film each containing a fluid insulating film may have a three-layer structure of a non-fluid insulating film having no self fluidity, a fluid insulating film and a non-fluid insulating film.

As the fluid insulating film, an SOG film can be used. Examples of the SOG film include organic SOG films, inorganic SOG films and polysilazane SOG films. Among them, inorganic SOG films are particularly preferred. If an organic SOG film is used as the fluid insulating film, the shrinkage or heightening of water absorption of the organic SOG film occurs upon processing of the second insulating film, interconnection interlayer insulating film or interconnection-forming insulating film which contains the organic SOG film by photolithography and by removing the photoresist film, that is, a mask for photolithography by oxygen ashing, which adversely affects the reliability of the semiconductor integrated circuit device. The use of the inorganic SOG film as a fluid insulating film, however, does not cause such an inconvenience.

As the fluid insulating film, it is possible to use a silicon oxide film prepared by forming a silanol in a gaseous phase and then reacting the resulting silanol on a low-temperature substrate.

The SOG film is formed by application in an air In atmosphere. A silicon oxide film formed by silanol formation in a gaseous phase and the reaction of the silanol on the low-temperature substrate, more specifically, formed by allowing silanol ($H_n Si(OH)_{4-n}$), which has been prepared by the combination of a silane gas ($SiH_4$) and hydrogen peroxide ($H_2O_2$) under reduced pressure, to absorb to the surface of a substrate to form a film, can also be given as an example of the fluid insulating film. Here, a silane gas is exemplified as a raw material gas for the formation of a silanol, but methylsilane (dimethylsilane, trimethylsilane or the like) or ethylsilane (diethylsilane, triethylsilane or the like) having, as a substituent for a hydrogen group (—H), an alkyl group such as methyl (—$CH_3$) or ethyl (—$C_2H_5$) may be used.

The width W of each of the concave portion, interconnection groove and connecting hole may fall within a range of from its minimum width Wmix to the maximum width Wmx and satisfy the condition of Wmax≦4×Wmin.

(2) In another aspect of the present invention, there is also provided a semiconductor integrated circuit device which comprises a semiconductor device formed on a principal surface of a semiconductor substrate; a first insulating film which is formed over the semiconductor device and has a first conductive member, which has been formed by the CMP method, embedded in each of first concave portions formed in the first insulating film; and a second insulating film which is formed over the first insulating film and has a second conductive member, which has been formed by the CMP method, embedded in each of second concave portions formed in the second insulating film, the second insulating film including an insulating film planarized by the CMP method.

According to such a semiconductor integrated circuit device, the second insulating film is able to have a planarized surface owing to the insulating film planarized by the CMP method as described above in (1) and the second conductive member to be embedded in the second insulating film is therefore formed securely, whereby occurrence of a short circuit can be prevented By preventing excessive polishing of the second conductive member embedded in the second insulating film, thereby overlaying another conductive member securely, occurrence of a short circuit can be prevented, which, similar to (1), makes it possible to improve the yield and reliability of the semiconductor integrated circuit device.

The semiconductor integrated circuit devices as described above in (1) and (2) each may have, over the interconnection formed in its concave portion or interconnection groove, a diffusion preventive film for preventing the diffusion of metal elements which constitute the interconnection, for example, a silicon nitride film formed by the plasma CVD method. The existence of such a diffusion preventive film makes it possible to secure the withstand voltage of the interconnection interlayer insulating film, thereby improving the reliability of the semiconductor integrated circuit device.

(3) In a further aspect of the present invention, there is also provided a process for the fabrication of a semiconductor integrated circuit device which comprises a semiconductor device formed on the principal surface of a semiconductor substrate, a first insulating film which has been formed over the semiconductor device and has a first conductive member embedded in one portion of the first insulating film and a second insulating film which has been formed over the first insulating film and has a second conductive member embedded in one portion of the second insulating film. It comprises (a) depositing the first insulating film over the semiconductor substrate having at least the semiconductor device formed thereon and forming first concave portions in the first insulating film; (b) forming, on the surface of the first insulating film including the inside surface of the first concave portions, a first conductive film to be embedded in the first concave portions, (c) polishing the first conductive film by the CMP method to leave only a portion of the first conductive film inside of each of the first concave portions of the first insulating film, thereby forming the first conductive member, (d) depositing over the first conductive member a fluid insulating film having self fluidity and (e) forming second concave portions in the second insulating film including the fluid insulating film, forming a second conductive film to be embedded in each of the second concave portions and then polishing the second conductive film by the CMP method, thereby forming the second conductive member.

According to the above process, the semiconductor integrated circuit device as described above in (1) can be fabricated.

Incidentally, when the fluid insulating film is an SOG film, the SOG film is applied onto the semiconductor substrate, followed by thermal treatment.

When the fluid insulating film is a silicon oxide film formed by the formation of a silanol in a gaseous phase and reaction of the resulting silanol on a low-temperature substrate, it can be formed by retaining the semiconductor substrate at a low temperature not higher than 100° C. in a reaction chamber under reduced pressure, introducing $SiH_xM_{4-x}$ (wherein M represents a $C_{1-3}$ alkyl group, $1 \leq x \leq 4$) and $H_2O_2$ into the reaction chamber to prepare a silanol and then heat treating the semiconductor substrate having the silanol deposited thereon. In this case, the larger the number of carbon atoms of the alkyl group (—M), the lower the vapor pressure becomes. The wall surface temperature of the reaction chamber can hence be heightened and the temperature of the semiconductor substrate can be reduced to the minimum, which makes it possible to accelerate the adsorption of an alkylsilane ($SiH_xM_{4-x}$) on the semiconductor substrate maintained at low temperature, thereby increasing the possibility of the silanol formation reaction occurring in the vicinity of the surface of the semiconductor substrate. As a result, the yield of the raw material gas can be increased. Incidentally, the raw material gas is preferably supplied in a gaseous phase so that alkyl groups having not more than 3 carbon atoms are preferred.

The width W of each of the first concave portions which will have the first conductive member formed therein can be formed so that the maximum width Wmax is within a range of four times as much as the minimum width Wmin (Wmin ≦W≦4×Wmin).

In the conductive film embedded in each of the first concave portions of the first insulating film in the above step (b), its height H1 in the concave portion of the minimum width Wmin may be almost equal to the height H2 in the concave portion of the maximum width Wmax (H1≅H2) and the heights H1 and H2 can be made higher than the height L1 of the surface of the first insulating film (H1≅H2>L2).

According to such a process for the fabrication of a semiconductor integrated circuit device, the first conductive member formed in the step (b) is embedded in all of the first concave portions of the first insulating film and the surface of the first conductive member itself is polished and planarized. In this point, the present invention differs from the technique described in Japanese Patent Application Laid-Open No. HEI 7-297183. In the known technique, the surface height of a conductive film is lower than that of an interconnection groove in a wider interconnection groove so that when the conductive film is covered with a film such as SOG, followed by polishing to form an interconnection in the interconnection groove, the SOG film remains in the concave portion on the interconnection surface. In the present invention, on the other hand, a fluid insulating film such as SOG is deposited subsequent to the polishing for the formation of a first conductive member and the invention process therefore differs from the above technique in the order of steps. in addition, as described above, a height H1 of the concave portion of the minimum width Wmin is substantially similar to a height H2 of the concave portion of the maximum width Wmax (H1≅H2) and, at the same time, the heights H1 and H2 are both higher than a height L1 of the first insulating film (H1=H2>L1) so that the invention process differs from the above technique in the formation step itself for forming the first conductive member (corresponding to the interconnection in the above technique). The semiconductor integrated circuit devices fabricated by these two different processes are inevitably different and in the semiconductor integrated circuit device fabricated according to the present invention, a fluid insulating film such as SOG does not remain even if a concave portion (dishing) is formed on the first conductive member by the CMP method.

In the first conductive member polished in the above step (c), the dishing amount K1 on the surface of the first conductive member in the concave portion of the minimum width Wmin and the dishing amount K2 on the surface of the first conductive member in the concave portion of the maximum width Wmax are substantially the same (K1≅K2). Such a fabrication process of a semiconductor integrated circuit device is available based on the above-described condition of H1≅H2.

It is also possible to form a second insulating film by depositing a CVD silicon oxide film by the plasma CVD method or thermal CVD method prior to the deposition of the fluid insulating film, depositing the fluid insulating film and then depositing thereover a CVD oxide film.

After the formation of the first conductive member, a diffusion preventive film, for example, a silicon nitride film, which covers the surface of the first conductive member can be deposited thereon.

By such a fabrication process, it is possible to prevent the diffusion of a metal element such as copper which constitutes the first conductive member, thereby improving the reliability of the semiconductor integrated circuit.

(4) In a still further aspect of the present invention, there is also provided a process for the fabrication of a semiconductor integrated circuit device which has a semiconductor device formed on the principal surface of a semiconductor substrate, a first insulating film which has been formed over the semiconductor device and has a first conductive member partially embedded therein and a second insulating film which has been formed over the first insulating film and has a second conductive member partially embedded therein; which comprises (a) depositing the first insulating film on the semiconductor substrate having at least the semiconductor device formed thereon and forming first concave portions in one portion of the first insulating film; (b) forming over the surface of the first insulating film including the inside surface of each of the first concave portions a first conductive film to be embedded in each of the first concave portions; (c) polishing the first conductive film by the CMP method to leave a portion of the first conductive film inside of each of the first concave portions of the first insulating film, thereby forming the first conductive member; (d) depositing a silicon oxide film over the first conductive member and polishing the silicon oxide film by the CMP method for planarization; and (e) forming second concave portions in the second insulating film including the silicon oxide film, forming a conductive film to be embedded in each of the second concave portions and polishing the conductive film by the CMP method, thereby forming a second conductive member.

According to the above-described fabrication process, a semiconductor integrated circuit device as described above in (2) can be fabricated. Incidentally, the silicon oxide film included in the second insulating film is planarized by the CMP method so that it is not required to have self fluidity and may be a silicon oxide film formed by the plasma CVD method or the CVD method using TEOS (tetramethoxysilane) or the like.

DESCRIPTION OF THE DRAWINGS

Illustrating problems investigated by the present invention

DETAILED DESCRIPTION OF THE PREFERRED EMBODIMENTS

Figure 1:
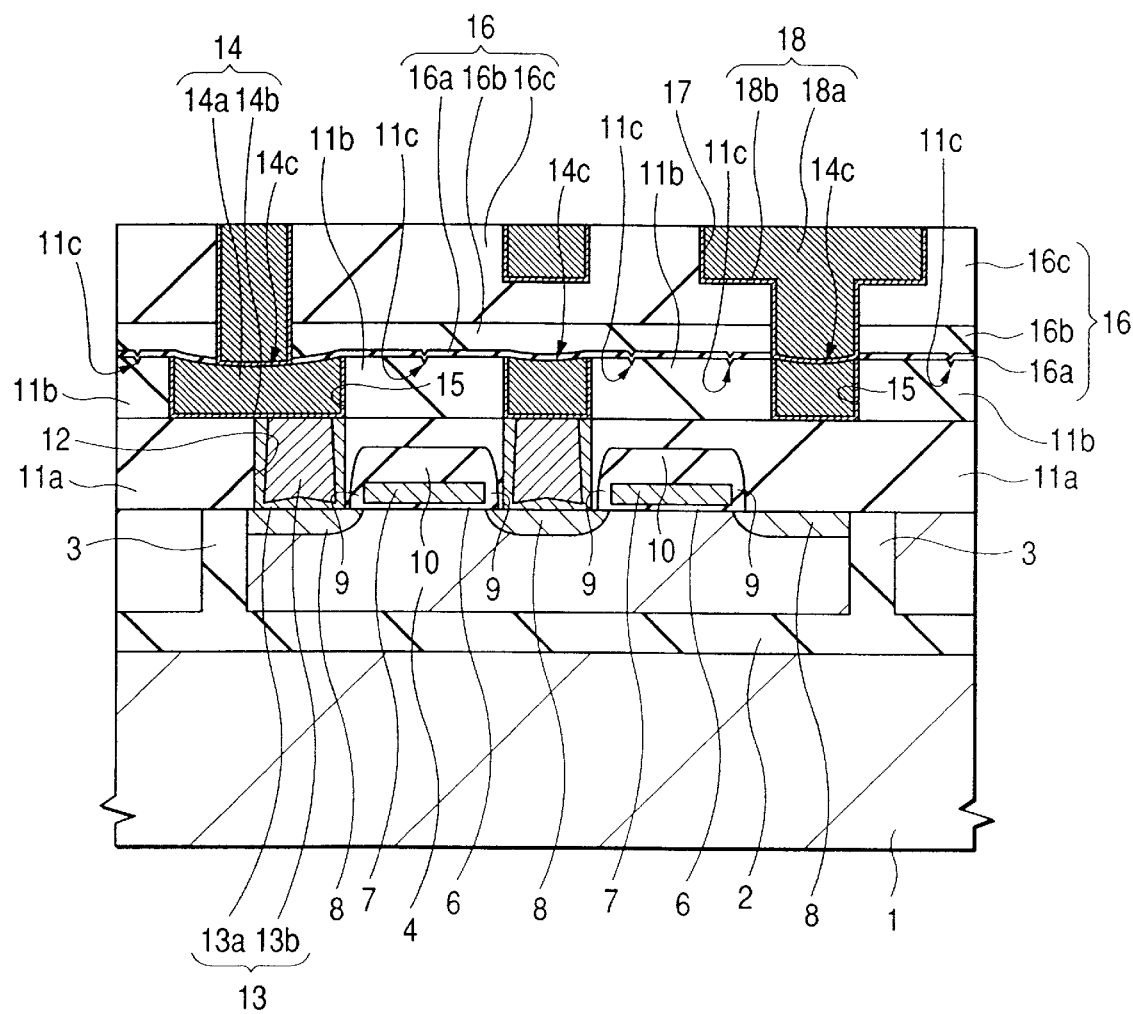
FIG. 1 is a cross-sectional view illustrating one example of the semiconductor integrated circuit device according to one embodiment of the present invention.

Embodiments of the present invention will hereinafter be described in detail with reference to the accompanying drawings. Incidentally, in all the drawings for illustrating various embodiments, like members will be identified by like reference numerals and overlapping descriptions will be omitted.

First Embodiment

FIG. 1 is a cross-sectional view illustrating one example of the semiconductor integrated circuit device according to one embodiment of the present invention.

The semiconductor integrated circuit device according to the first embodiment has an n-channel MISFET (Metal Insulator Semiconductor Field Effect Transistor) formed over a p-well 4 of a semiconductor substrate 1 having an SOI (Silicon On Insulator) insulating film 2 and an U-groove element isolation region 3. The SOI insulating film 2 and U-groove element isolation region 3 are each formed, for example, from a silicon oxide film.

The n-channel MISFETQn has a gate electrode 7 formed over the principal surface of the semiconductor substrate 1 through a gate insulating film 6 and impurity semiconductor regions 8 formed on both sides of the gate electrode 7 on the principal surface of the semiconductor substrate 1. On the side surfaces and upper surface of the gate electrode 7, side wall spacers 9 and a cap insulating film 10 are formed, respectively.

The gate insulating film 6 is made of a silicon oxide film having a thickness of several nm and can be formed, for example, by the CVD method or thermal oxidation method.

The gate electrode 7 is made of a low-resistance polycrystalline silicon film or the like. The resistance of the gate electrode 7 may be reduced by forming thereover a metal layer such as silicide or tungsten layer.

The impurity semiconductor regions 8 function as source and drain regions of the n-channel MISFETQn and each has an n-type impurity such as phosphorus (P) or arsenic (As) introduced at a high concentration.

Over the gate electrode 7 and impurity semiconductor regions 8, a silicide film, for example, a high-melting-point metal silicide film such as $Wsi_x$, $MoSi_x$, $TiSi_x$ and $TaSi_x$ may be stacked.

As each of the side wall spacers 9 and cap insulating film 10, a silicon oxide film or silicon nitride film can be used. When the silicon nitride film is used, a connecting hole, which will be described later, can be opened in an interlayer insulating film in self alignment by using the side wall spacers 9 and cap insulating film 10 as masks.

An interlayer insulating film 11a is laid over the semiconductor substrate 1 and n-channel MISFETQn. As the interlayer insulating film 11a, a reflow film such as BPSG (Boron-doped Phospho-Silicate Glass) film or PSG (Phospho-Silicate Glass) can be used. Alternatively, the interlayer insulating film 11a can be used as a laminate film having thereover or therebelow a silicon oxide film formed by the CVD or sputtering method. After deposition, the interlayer insulating film 11a is polished by the CMP method or the like so that it has a planarized surface.

In the interlayer insulating film 11a over the impurity semiconductor regions 8, a connecting hole 12 is disposed, in which a tungsten film 13a formed for example by the sputtering method and a metal plug 13b made of tungsten formed by the blanket CVD method, selective CVD method or the like have been formed. over the interlayer insulating film 1a, an interlayer insulating film 11b (first interlayer insulating film) is formed and an interconnection (wiring line) 14 is formed in an interconnection groove 15 formed in the interlayer insulating film 11b.

The interlayer insulating film 11b is made of a silicon oxide film formed for example by the CVD method or sputtering method. Incidentally, on the surface of the interlayer insulating film 11b, a scratch 11c is likely to be formed. This scratch is made by a polishing agent for CMP and, as will be described later, an object the presence of the scratch is due to over polishing to some extent to completely remove the metal film on the surface of the interlayer insulating film 11b upon polishing by the CMP method for the formation of the interconnection 14.

The interconnection 14 is made of a main conductive layer 14a and a titanium nitride film 14b. The main conductive layer 14a is for example made of copper, but may be made of aluminum or tungsten, or an alloy thereof. By forming the main conductive layer from such a material having-a low resistance, an increase in the interconnection resistance attributable to the miniaturization of the interconnection 14 can be suppressed, whereby the performance of the semiconductor integrated circuit device can be heightened. The titanium nitride film 14b can be allowed to act as a blocking film for preventing the diffusion of a material which constitutes the main conductive layer 14a, for example, copper. As well as the titanium nitride (TiN) film, tantalum (Ta) film, tantalum nitride (TaN) film, tungsten nitride (WN) film or sputter tungsten film, or a compound thereof with silicon (Si) can be used.

On the upper surface of the interconnection 14, a dishing 14c (concave) is formed. As will be described subsequently, such dishing appears owing to the difference in a CMP rate between the metal material constituting the interconnection 14 and a silicon oxide film constituting the interlayer insulating film 11b upon formation of the interconnection 14 by the CMP method. In other words, the CMP rate of the metal is larger than that of the silicon oxide film so that when over etching is carried out to some extent for forming the interconnection 14 securely, the metal is polished faster than the silicon oxide film and a relatively concave surface is formed.

Over the interconnection 14 and interlayer insulating film 11b, an interlayer insulating film 16 is formed. The interlayer insulating film 16 is made of a blocking film 16a formed in contact with the interconnection 14 and the interlayer insulating film 11b, a planarizing film 16b and an insulating film 16c.

As the blocking film 16a, a silicon nitride (SiN) film formed for example by the plasma CVD method can be used. It has a function of suppressing the diffusion of copper which constitutes the main conductive film 14a of the interconnection 14. Together with the titanium nitride film 14b, the blocking film 16a is also effective for preventing the diffusion of copper into the interlayer insulating films 11a, 11b and 16, thereby maintaining their insulation properties and heightening the reliability of the semiconductor integrated circuit device. Incidentally, when the silicon nitride film is employed, the blocking film 16a can be formed to a thickness of about 100 nm.

The planarizing film 16b is made of a film having self fluidity, for example, an SOG (Spin On Glass) film and is able to planarize the surface by removing the influences of the scratch lie and dishing 14c. The existence of the planarizing film 16b makes it possible to secure the surface flatness of the interlayer insulating film 16 and as will described later, to prevent the formation of a residue of the metal film upon formation of a second-layer interconnection which is to be embedded in the interlayer insulating film 16, thereby preventing the occurrence of a short circuit of the second-layer interconnection, whereby the yield and reliability of the semiconductor integrated circuit device can be improved.

As the insulating film 16c, a silicon oxide ($SiO_2$) film formed, for example, by the CVD method can be used. It has a function of maintaining the film thickness of the interlayer insulating film 16. It is not essential when a sufficient film thickness of the interlayer insulating film 16 can be maintained by the planarizing film 16b.

In the interlayer insulating film 16, interconnection grooves 17 are formed and an interconnection 18 is formed inside of each of the interconnection grooves 17 as a second metal interconnection. Some of the interconnection grooves include a connecting hole for connecting with the interconnection 14 formed below the groove 17. Described specifically, a connecting interconnection and interconnection are integrally formed by the so-called dual damascene method in which the interconnection groove and connecting hole are formed, a metal film is deposited on the substrate including the interconnection groove and connecting hole and a portion of the metal film outside the interconnection groove is removed for example by the CMP method.

Similar to the interconnection 14, the interconnection 18 is made of a main conductive film 18a and a titanium nitride film 18b. As the main conductive film 18b, copper can be exemplified but aluminum or tungsten, or an alloy thereof-may be employed. By using such a low resistance material for the main conductive layer, an increase in the interconnection resistance attendant on the miniaturization of the interconnection 18b can be suppressed, whereby the performance of the semiconductor integrated circuit device can be heightened. The titanium nitride film 18b can be caused to act as a blocking film for preventing the diffusion of a material constituting the main conductive film 18a, for example, copper. As well as the titanium nitride film, a tantalum film, tantalum nitride film, tungsten nitride film or sputter tungsten film or a compound thereof with silicon can be used.

Incidentally, the interconnection 18 is formed, as will be described later, by removing the metal film formed over the interlayer insulating film 16 by the CMP method. The flatness of the surface of the interlayer insulating film 16 is maintained as described above so that there exists no concave portion on the surface but the interconnection groove 17 and no metal film remains except the interconnection 18, which makes it possible to prevent the occurrence of a short circuit of the interconnection 18 attributable to metal residue, thereby improving the yield and reliability of the semiconductor integrated circuit device. Furthermore, since the surface of the interlayer insulating film 16 is so flat that over polishing is not necessary in the CMP for the formation of the interconnection 18. Consequently, a short circuit of the upper interconnection in the case where a further interconnection (third metal interconnection and the like) is formed by suppressing the dishing of the interconnection 18 can be prevented, whereby the yield and reliability of the semiconductor integrated circuit device can be improved.

It is also possible to form over the interconnection 18 an interlayer insulating film and interconnection similar to the interlayer insulating film 16 and the interconnection 18. In this case, similar to the case of the interconnection 18, it is possible to carry out the processing of an upper interconnection securely by disposing a planarizing film similar to the planarizing film 16b.

A process for the fabrication of the above-described semiconductor integrated circuit device will next be described with reference to the accompanying drawings. FIGS. 2 to 15 are cross-sectional views illustrating one example of the fabrication process of the semiconductor integrated circuit device according to one embodiment of the present invention.

First, a semiconductor substrate 1 made of p⁻ type single crystal silicon, the substrate having an SOI insulating film 2 formed by a high-concentration oxygen injection method or the like, is prepared and an impurity, such as boron, for attaining p-conductivity type is doped by ion implantation or the like, whereby a p well 4 is formed. Alternatively, the p-well may be formed by mixing an impurity gas and thereby doping at the time of epitaxial growth by the high-concentration oxygen injection method.

Figure 2:
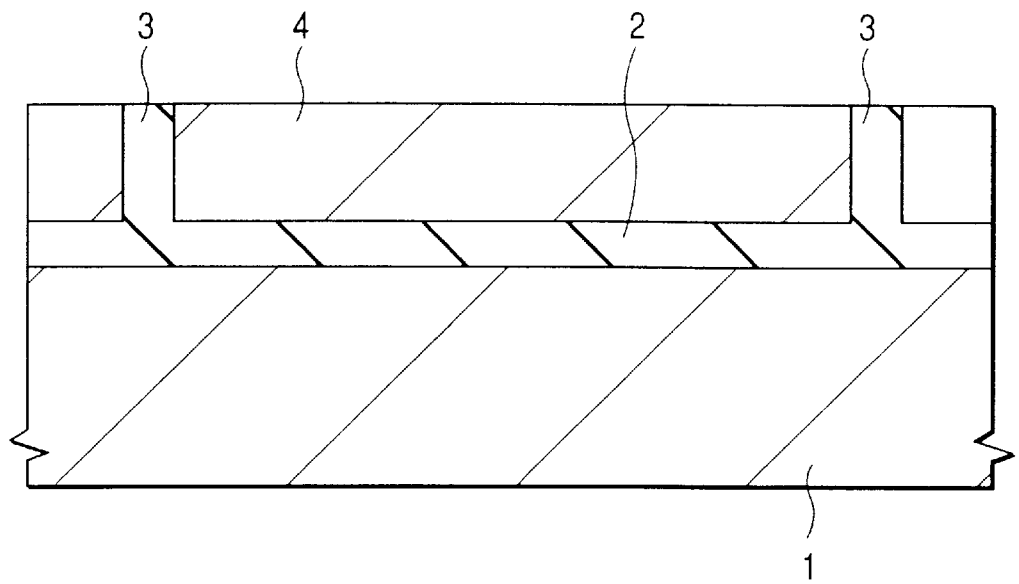
FIG. 2 is a cross-sectional view illustrating a step of the fabrication process of the semiconductor integrated circuit device of the first embodiment in the order of steps.

Next, on the principal surface of the semiconductor substrate 1, a U groove reaching the SOI insulating film 2 is formed, followed by deposition of a silicon oxide film or the like. The U-groove is filled with the silicon oxide film, while the unnecessary portion of the silicon oxide film is removed by the CMP method or the like, whereby a U-groove element isolation region 3 is formed (FIG. 2).

Figure 3:
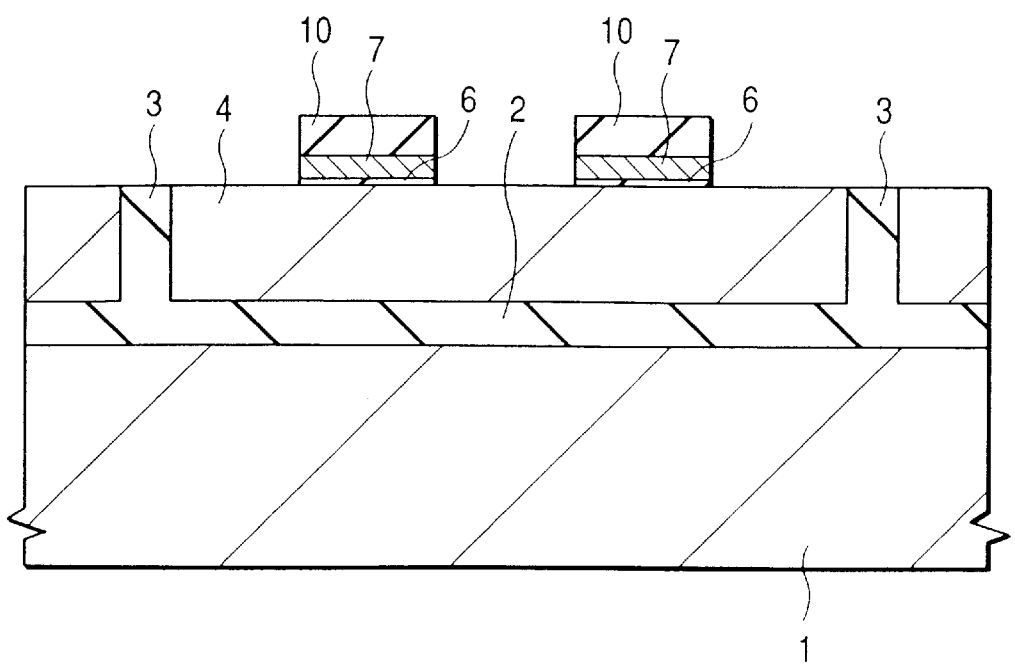
FIG. 3 is a cross-sectional view illustrating a step of the fabrication process of the semiconductor integrated circuit device of the first embodiment in the order of steps.

Then, over the principal surface of the semiconductor substrate 1, a silicon oxide film which will be a gate in insulating film 6, a polycrystalline silicon film which will be a gate electrode 7 and a silicon oxide film which will be a cap insulating film 10 are successively deposited to form a laminate film. The laminate film is etched with a resist, which has been patterned by photolithography, as a mask, whereby the gate insulating film 6, gate electrode 7 and cap insulating film 20 are formed (FIG. 3). The gate insulating film 6 can be deposited for example by the thermal CVD method and the gate electrode 7 can be formed by the CVD method. In order to reduce its resistance, an n-type impurity (ex. P) may be doped. Incidentally, over the gate electrode 7, a high-melting point metal silicide film such as $Wsi_x$, $MoSi_x$, $TiSi_x$, or $TaSi_x$ may be stacked. The cap insulating film 10 can be deposited for example by the CVD method.

Figure 4:
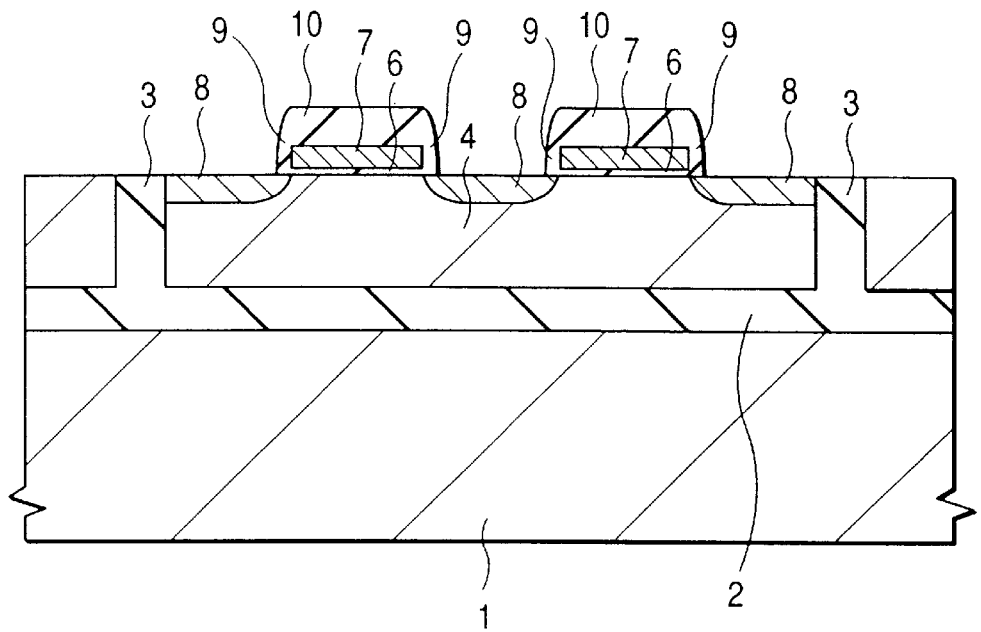
FIG. 4 is a cross-sectional view illustrating a step of the fabrication process of the semiconductor integrated circuit device of the first embodiment in the order of steps.

After deposition of a silicon oxide film over the semiconductor substrate 1 by the CVD method, the silicon oxide film is subjected to anisotropic etching by the reactive ion etching (RIE) method, whereby side wall spacers 9 are formed on the side walls of the gate electrode 7. Then, n-type impurity (phosphorus) is ion-implanted, whereby impurity semiconductor regions 8 having source and drain regions of n-channel MISPETQn in the p wells on both sides of the gate electrode 7 are formed (FIG. 4). Incidentally, prior to the formation of the side wall spacers 9, a low-concentration impurity semiconductor region may be formed, followed by the formation of a high-concentration impurity semiconductor region.

Figure 5:
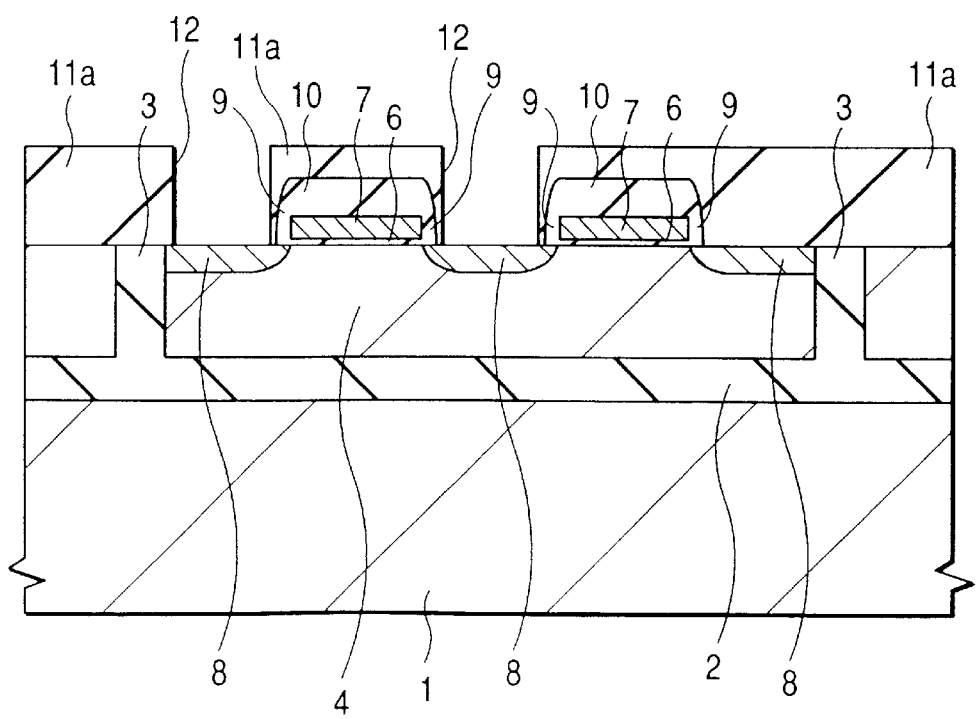
FIG. 5 is a cross-sectional view illustrating a step of the fabrication process of the semiconductor integrated circuit device of the first embodiment in the order of steps.

After a silicon oxide film is deposited over the semiconductor substrate 1 by the sputtering or CVD method, the silicon oxide film is polished for example by the CMP method, whereby an interlayer insulating film 11a having a planarized surface is formed. Over the impurity semiconductor regions 8 in the interlayer insulating film 11a on the principal surface of the semiconductor substrate 1, connecting holes 12 are opened using a photolithography technique (FIG. 5).

Figure 6:
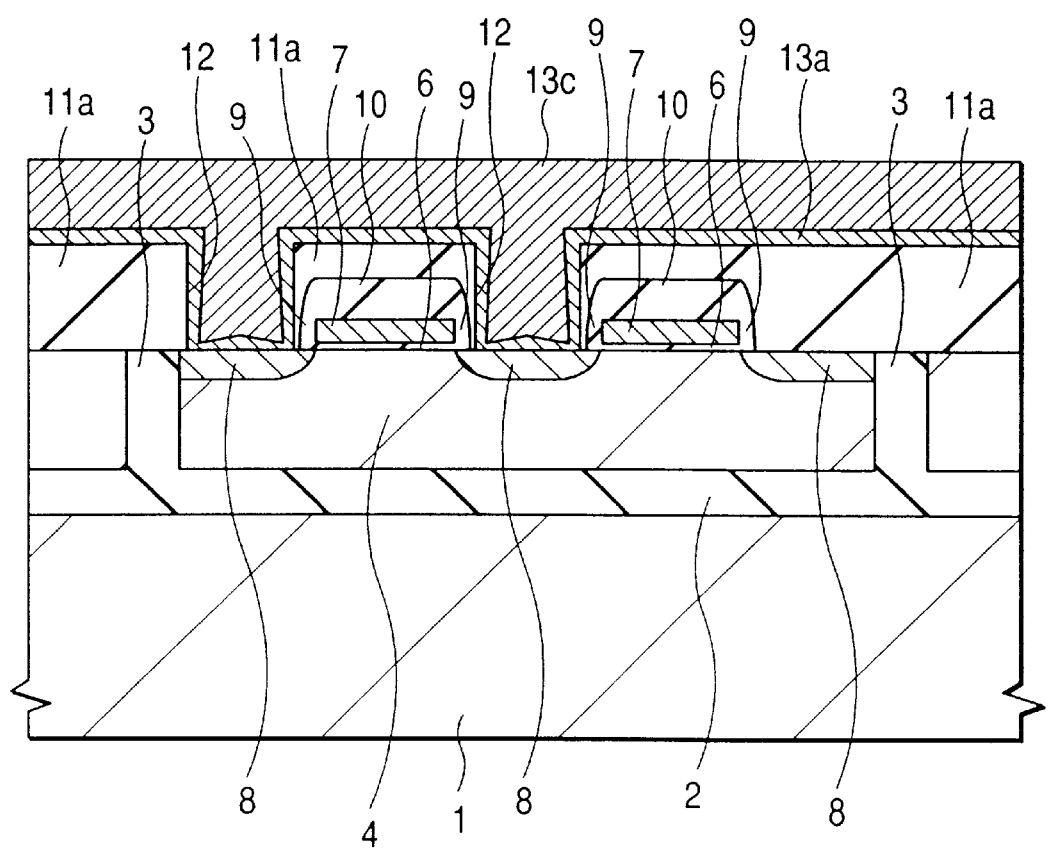
FIG. 6 is a cross-sectional view illustrating a step of the fabrication process of the semiconductor integrated circuit device of the first embodiment in the order of steps.

A tungsten film 13a is deposited by the sputtering method, followed by deposition of a tungsten film 13c by the blanket CVD method (FIG. 6).

Figure 7:
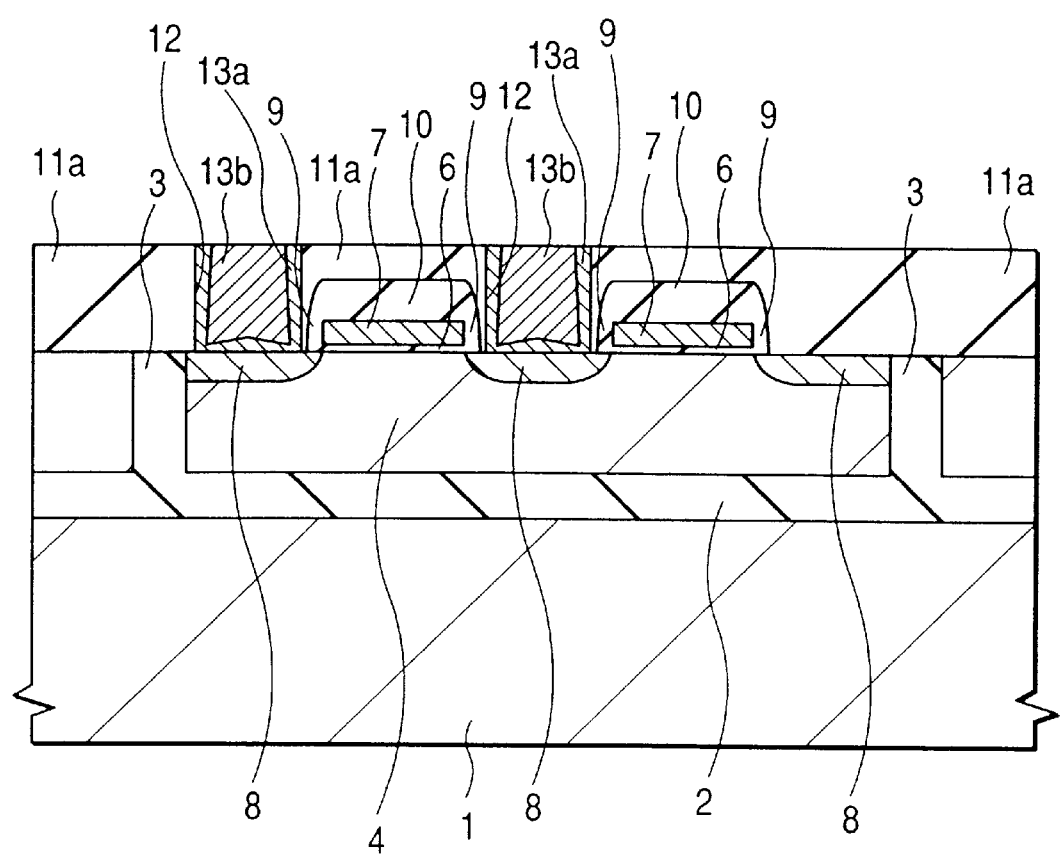
FIG. 7 is a cross-sectional view illustrating a step of the fabrication process of the semiconductor integrated circuit device of the first embodiment in the order of steps.

The portions of the tungsten film 13c and tungsten film 13a over the interlayer insulating film 11a except the connecting hole 12 are removed by the etch back method, whereby a metal plug 13b is formed (FIG. 7).

Figure 8:
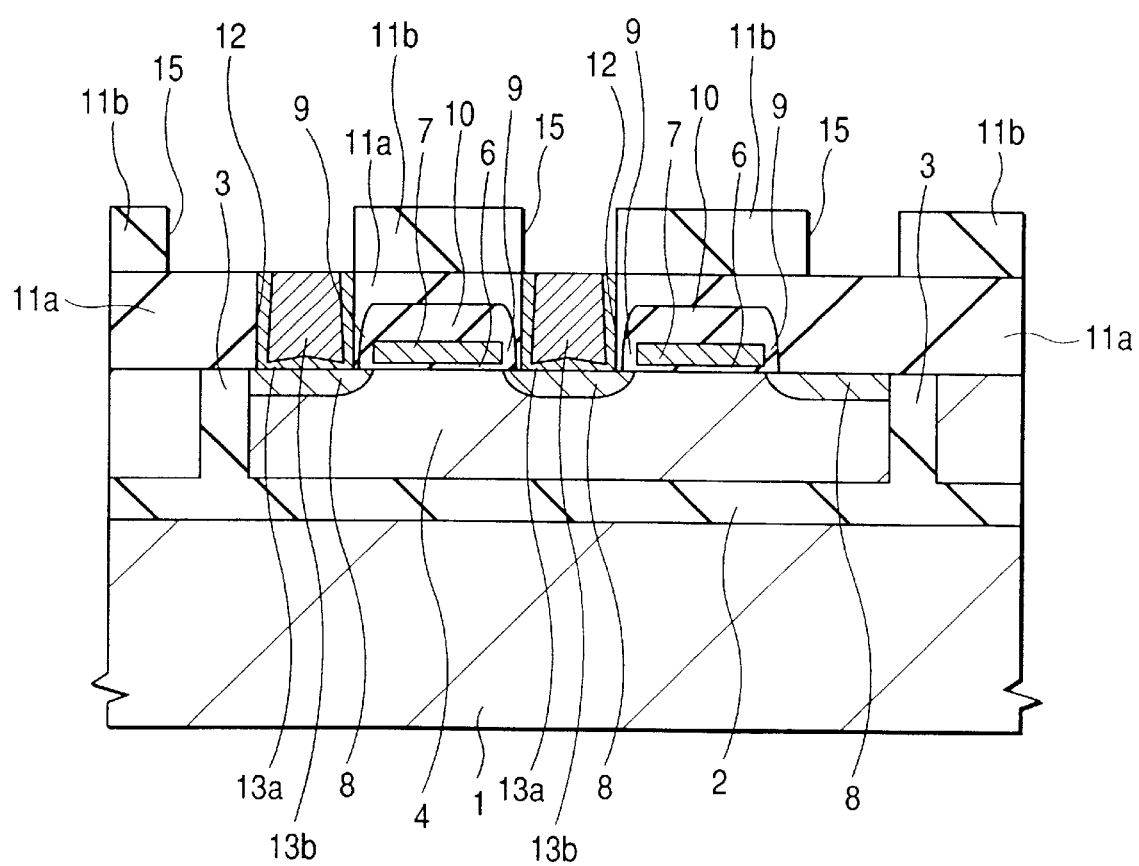
FIG. 8 is a cross-sectional view illustrating a step of the fabrication process of the semiconductor integrated circuit device of the first embodiment in the order of steps.

A silicon oxide film is then deposited by the sputtering or CVD method, whereby an interlayer insulating film 11b is formed. The interlayer insulating film 11b is processed by photolithography or etching technique, whereby an interconnection groove 15 is formed (FIG. 8). Here, a silicon oxide film formed by the sputtering or CVD method is exemplified as the interlayer insulating film 11, but any one of a coated film such as SOG, organic film, fluorine-added CVD silicon oxide film, silicon nitride film and multi-layer film having thereon plural kinds of insulating films stacked one after another can be exemplified. The interconnection groove 15 is formed in a region where an interconnection 14 is desired to be formed subsequently by embedding an interconnection material. In this embodiment 1, the interconnection groove 15 is formed subsequent to the formation of the metal plug 13, but it is also possible to form the interconnection groove 15 after opening of the connecting hole 12 and then forming the metal plug 13.

Figure 9:
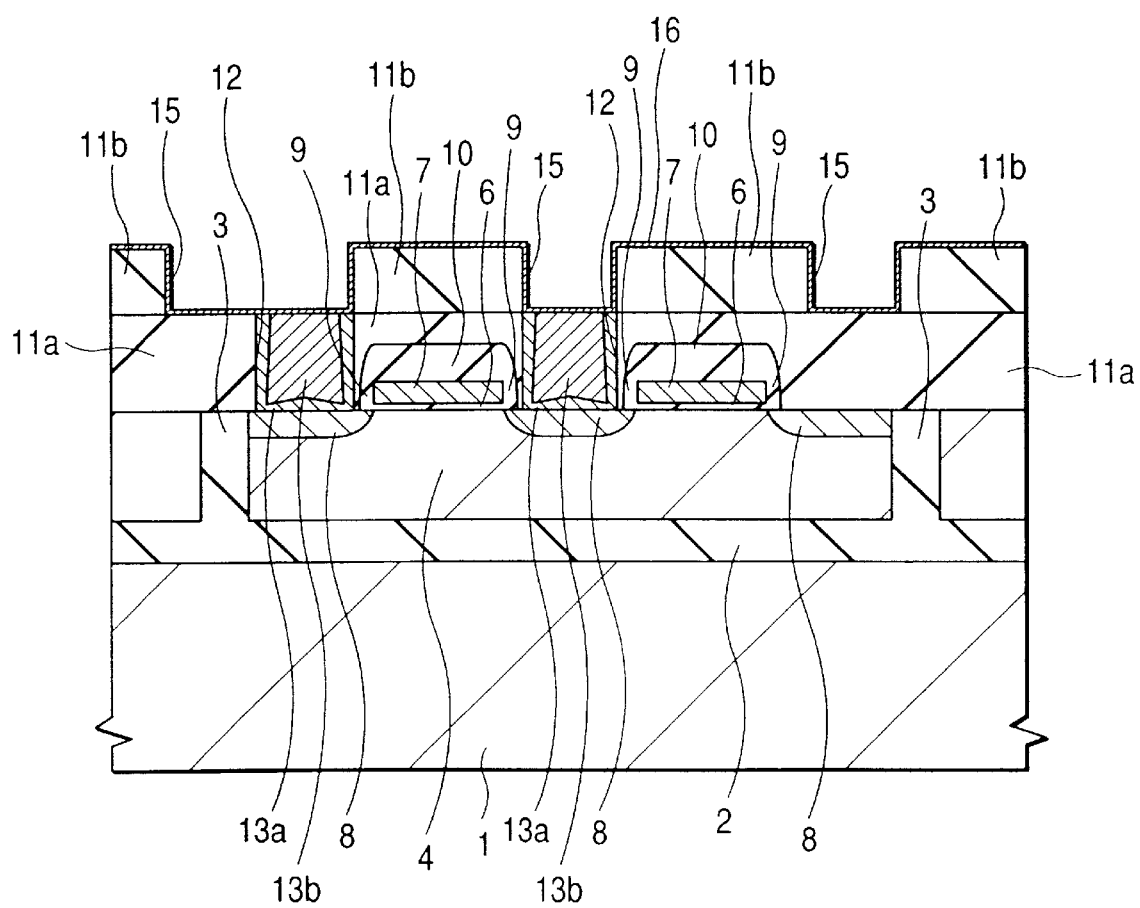
FIG. 9 is a cross-sectional view illustrating a step of the fabrication process of the semiconductor integrated circuit device of the first embodiment in the order of steps.

All over the surface of the semiconductor substrate 1, a titanium nitride film 14b which will be a titanium nitride film 14b of the interconnection 14 is deposited (FIG. 9). The titanium nitride film 14b can be deposited, for example, by the CVD or sputtering method. It is deposited in order to improve the adhesion of a copper film, which will be described later, and to prevent the diffusion of copper. In this embodiment 1, a titanium nitride film is given as an example, but a metal film of tantalum or tantalum nitride film can be used. Just before carrying out the next step, that is, deposition of a main conductive layer 14a, the surface of the titanium nitride film 14 can be subjected to sputter etching. Such sputter etching makes it possible to remove water, oxygen molecule or the like adsorbed on the surface of the titanium nitride film 14b, thereby improving the adhesion of the main conductive film 14a. Its effect is large particularly when the main conductive film 14a is deposited over the surface of the titanium nitride film 14b which has been exposed to the air by vacuum break.

Figure 10:
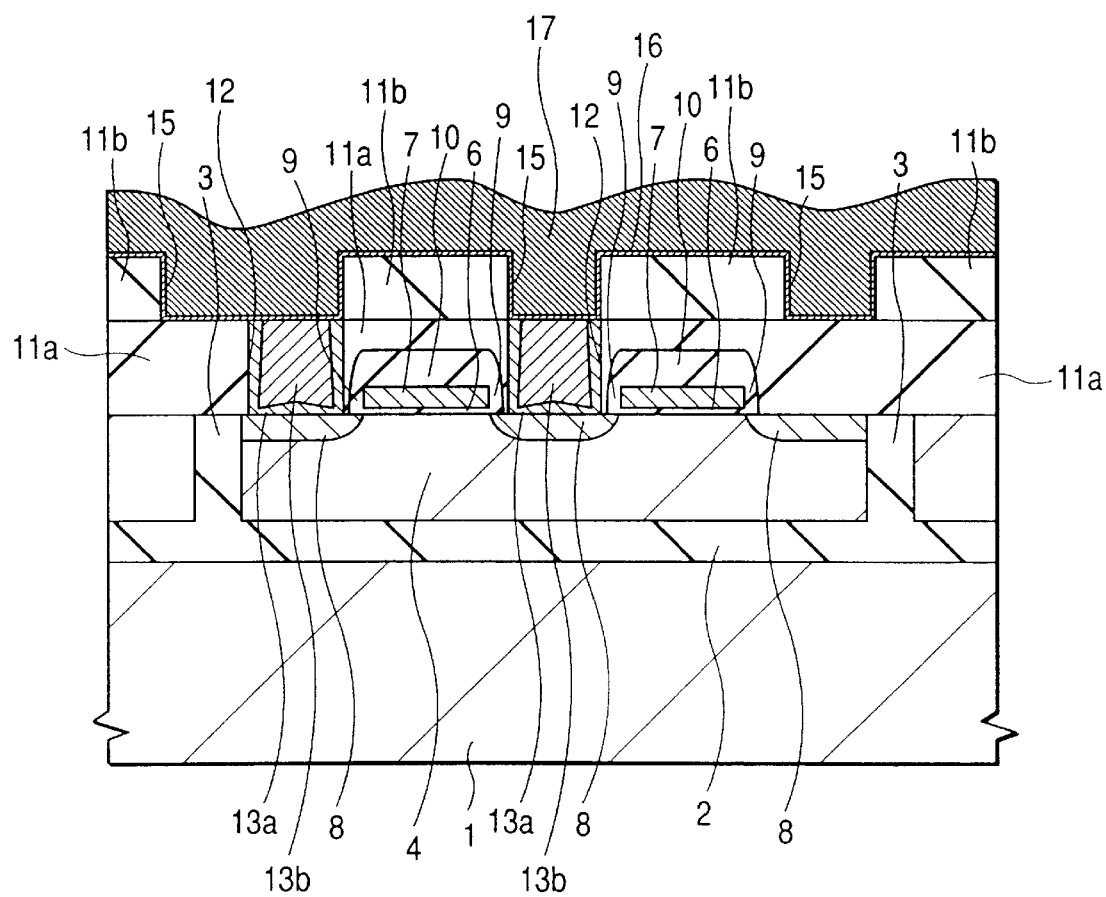
FIG. 10 is a cross-sectional view illustrating a step of the fabrication process of the semiconductor integrated circuit device of the first embodiment in the order of steps.

Over the titanium nitride film 14b, a metal film which will be a main conductive film 14a, for example, a thin copper film is deposited, followed by thermal treatment for fluidization, whereby a metal film 17 embedded favorably in the interconnection groove 15 is formed (FIG. 10). For the deposition of the copper film, the conventional sputtering method can be used, but it can be replaced by the physical vapor deposition method. The thermal treatment is conducted under the conditions of temperature and time sufficient for fluidizing copper which constitutes the metal film 17, for example, 350 to 400° C. for 3 to 5 minutes.

Figure 11:
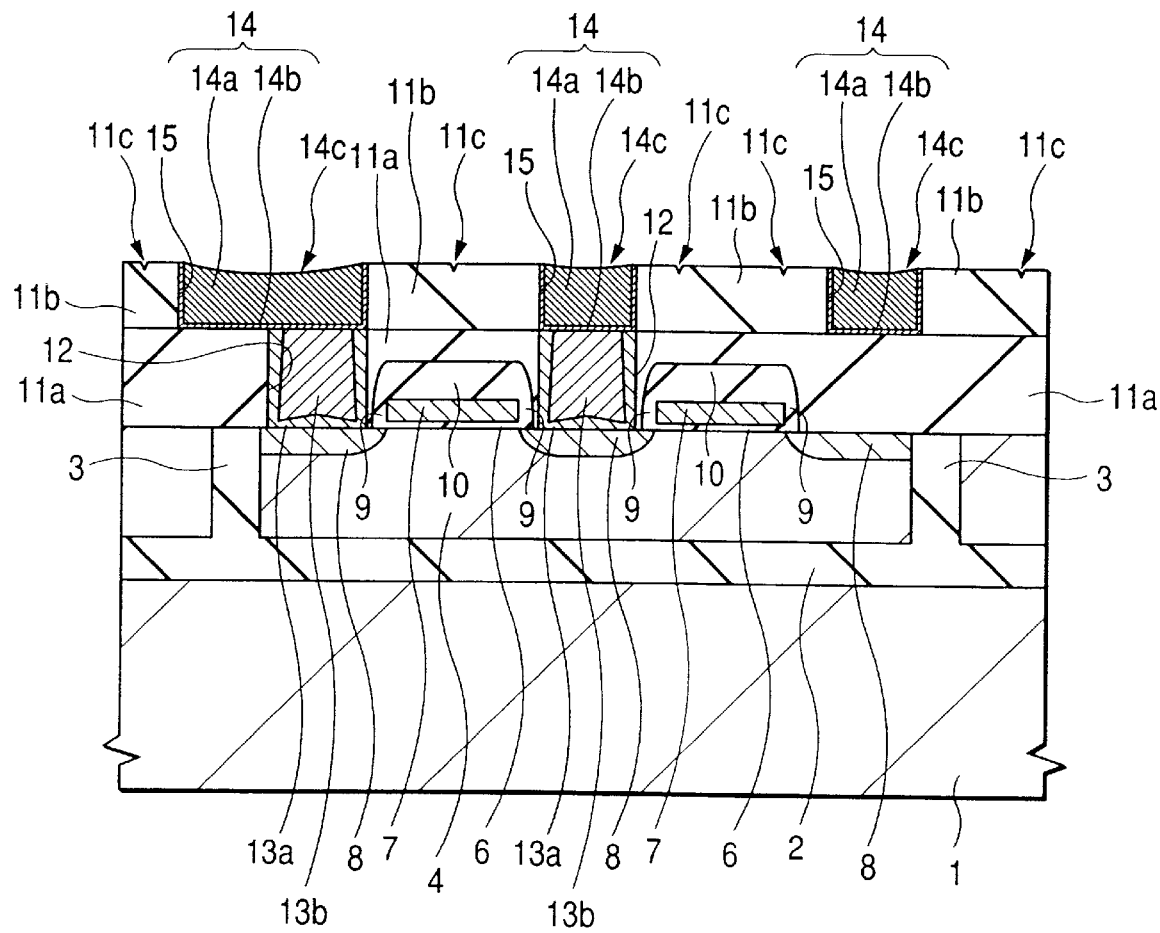
FIG. 11 is a cross-sectional view illustrating a step of the fabrication process of the semiconductor integrated circuit device of the first embodiment in the order of steps.

The unnecessary portions of the titanium nitride film 14b and metal film 17 on the interlayer insulating film 11b are then removed, whereby a main conductive film 14a and titanium nitride film 14b which are the components of the interconnection 14 are formed (FIG. 11). Removal of the titanium nitride film 14b and the metal film 19 is carried out by polishing through the CMP method. Since the CMP method is employed for the formation of the interconnection 14, a dishing 14c, that is, a concave state compared with the surface of the interlayer insulating film 11b, is formed on the surface of the interconnection 14, while a scratch 11c is formed on the surface of the interlayer insulating film 11b by a polishing agent used in the CMP method.

Figure 12:
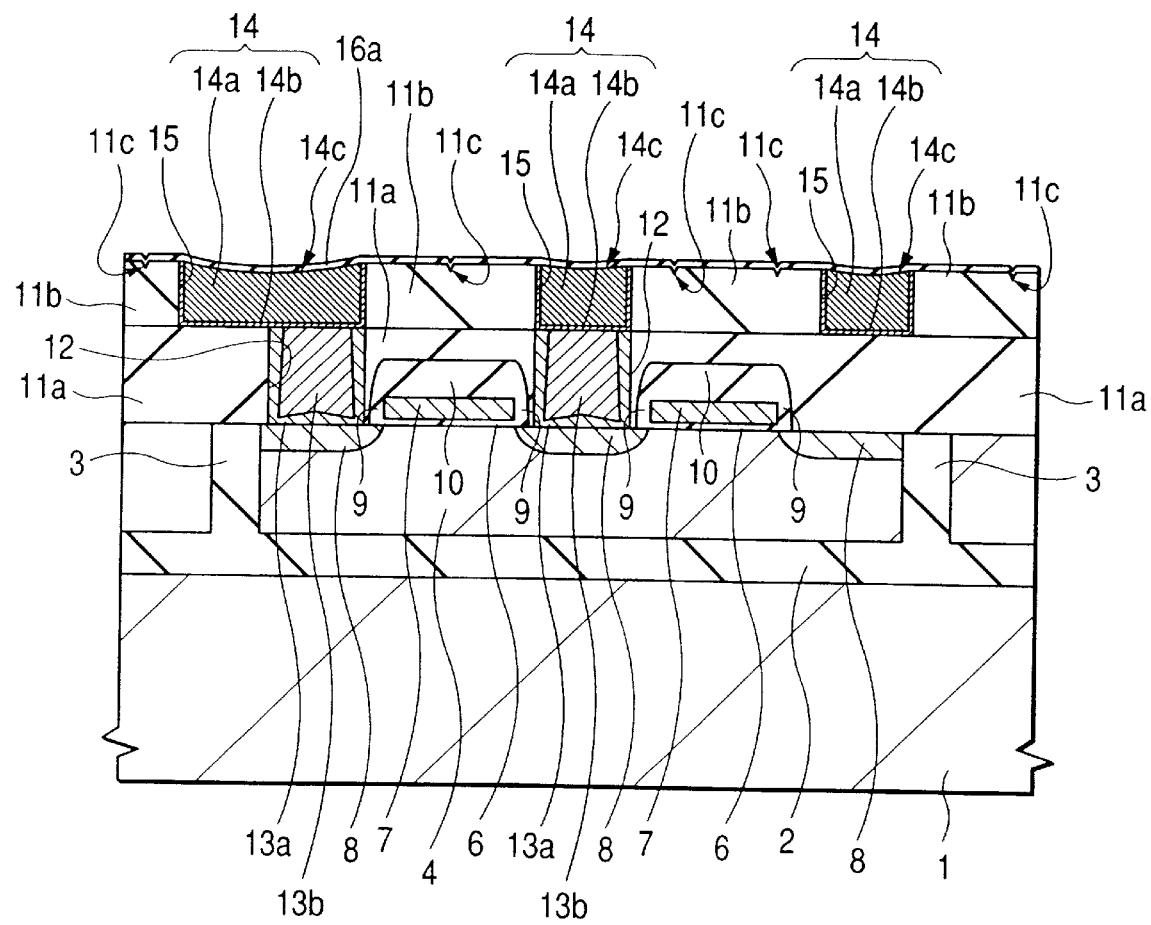
FIG. 12 is a cross-sectional view illustrating a step of the fabrication process of the semiconductor integrated circuit device of the first embodiment in the order of steps.

A silicon nitride film is deposited over the interconnection 14 and interlayer insulating film 11b to form a blocking film 16a (FIG. 12). For the deposition of the silicon nitride film, a plasma CVD method can be used by way of example. It is formed to a film thickness of about 100 nm.

Figure 13:
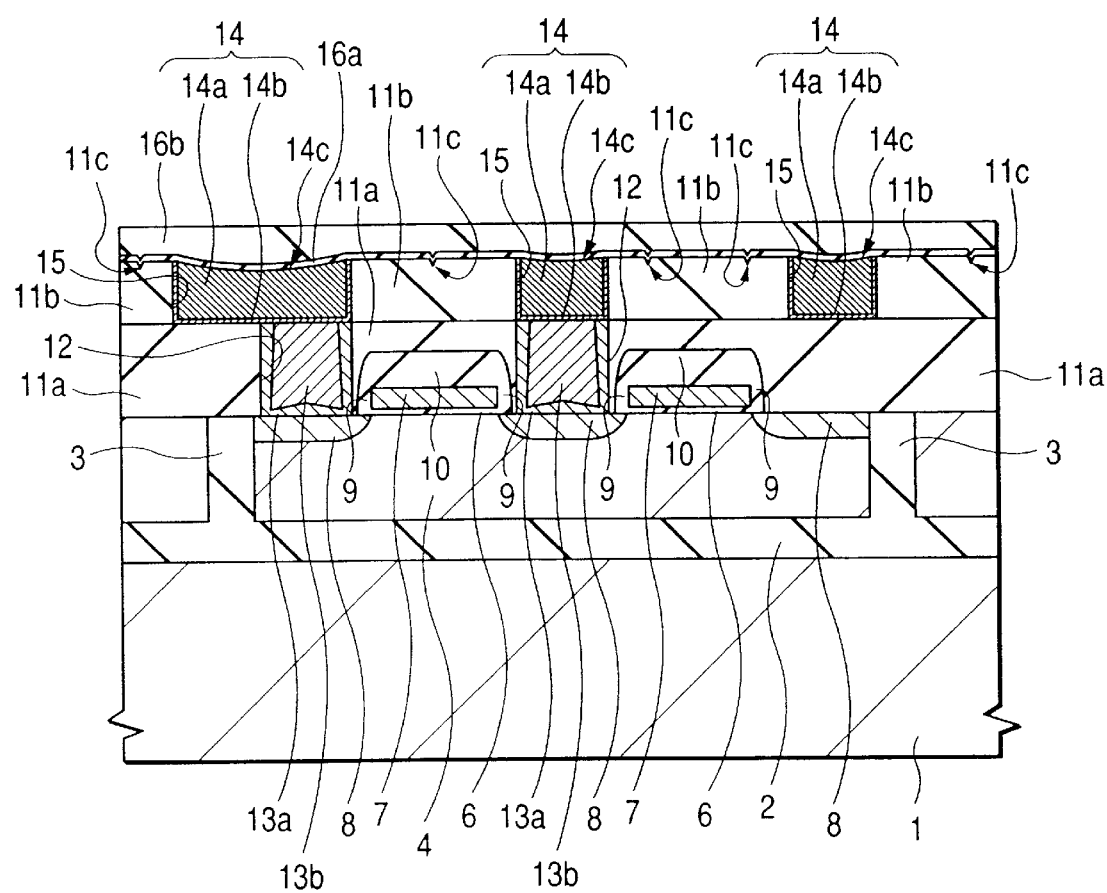
FIG. 13 is a cross-sectional view illustrating a step of the fabrication process of the semiconductor integrated circuit device of the first embodiment in the order of steps.

An SOG film having self fluidity is applied to the blocking film 16a, followed by thermal treatment at 400° C. or the like for curing the film, whereby a planarizing film 16b which has a planarized surface is formed (FIG. 13). As the SOG film, an organic or inorganic SOG film can be used. Alternatively, a polysilazane SOG film can be used. The polysilazane SOG film has heat resistance so that the reliability of the semiconductor integrated circuit device can be improved by the use of it.

Figure 14:
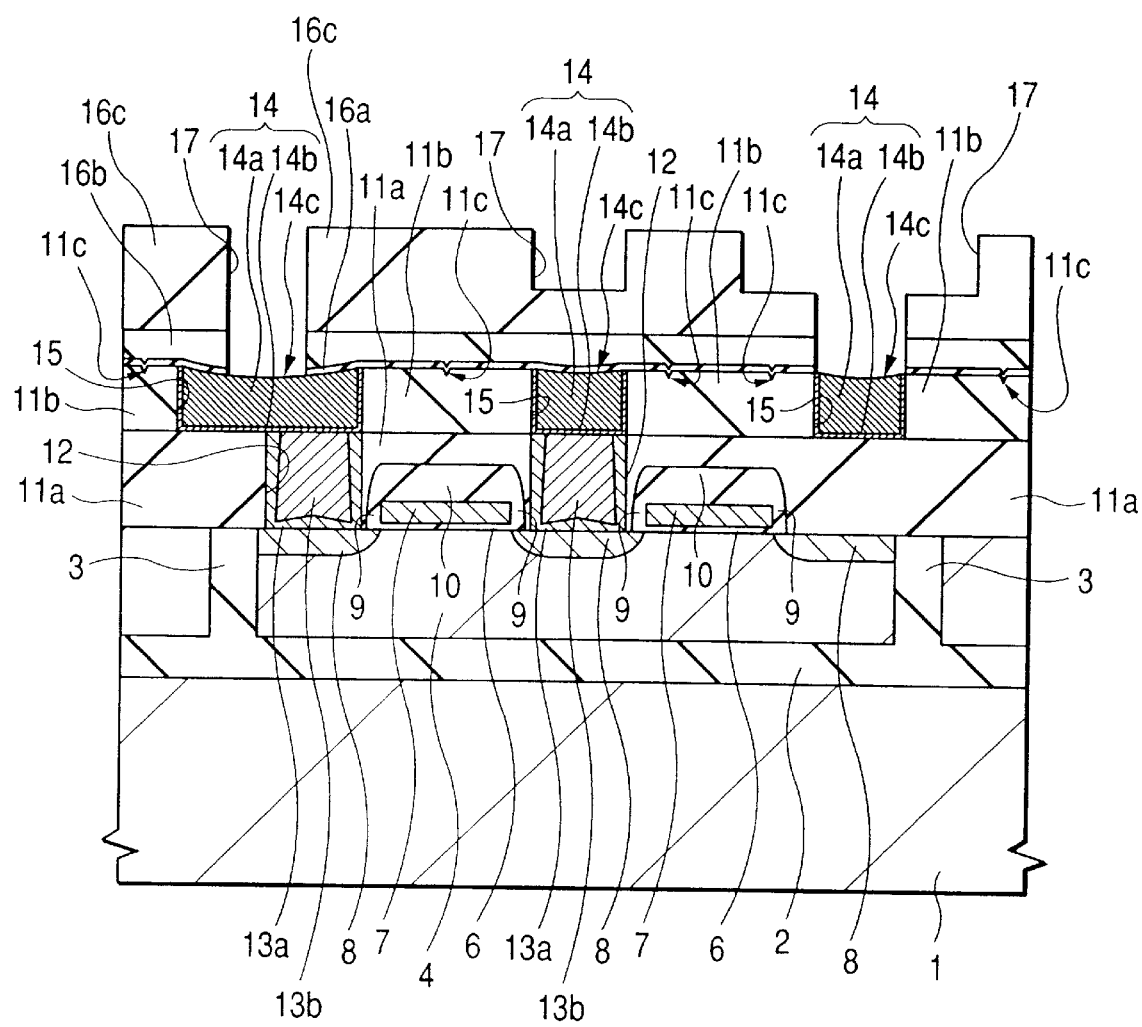
FIG. 14 is a cross-sectional view illustrating a step of the fabrication process of the semiconductor integrated circuit device of the first embodiment in the order of steps.

An insulating film 16c is then deposited over the planarizing film 16b, whereby the formation of an interlayer insulating film 16 is completed. A silicon oxide film formed for example by the CVD method can be used as the insulating film 16c. The surface of the insulating film 16c, that is, the surface of the interlayer insulating film 16 is kept flat owing to the existence of the planarizing film 16b. Interconnection grooves 17 are then formed (FIG. 14). Some of the interconnection grooves 17 include connecting holes for the connection with the interconnection 14 which exists below.

Figure 15:
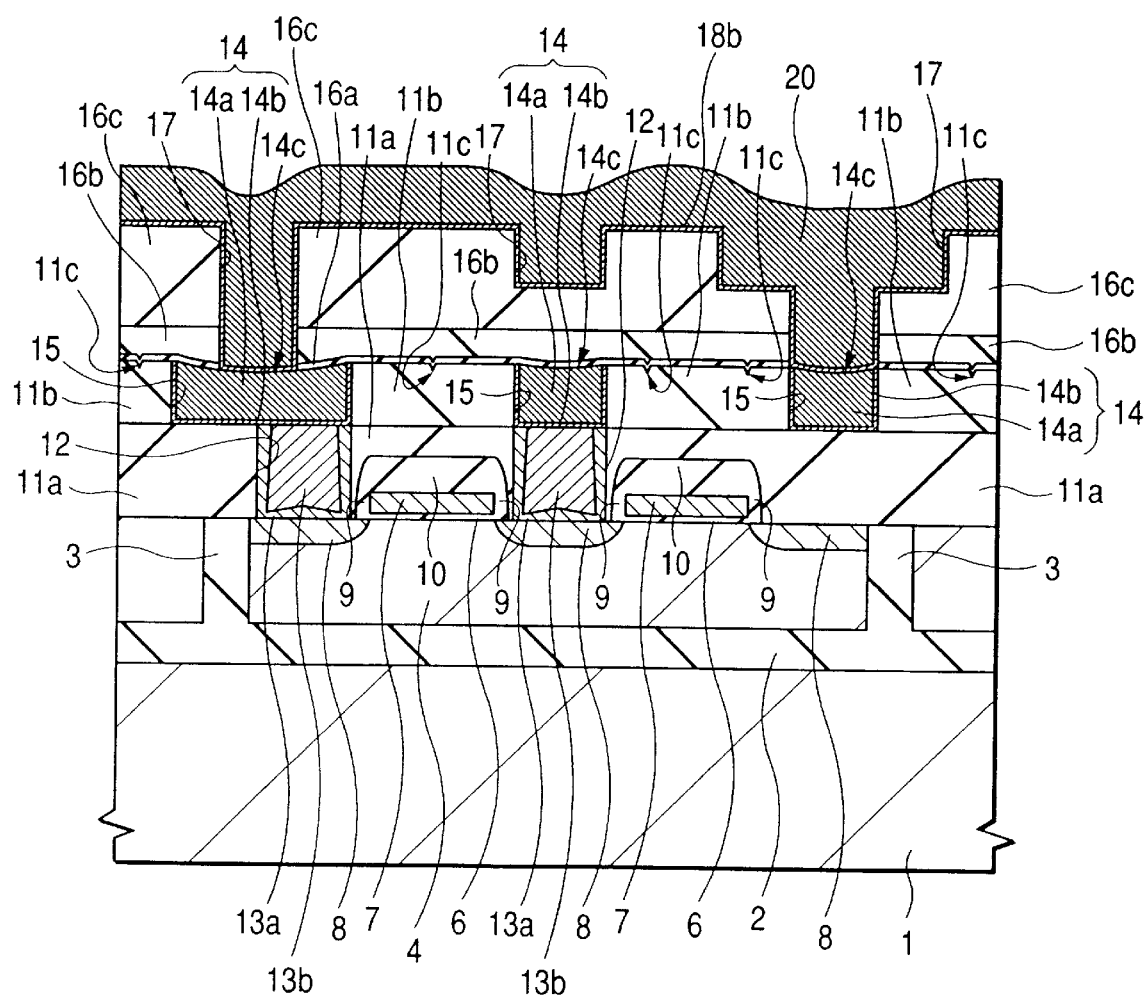
FIG. 15 is a cross-sectional view illustrating a step of the fabrication process of the semiconductor integrated circuit device of the first embodiment in the order of steps.

As in the case of the interconnection 14, a titanium nitride film 18b which will be a part of the interconnection 18 is deposited. A metal film which will be a main conductive film 18a, for example, a thin copper film is then deposited over the titanium nitride film 18b, followed by thermal treatment for fluidization, whereby a metal film 20 favorably embedded in the interconnection groove 17 is formed (FIG. 15). The titanium nitride film 18b and metal film 20 can be formed in a similar manner to that employed for the titanium nitride film 14b and metal film 17 so that the description thereof is omitted.

In the final step, the unnecessary portions of the metal film 20 and titanium nitride film 18b on the it interlayer insulating film 16 are removed to form an interconnection 18, whereby a semiconductor integrated circuit device as illustrated in FIG. 1 is substantially completed. For the removal of the metal film 20 and titanium nitride film 18b, the CMP method is employed. In this embodiment, since the surface flatness of the interlayer insulating film 16 is maintained and an undesired concave portion therefore does not exist on the surface of the interlayer insulating film 16 even by the formation of the interconnection 18 by the CMP method so that neither the metal film 20 nor the titanium nitride film 18b remains undesirably. As a result, the occurrence of the short circuit of the interconnection 18 attributable to such a residue can be prevented and the yield and reliability of the semiconductor integrated circuit device can be improved.

In addition, since the flatness of the surface of the interlayer insulating film 16 is maintained, it is possible to form the interconnection 18 securely even without over etching by CMP, whereby over etching can be prevented. Accordingly, the formation of a dishing on the surface of the interconnection 18 is suppressed, whereby a short circuit of the interconnection to be formed thereover is prevented and the yield and reliability of the semiconductor integrated circuit device can be improved.

In the first embodiment 1, an SOG film was exemplified as the planarizing film 16b. Alternatively, a silicon oxide film formed by the formation of a silanol $(H_nSi(OH)_{4-n})$ in a gaseous phase and reaction of the resulting silanol on the low-temperature substrate can also be used. Such a silicon oxide film is obtained by preparing a silanol through the combination of a silane gas $(SiH_4)$ and hydrogen peroxide $(H_2O_2)$ under reduced pressure, allowing the silanol to absorb to the surface of the substrate and causing reaction therebetween to form a film and then thermally treating the resulting film at 450° C. or lower for curing. Such a film deposited by the adsorption and reaction of a silanol has self fluidity so that the surface flatness of the interlayer insulating film 16 can be maintained similar to the above-described SOG film.

As a raw material gas for the formation of a silanol, alkylsilanes ($SiH_xM_{4-x}$ wherein M represents a $C_{1-3}$ alkyl group, $1 \leq x \leq 4$) such as methylsilane (dimethylsilane, trimethylsilane or the like) or ethylsilane (diethylsilane, triethylsilane or the like) having, as a substituent for a hydrogen group (—H), an alkyl group such as methyl (—$CH_3$) or ethyl (—$C_2H_5$) can be exemplified as well as the silane gas. The carbon atoms of the alkyl group are limited to 3 or less-in consideration of the acceleration of the silanol forming reaction owing to an adsorption improvement of an alkylsilane ($SiH_xM_{4-x}$) onto the semiconductor substrate maintained at a low temperature, and convenience of supplying the raw material gas as a gaseous phase.

Second Embodiment

Figure 16:
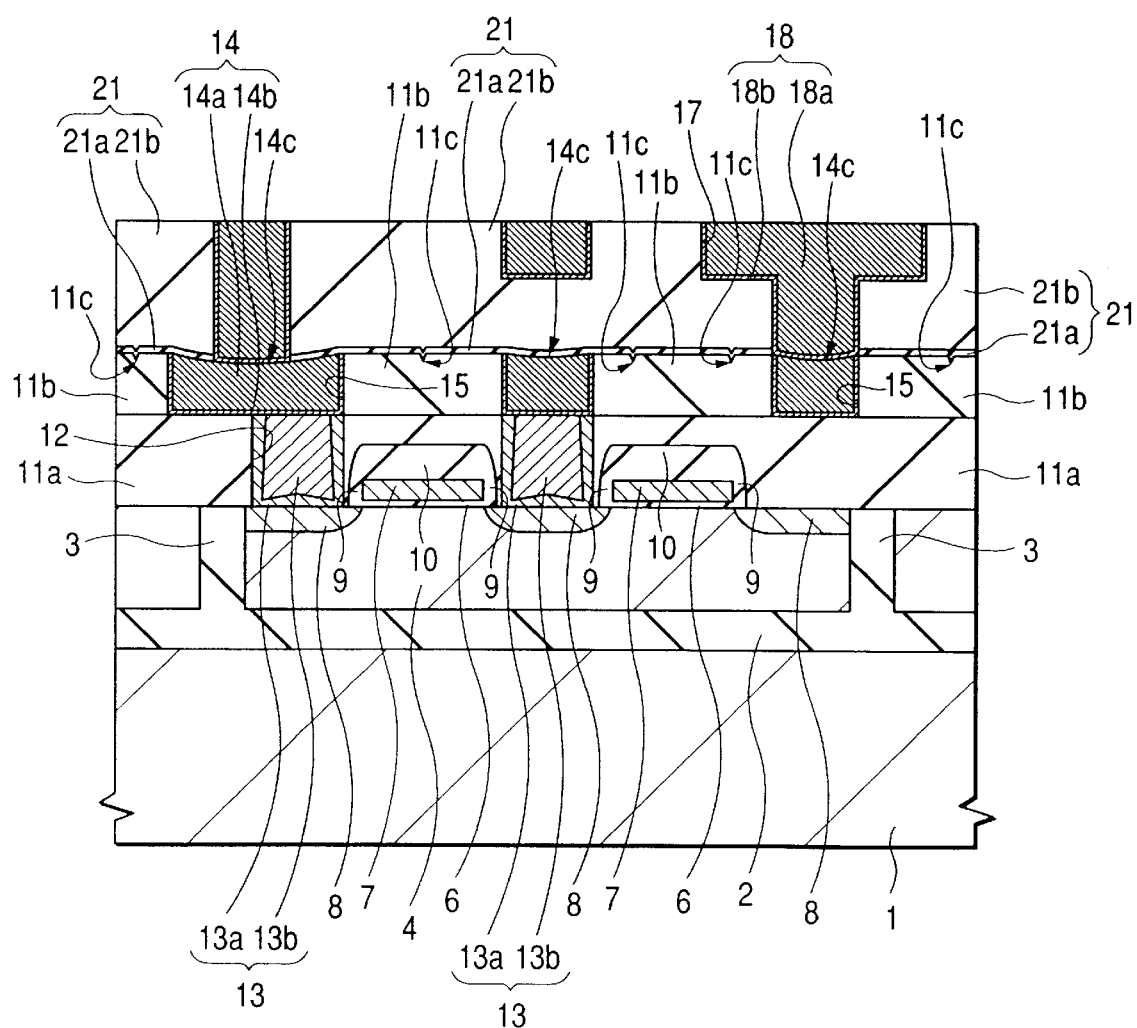
FIG. 16 is a cross-sectional view illustrating one example of a semiconductor integrated circuit device according to a second embodiment of the present invention.

FIG. 16 is a cross-sectional view illustrating one example of a semiconductor integrated circuit device according to another embodiment of the present invention.

The semiconductor integrated circuit device according to the second embodiment is similar to that of the first embodiment except that the interlayer insulating film 16 has been replaced by an interlayer insulating film 21. Members constituting the device of the second embodiment are therefore similar to those of the first embodiment except for the above-described member so that a description of the-other same members will hereinafter be omitted.

The interlayer insulating film 21 is made of a blocking film 21a which is similar to the blocking film 16a in the first embodiment and a silicon oxide film 21b which has been deposited by the CVD method and planarized by the CMP method. The blocking film 21a is, similar to the blocking film 16a of the first embodiment, made of a silicon nitride film having a thickness of about 100 nm. The silicon oxide film 21b itself has a sufficient thickness so that it is different from the interlayer insulating film 16 of the first embodiment in that no insulating film 16c is formed. It is, however, possible to decrease the thickness of the silicon oxide film 21b and form an insulating film corresponding to the insulating film 16c as in the first embodiment, thereby imparting sufficient thickness to the interlayer insulating film 21.

A process for the fabrication of the above-described semiconductor integrated circuit device will next be described with reference to the accompanying drawings. FIGS. 17 to 20 are cross-sectional views illustrating, in the order of steps, one example of the fabrication process of a semiconductor integrated circuit device according to this second embodiment of the present invention.

The process according to the second embodiment is similar to that according to the first embodiment until the step as illustrated in FIG. 11.

Figure 17:
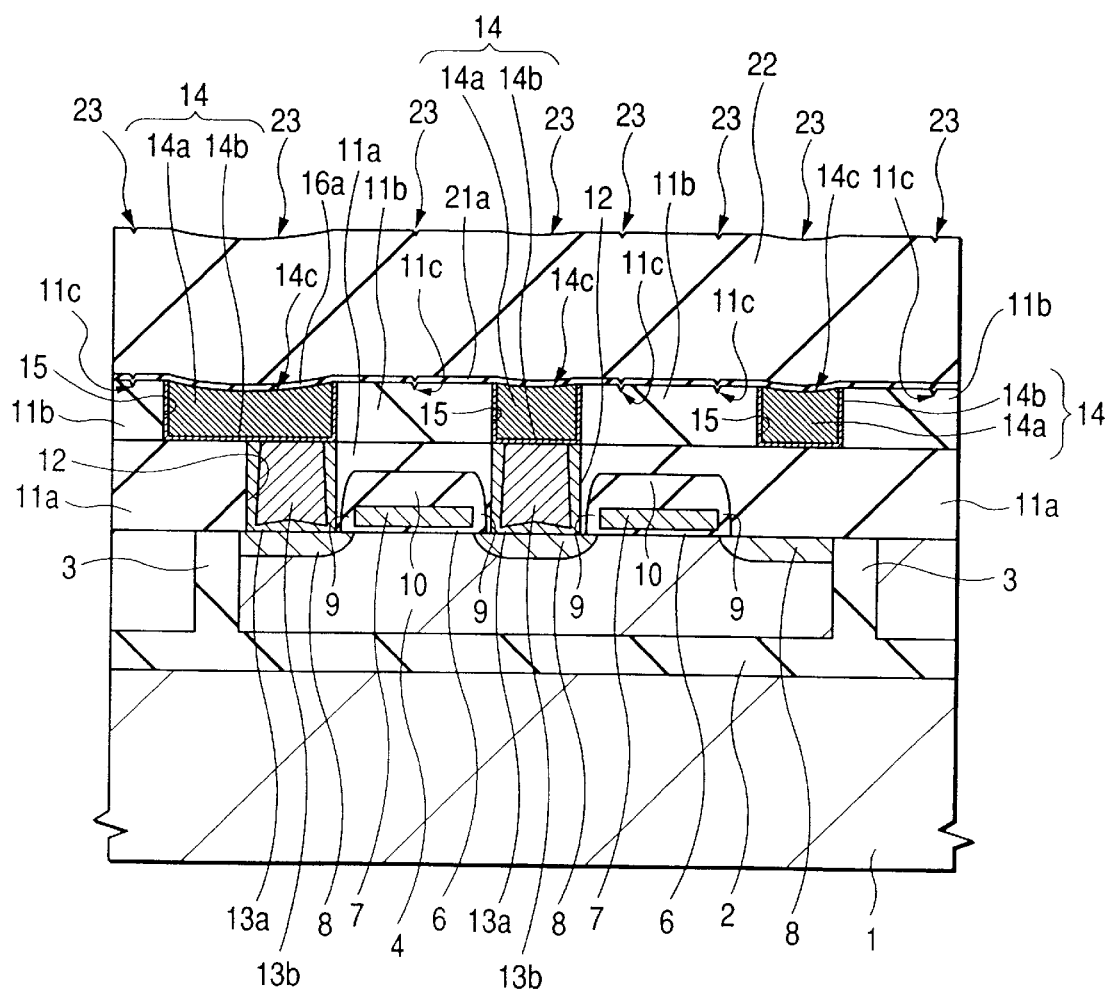
FIG. 17 is a cross-sectional view illustrating a step of the fabrication process of the semiconductor integrated circuit device of the second embodiment in the order of steps.
Figure 18:
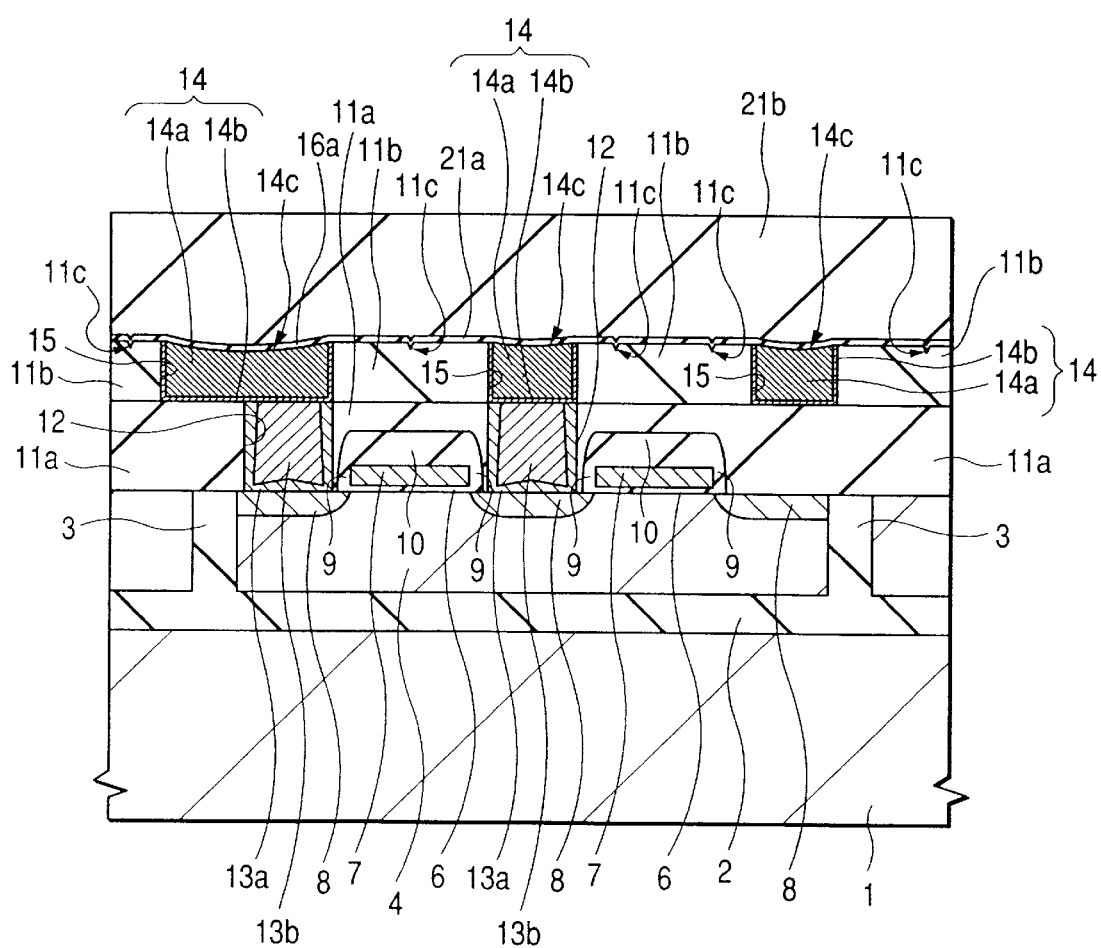
FIG. 18 is a cross-sectional view illustrating a step of the fabrication process of the semiconductor integrated circuit device of the second embodiment in the order of steps.
Figure 19:
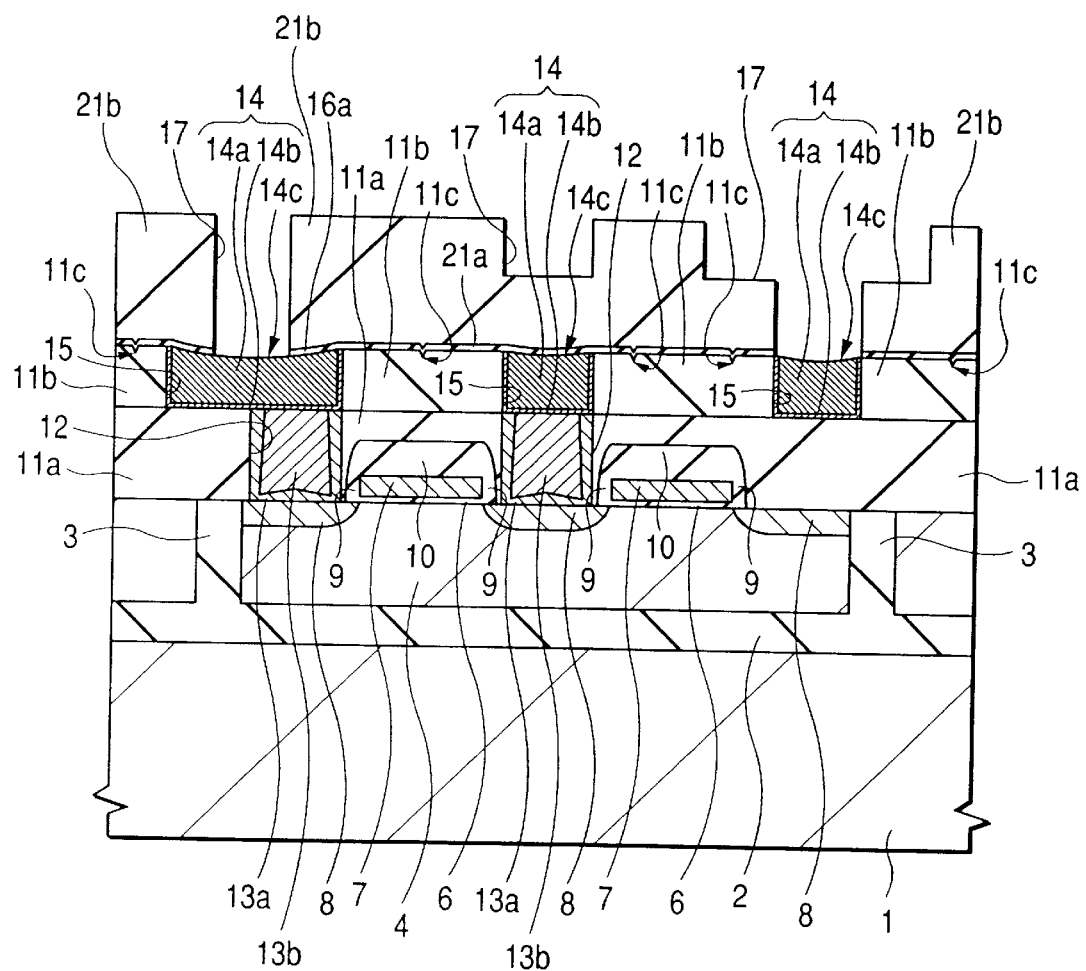
FIG. 19 is a cross-sectional view illustrating a step of the fabrication process of the semiconductor integrated circuit device of the second embodiment in the order of steps.

Then, similar to the blocking film 16a of the first embodiment, a blocking film 21a is formed by depositing a silicon nitride film. Over it, a silicon oxide film 22 having a sufficient film thickness is formed by the CVD method (FIG. 17). The silicon oxide film 22 formed by the CVD method has no self fluidity so that a concave portion 23 attributable to a dishing 14 or scratch 11c is formed on the surface of it.

Then, the silicon oxide film 22 is polished by the CMP method (FIG. 18) to remove the concave portions 23 formed on the surface of the silicon oxide film 22, whereby a silicon oxide film 21b is formed and the interlayer insulating film 21 having a flat surface is formed. In the process according to the second embodiment, the use of the CMP method makes it possible to remove the concave portion 23 and in addition, to improve the whole flatness of the semiconductor substrate 1.

Figure 20:
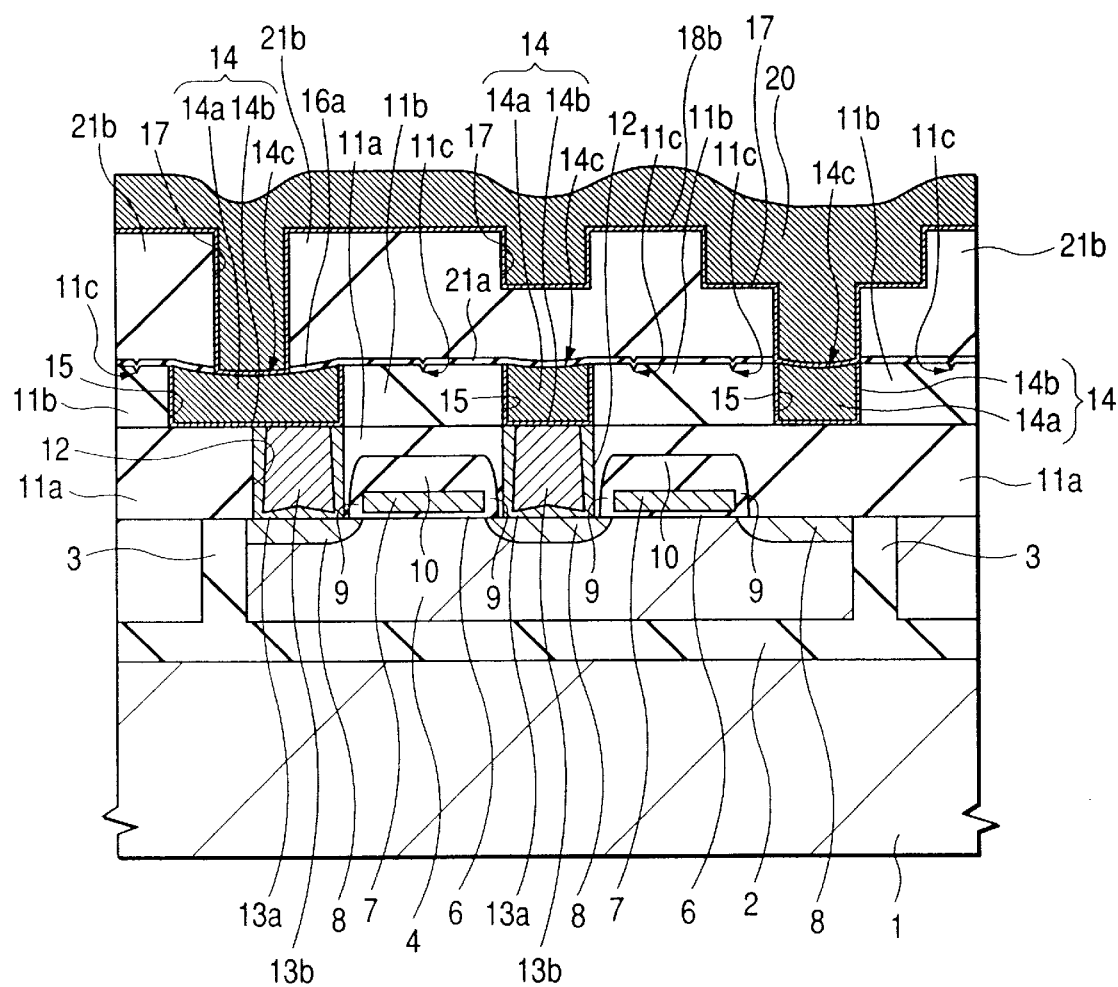
FIG. 20 is a cross-sectional view illustrating a step the fabrication process of the semiconductor integrated circuit device of the second embodiment in the order of steps.

Then, similar to the first embodiment, an interconnection groove 17 is formed in the interlayer insulating film 21 (FIG. 19), followed by the formation of a titanium nitride film 18b and a metal film 20 which will be a main conductive film 18a are formed as in the first embodiment (FIG. 20).

In the final step, the metal film 20 and titanium nitride film 18b on the interlayer insulating film 21 are removed to form an interconnection 18, whereby a semiconductor integrated circuit device as illustrated in FIG. 16 is substantially completed. For the removal of the metal film 20 and the titanium nitride film 18b, the CMP method is employed as in the first embodiment 1. Since the surface flatness of the interlayer insulating film 21 is maintained in this embodiment, neither metal film 20 nor titanium nitride film 18b undesirably remains on the surface of the interlayer insulating film 21 even by the CMP method for the formation of the interconnection 18. As a result, the occurrence of a short circuit of the interconnection 18 due to such a residue can be prevented and the yield and reliability of the semiconductor integrated circuit device can be improved.

In addition, since the flatness of the surface of the interlayer insulating film 16 is maintained, it is possible to form the interconnection 18 securely even without over etching by CMP, whereby over etching can be prevented. Accordingly, the formation of a dishing on the surface of the interconnection 18 is suppressed to prevent a short circuit of the interconnection to be formed thereover and the yield and reliability of the semiconductor integrated circuit device can be improved.

Third Embodiment

Figure 21:
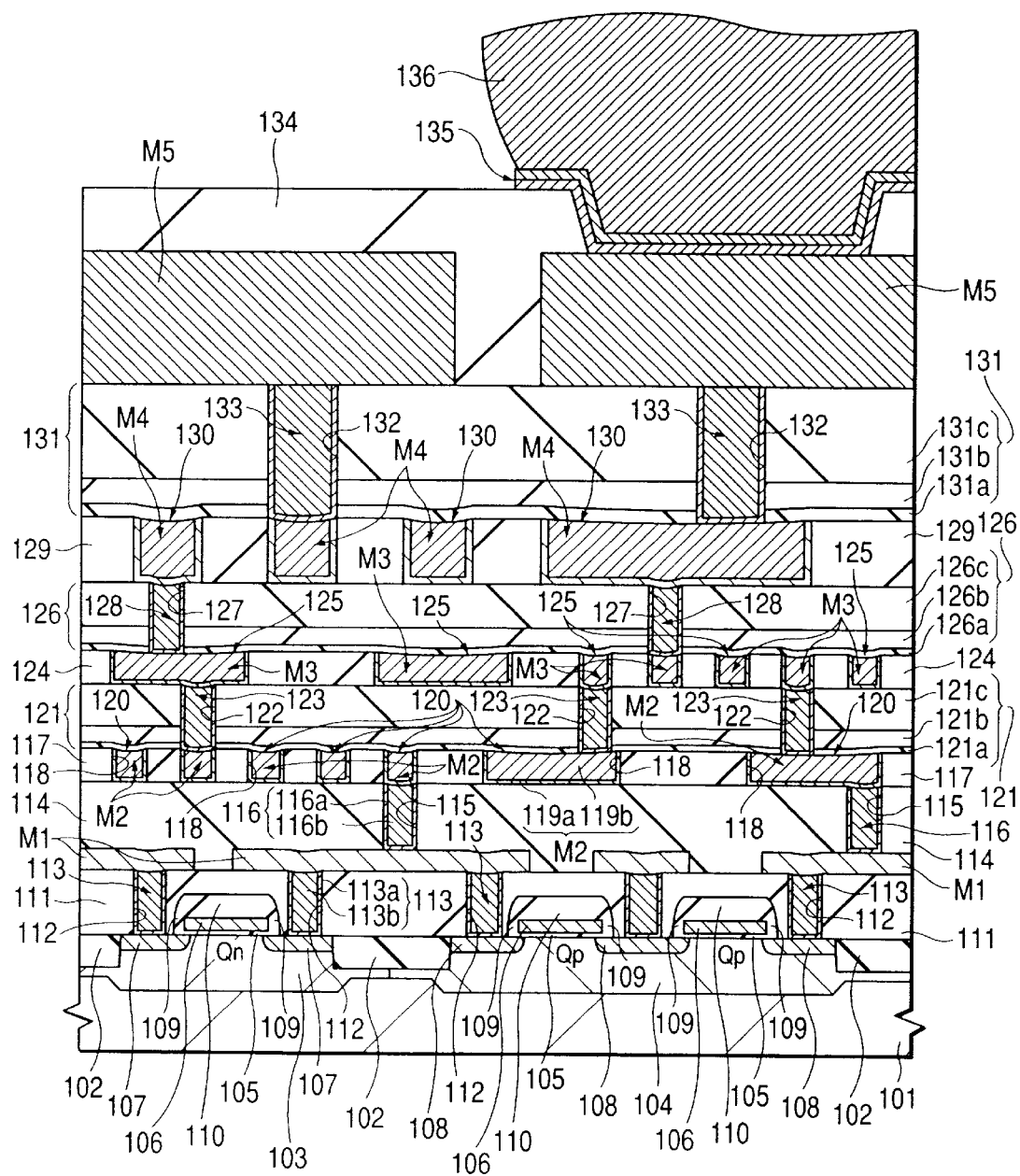
FIG. 21 is a cross-sectional view illustrating one example of a semiconductor integrated circuit device of a third further embodiment of the present invention.

FIG. 21 is a cross-sectional view illustrating one example of a semiconductor integrated circuit device according to a further aspect of the present invention.

The semiconductor integrated circuit device according to the third embodiment has an n-channel MISFETQn and p-channel MISFETQp formed over a semiconductor substrate 101. The semiconductor devices n-channel MISFETQn and p-channel MISFETQp constitute CMISFET (Complementary-MISPET), thereby constituting a semiconductor integrated circuit device, in which passive elements such as resistor and capacitor can be included, though not illustrated. Although CMISFET is exemplified in this embodiment, a semiconductor integrated circuit device can be formed of a single channel MISFET, that is, n-channel MISFETQn or p-channel MISFETQp. Furthermore, although a MISFET is exemplified in this embodiment, a semiconductor integrated circuit device can be formed of a semiconductor device having a transistor structure such as bipolar transistor or Bi-CMISFET.

In the vicinity of the principal surface of the semiconductor substrate 101, element isolation regions 102 are formed and in the active region surrounded by the in element isolation regions 102, a p-type well 103 having a p-type impurity (ex. boron (B)) introduced therein at a low concentration and an n-type well 104 having an n-type impurity (ex. phosphorus (P), arsenic (As)) introduced therein at a low concentration are formed. The n-channel Ad MISFETQn is formed on the principal surface of the active 4a region of the n-type well 104, while the p-channel MISFETQp is formed on the principal surface of the active region of the n-type well 104. The element isolation regions 102 are each formed in a shallow groove on the principal surface of the semiconductor substrate 101 and it is made of a silicon oxide film or the like. Incidentally, it is needless to say that the semiconductor substrate 101 can be an SOI substrate as described in the first embodiment.

The n-channel MISFETQn has a gate electrode 106 formed on the principal surface of the p-type well 103 through a gate insulating film 105 and n-type semiconductor regions 107 formed on both sides of the gate electrode 105 on the principal surface of the semiconductor substrate 101. The p-channel MISFETQp has another gate electrode 106 formed on the principal surface of the n-type well 104 through another gate insulating film 105 and p-type semiconductor regions 108 formed on both side of the gate electrode 106 on the principal surface of the semiconductor substrate 101.

The gate insulating film 105 is made of a silicon oxide film which has a thickness of several nm and can be formed, for example, by the thermal oxidation method or thermal CVD method. The gate electrode 106 is, for example made of a low-resistance polycrystalline silicon film, over which, with a view to decreasing the resistance, a silicide film such as tungsten (W) silicide or cobalt (Co) silicide may be stacked or a metal film such as tungsten (W), molybdenum (Mo), titanium (Ti) or tantalum (Ta) is formed with a barrier metal such as titanium nitride (TiN) or tungsten nitride (WN) being disposed between the gate electrode 106 and the metal film.

The semiconductor regions 107 and 108 function as a source-drain region of the n-channel MISFETQn and p-channel MISFETQp, respectively. Into the semiconductor region 107, an n-type impurity (ex. phosphorus or arsenic) is introduced, while into the semiconductor region 108, a p-type impurity (ex. boron) is introduced. The semiconductor regions 107 and 108 may be formed to have a so-called LDD (Lightly Doped Drain) structure which is made of a low-concentration semiconductor region having an impurity introduced therein at a low concentration and a high-concentration semiconductor region having an impurity introduced therein at a high concentration. Over the semiconductor regions 107 and 108, a high-melting-point metal silicide film such as $WSi_x$, $MoSi_x$, $TiSi_x$ and $TaSi_x$ may be formed.

On the side walls and upper surface of the gate electrode 106, side wall spacers 109 and a cap insulating film 110 are formed, respectively. As the side wall spacers 109 and cap insulating film 110, a silicon oxide film, a silicon nitride film or the like can be used. When a silicon nitride film is used, a connecting hole can be opened, as will be described later, in a interlayer insulating film in self alignment by using the side wall spacers 109 and cap insulating film 110, each made of a silicon nitride film, as masks.

Over the semiconductor substrate 101, n-channel MISFETQn and p-channel MISPETQp, an interlayer insulating film 111 is formed. As the interlayer insulating film 111, a reflow film such as BPSG film or PSG film can be used. Alternatively, the interlayer insulating film 111 can be formed as a laminate film with a silicon oxide film formed below or over the interlayer insulating film 111 by the CVD sputtering method. The interlayer insulating film 111 has a surface planarized, for example, by the CMP method.

In the interlayer insulating film 111 over the semiconductor regions 107 and 108, a connecting hole 112 is disposed. In the connecting hole 112, formed is a plug 113 which is made of a tungsten film 113a formed, for example, by the sputtering method and a tungsten film 113b formed, for example, by the blanket CVD or selective CVD method.

Over the interlayer insulating film 111, a first-layer interconnection M1 is formed. As the first-layer interconnection M1, for example, a tungsten film patterned by photolithography can be used. The first-layer interconnection M1 is electrically connected with the semiconductor regions 107 and 108 through the plug 113. Incidentally, since tungsten is used as a material for the first-layer interconnection M1, the element which constitutes the first-layer interconnection M1 does not diffuse into the semiconductor substrate, whereby a highly reliable semiconductor integrated circuit device can be formed.

Over the first-layer interconnection M1 and interlayer insulating film 111, formed is an interconnection interlayer insulating film 114 for insulating between the first-layer interconnection M1 and the second-layer interconnection M2 which will be described later. As the interconnection interlayer insulating film 114, a silicon oxide film which has been formed for example by the CVD method and has a surface planarized by the CMP method can be used. In the interconnection interlayer insulating film in 114, a connecting hole 115 is formed. The connecting hole 115 is formed to have therein a plug 116 made of a tungsten film 16a formed for example by the sputtering method and a tungsten film 116b formed for example by the blanket CVD or selective CVD method. Instead of the tungsten film 116b, a titanium nitride film formed by the sputtering or CVD method can be used.

Over the interconnection interlayer insulating film 114, an interconnection-forming insulating film 117 for the formation of the second-layer interconnection M2 is formed. As the interconnection-forming insulating film 117, a silicon oxide film formed for example by the CVD method can be used. Incidentally, scratches are formed on the surface of the interconnection-forming insulating film 117, but they are not illustrated. These scratches are made by a polishing agent of CMP and these scratches occur, as will be described later, due to over etching to some extent to remove the metal film on the surface of the interconnection-forming insulating film 117 completely upon the formation of the second-layer interconnection M2 by the CMP method.

In the interconnection-forming insulating film 117, an interconnection groove 118 is formed. The interconnection groove 118 has the second-layer interconnection M2 formed therein. The second-layer interconnection M2 is made of a barrier film 119a for example made of titanium nitride (TiN) and a main conductive film 119b for example made of copper (Cu). Since a low resistance material such as copper is used as the main conductive film 119b, the resistance of the second-layer interconnection M2 can be reduced, interconnection resistance between the semiconductor devices can be reduced to shorten the delay time of the circuit and a response rate of the semiconductor integrated circuit device can be improved, leading to the improvement in the performance of the semiconductor integrated circuit device.

As the barrier film 119a, tantalum (Ta), tungsten nitride (WN), tantalum nitride (TaN), tantalum oxide (TaO) or silicon oxide nitride (SiON) can be used instead of titanium nitride. For the main conductive film 119b, aluminum (Al) or tungsten (W) can be used instead of copper. The barrier film 119a has a function of preventing the diffusion of a metal element which constitutes the main conductive film 119b, securing the insulation property between interconnections and maintaining the performance and reliability of the semiconductor integrated circuit device at high levels.

The second-layer interconnection M2 is, as will be described later, formed by the CMP method. It has on its surface a concave portion (dishing portion) 120 which has been formed owing to a difference in the polishing rate by the CMP method between a material (ex. silicon oxide film) constituting the interconnection-forming insulating film 117 and a material (ex. copper and titanium nitride) constituting the second-layer interconnection M2. If over polishing is carried out to some extent in order to form the second-layer interconnection M2 securely, copper is polished faster than the silicon oxide film, which inevitably forms a relatively concave surface. The existence of such a concave portion 120 and problems attributable to it are as described above.

On the surfaces of the interconnection-forming insulating film 117 and second-layer interconnection M2, the interconnection interlayer insulating film 121 is formed. The interconnection interlayer insulating film 121 is made of a blocking film 121a formed in contact with the second-layer interconnection M2 and interconnection-forming insulating film 117, a planarizing film 121b and an insulating film 121c.

As the blocking film 121a, a silicon nitride film formed, for example, by the plasma CVD method can be used. It has a function of suppressing the diffusion of copper which constitutes the main conductive film 119b of the In second-layer interconnection M2. Together with the barrier film 119 made of titanium nitride, the blocking film 121a exhibits effects for preventing the diffusion of copper and maintaining the insulation property of the interconnection interlayer insulating film 114, interconnection-forming insulating film 117, interconnection interlayer insulating film 121 and the like, thereby heightening the reliability of the semiconductor integrated circuit device. Incidentally, when a silicon nitride film is used, the blocking film 121a can be formed to a thickness of about 100 nm. As the blocking film 121a, a silicon oxide nitride film can be used instead of a silicon nitride film.

The planarizing film 121a is a film having self fluidity, for example, an SOG film and is able to planarize its surface by removing the influence of the concave portion 120. The existence of such a planarizing film 121b makes it possible to secure the flatness of the surface of the interconnection interlayer insulating film 121, thereby preventing the formation of the residue of a metal film upon the formation of a plug or upper interconnection to be embedded in the interconnection interlayer insulating film 121 as will be described later and preventing the occurrence of a short circuit between the upper in interconnections. The semiconductor integrated circuit therefore maintain its predetermined performance and is able to have improved yield and reliability.

An inorganic SOG film can be used as the planarizing film 121b. The use of the inorganic SOG film makes it possible to improve the reliability of the semiconductor integrated circuit device without imparting the planarizing film 121b with water absorption or causing a volumetric decrease of the planarizing film 121b upon peeling of a photoresist film in the opening step of a connecting hole in the planarizing film 121b which will be described later. Alternatively, an organic SOG film can be used as the planarizing film 121b. Although the use of the organic SOG film causes the above-described inconveniences in the opening step of the connecting hole, the film makes it possible to reduce a line capacity between interconnections by making use of its low dielectric constant and to raise the speed of the semiconductor integrated circuit device, thereby improving its performance.

As the insulating film 121c, a silicon oxide film formed for example by the CVD method can be used and it has a function of securing the thickness of the interconnection interlayer insulating film 121. The insulating film 121c is therefore not essential when the sufficient film thickness of the interconnection interlayer insulating film 121 can-be secured by the planarizing film 121b.

Incidentally, the interconnection interlayer insulating film 121 is able to have a silicon oxide film formed between the blocking film 121a and the planarizing film 121b by the CVD method.

In the interconnection interlayer insulating film 121, a connecting hole 122 is formed , in which a plug 123 similar to the plug 116 is formed. Over the interconnection interlayer insulating film 121 and plug 123, an interconnection-forming insulating film 124 and third-layer interconnection M3 similar to the above-described interconnection-forming insulating film 117 and second-layer interconnection M2 are formed. The plug 123, interconnection-forming insulating film 124 and third-layer interconnection M3 are similar to the above-described plug 116, interconnection-forming insulating film 117 and second-layer interconnection M2 so that a detailed description thereof will be omitted. The third-layer interconnection M3 is, similar to the second-layer interconnection M2, made of a barrier film and a main copper-made conductive film.

Although the third-layer interconnection M3 has a concave portion 125 on its surface similar to the second in layer interconnection M2, the unevenness attributable to the concave portion 125 on the surface of the interconnection interlayer insulating film 126 is leveled owing to the existence of the planarizing film 126b which constitutes the interconnection interlayer insulating film 126, which makes it possible to prevent the formation of the residue of a metal film upon formation of an upper plug or upper interconnection, thereby preventing the occurrence of a short circuit between upper interconnections. As a result, the semiconductor integrated circuit device is able to have a predetermined performance and have improved yield and reliability. Similar to the planarizing film 121b, the planarizing film 126b is made of a film having self fluidity such as an SOG film. The other films which constitute the interconnection interlayer insulating film 126, that is, a blocking film 126a and an insulating film 126c are also similar to the above-described blocking film 121a and insulating film 121c so that a detailed description of them will be omitted. Incidentally, similar to the interconnection interlayer insulating film 121, the interconnection interlayer insulating film 126 is able to have a silicon oxide film formed between the blocking film 126a and the planarizing film 126b by the CVD method.

A connecting hole 127 is formed in the interconnection interlayer insulating film 126 and a plug 128 similar to the above-described plug 116 is formed in the connecting hole 127. Over the interconnection interlayer insulating film 126 and plug 128, an interconnection-forming insulating film 129 and fourth-layer interconnection M4 similar to the above-described interconnection-forming insulating film 117 and second-layer interconnection M2 are formed. In other words, similar to the second-layer interconnection M2, the fourth-layer interconnection M4 has a barrier film and a main conductive film made of copper. The interconnection-forming insulating film 129 and fourth-layer interconnection M4 each has a film thickness and width larger than those of the interconnection-forming insulating film 117 and second-layer interconnection M2.

Although similar to the second-layer interconnection M2, the fourth-layer interconnection M4 has a concave portion 130 on its surface, the unevenness attributable to the concave portion 130 on the surface of the interconnection interlayer insulating film 131 is leveled in owing to the existence of the planarizing film 131b which constitutes the interconnection interlayer insulating film 131, which makes it possible to prevent the formation of the residue of a metal film upon formation of an upper plug or upper interconnection, thereby preventing the occurrence of a short circuit between upper interconnections. As a result, the semiconductor integrated circuit device is able to have a predetermined performance and have improved yield and reliability. Similar to the planarizing film 121b, the planarizing film 131b is made of a film having self fluidity such as an SOG film. The other films which also constitute the interconnection interlayer insulating film 131, that is, a blocking film 131a and an insulating film 131c are similar to the above-described blocking film 121a and insulating film 121c so that a detailed description of them will be omitted. Incidentally, the film thickness of the interconnection interlayer insulating film 131 is formed larger than that of the interconnection interlayer insulating film 121. Similar to the interconnection interlayer insulating film 121, the interconnection interlayer insulating film 131 is able to have a silicon oxide film formed between the blocking film 131a and the planarizing film 131b by the CVD method.

A connecting hole 132 is formed in the interconnection interlayer insulating film 131 and a plug 133 made of tungsten similar to the plug 116 is formed in the connecting hole 132. The plug 133 has however a diameter and height larger than those of the plug 116 because the interconnection interlayer insulating film 131 is formed thick.

Over the interconnection interlayer insulating film 131 and plug 133, a fifth-layer interconnection M5 is formed. The fifth-layer interconnection M5 is, for example, made of aluminum or an aluminum alloy and it is formed by photolithography and etching techniques.

By electrically connecting, through a barrier film made of tungsten, the fifth-layer interconnection M5 made of aluminum or an aluminum alloy and the fourth-layer interconnection M4 having a main conductive film made of copper, an increase in the resistance caused by the reaction between aluminum and copper can be prevented.

The fifth-layer interconnection MS is covered with an insulating film 134. As the insulating film 134, a silicon oxide film or silicon nitride film formed for example by the CVD method or a laminate film thereof can be used. The insulating film 134 may include a protective film such as PIQ.

An opening is formed partially in the insulating film 134. A bump 136 and the fifth-layer interconnection MS are electrically connected through a bump lower metal (BLM) 135 formed in the opening. As the bump lower metal 135, a laminate film of nickel and gold can be used, while as the bump 136, gold or solder can be used. Incidentally, copper can be used as a material for the fifth-layer interconnection M5, but the use of aluminum improves the alignment with the bump lower metal 135 and the bump 136.

When a bonding pad for wire bonding is formed on the fifth-layer interconnection M5 in place of the bump 136, an improvement in the reliability can be brought about by forming the bonding pad from an aluminum alloy which is more oxidation resistant than copper. In the upper interconnection such as fifth-layer interconnection M5, the interconnection rule such as a pitch between interconnections can be made looser than that of the second to fourth-layer interconnections M2 to M4 so that the reliability can be improved by constituting the upper interconnection from an aluminum alloy which is freer than copper from the problems such as oxidation. In the second to fourth-layer interconnections M2 to M4, on the other hand, interconnections can be disposed at high density by decreasing the interconnection width and interconnection pitch and at the same time, the acting speed of the circuit can be improved by using as a main conductive film copper which has a smaller specific resistance than aluminum, thereby decreasing the interconnection resistance.

The thickness and width of each of the first-layer interconnection M1 to the fifth-layer interconnection M5 and the diameter and height of each of the plugs 116, 123, 128 and-133 are exemplified below. For example, the first-layer interconnection M1 can be formed to a thickness of 0.2 to 0.3 μm and a minimum width of 0.4 μm. The second and third-layer interconnections M2 and M3 can each be formed to a thickness of 0.5 μm and a minimum width of 0.5 μm. The fourth-layer interconnection M4 can be formed to a thickness of 1 μm and a minimum width of 1 μm. The plugs 116, 123 and 128 can each be formed to a diameter of 0.5 μm and a height of 1 μm, while the plug 133 can be formed to a diameter of 1 μm and a height of 2 μm.

A process for the fabrication of the above-described semiconductor integrated circuit device will next be described with reference to accompanying drawings. FIG. 22 to FIG. 54 are cross-sectional views illustrating one example of the fabrication process of the semiconductor integrated circuit device according to the third embodiment in the order of steps.

First, a semiconductor substrate 101 made of p_ type single crystal silicon is prepared. A shallow groove is formed in the semiconductor substrate 101 by patterning a photoresist film having an opening at a region where an element isolation region 102 is to be formed. The photoresist film is then removed and a silicon oxide film to be embedded in the shallow groove is deposited all over the semiconductor substrate 101. The silicon oxide film is polished by the CMP method, whereby a portion of the silicon oxide film on the semiconductor substrate 101 outside the shallow groove is removed and the element isolation region 102 is formed in the shallow groove.

Figure 22:
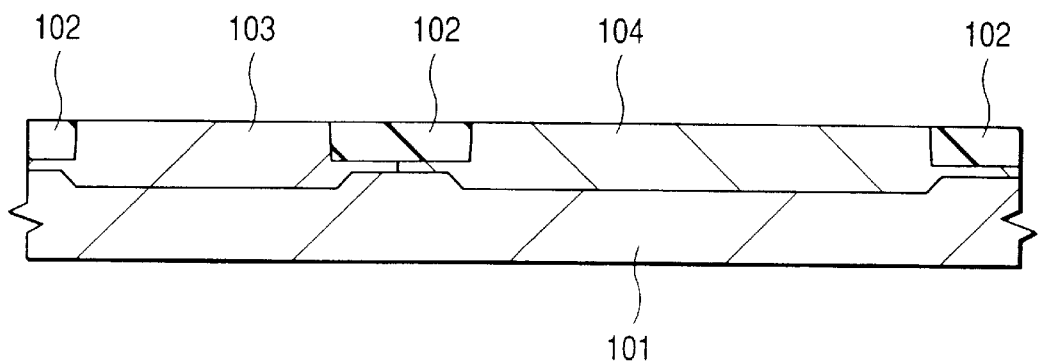
FIG. 22 is a cross-sectional view illustrating a step of the fabrication process of the semiconductor integrated circuit device of the third embodiment in the order of steps.

Next, a photoresist film having an opening at a region where a p-type well 103 is to be formed is patterned. With the photoresist film as a mask, an impurity for forming a region of a p-conductivity type, for example, boron is ion-implanted. After removal of the photoresist film, a photoresist film having an opening at a region where an n-type well 104 is to be formed is patterned. With the photoresist film as a mask, an impurity for forming a region of an n-conductivity type, for example, phosphorus is ion implanted. The photoresist mask is removed. The semiconductor substrate 101 is then thermally treated to activate the above-described impurities, whereby the p type well 103 and the n type well 104 are formed (FIG. 22).

Figure 23:
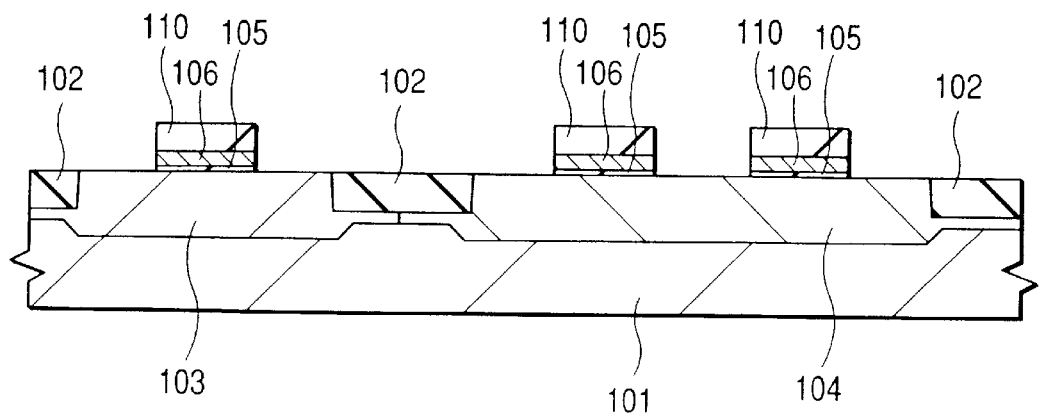
FIG. 23 is a cross-sectional view illustrating a step of the fabrication process of the semiconductor integrated circuit device of the third embodiment in the order of steps.

Over the principal surface of the semiconductor substrate 101, a silicon oxide film which will be a gate insulating film 105, a polycrystalline silicon film which will be a gate electrode 106 and a silicon oxide film which will be a cap insulating film 110 are deposited successively to form a laminate film. With a photoresist film patterned by photolithography as a mask, the laminate film is etched, whereby the gate insulating film 105, gate electrode 106 and cap insulating film 110 are formed (FIG. 23). The gate insulating film 105 can be deposited, for example, by the thermal CVD method. Although the gate electrode 106 can be formed by the CVD method, an n type impurity (ex. P) may be doped in order to reduce its resistance. Incidentally, it is also possible to stack over the gate electrode 106 a high-melting point metal silicide film such as $Wsi_x$, $MoSi_x$, $TiSi_x$ or $TaSi_x$. Alternatively, a metal film such as tungsten (W), molybdenum (Mo), titanium (Ti) or tantalum (Ta) may be formed with a barrier film such as titanium nitride (TiN) or tungsten nitride (WN) being disposed between the gate electrode 106 and the metal film. The cap insulating film 110 can be deposited for example by the CVD method.

Figure 24:
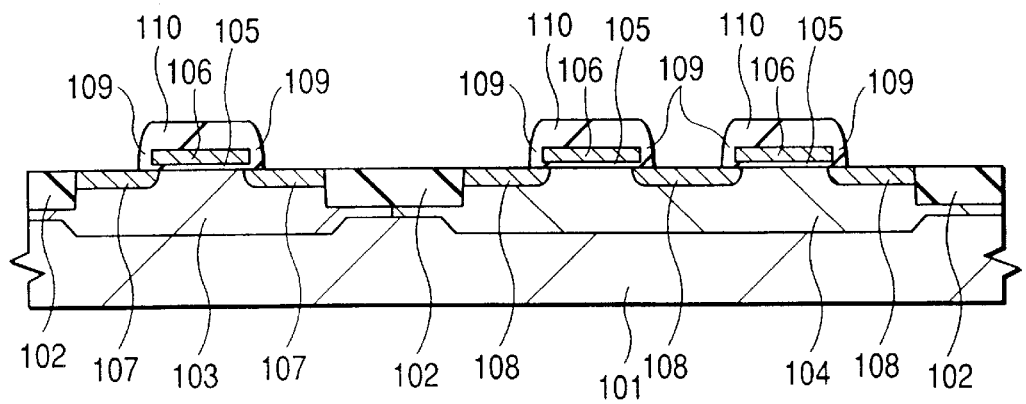
FIG. 24 is a cross-sectional view illustrating a step of the fabrication process of the semiconductor integrated circuit device of the third embodiment in the order of steps.

A photoresist film having an opening at a region where n-channel MISFETQn is to be formed is then patterned. With the photoresist film and the cap insulating film 110 as masks, an n-conductivity type impurity, for example, phosphorus is ion-planted, whereby a semiconductor region 107 is formed in self alignment with the gate electrode 106. After the removal of the photoresist film, another photoresist film having an opening at a region where p-channel MISFETQp is to be formed is patterned. With the photoresist film and cap insulating film 110 as masks, a p-conductivity type impurity, for example, boron is ion-implanted, whereby the semiconductor region 108 is formed in self alignment with the gate electrode 106. Over the semiconductor substrate 101, a silicon oxide film is then deposited by the CVD method. The silicon oxide film is subjected to anisotropic etching by the reactive ion etching (RIB) method, whereby side wall spacers 109 are formed on the side walls of the gate electrode 106 (FIG. 24). Incidentally, it is also possible to ion-implant, to the semiconductor region 107 or semiconductor region 108, an impurity corresponding to its conductivity type with the photoresist film, cap insulating film 110 and side wall spacers 109 being made as masks, thereby forming an impurity semiconductor region having a so-called LDD structure.

At this stage, it is also possible to form a tungsten silicide or cobalt silicide film on the surface of the semiconductor regions 107 and 108, thereby decreasing he sheet resistance of each of the semiconductor regions 107 and 108 and the contact resistance with the plug 113.

Figure 25:
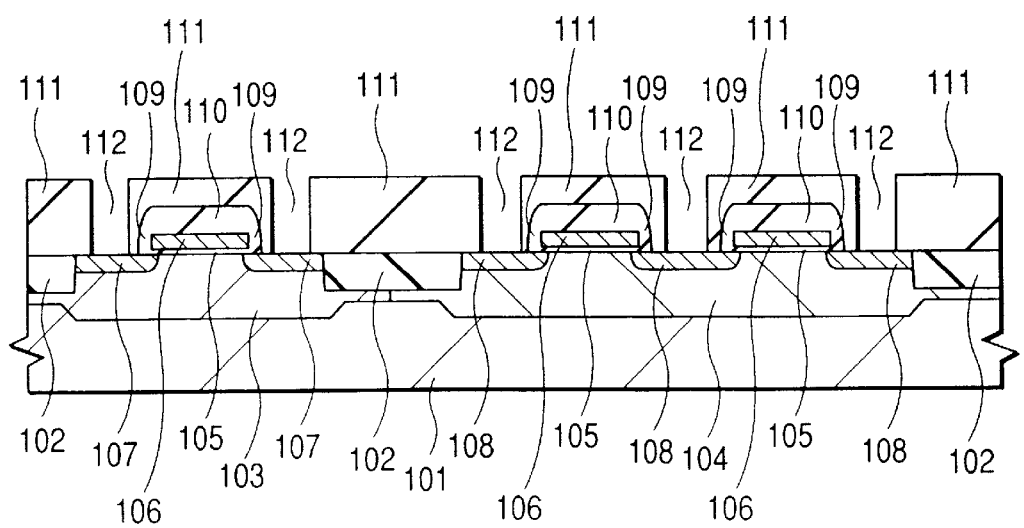
FIG. 25 is a cross-sectional view illustrating a step of the fabrication process of the semiconductor integrated circuit device of the third embodiment in the order of steps.

Over the semiconductor substrate 101, a silicon oxide film is then deposited by the sputtering or CVD method to form an-interlayer insulating film 111. The interlayer insulating film 111 is able to have a surface planarized by polishing through the CMP method. In the interlayer insulating film 111 on the semiconductor regions 107 and 108 on the principal surface of the semiconductor substrate 101, connecting holes 112 are opened by photolithography and etching techniques (FIG. 25).

Figure 26:
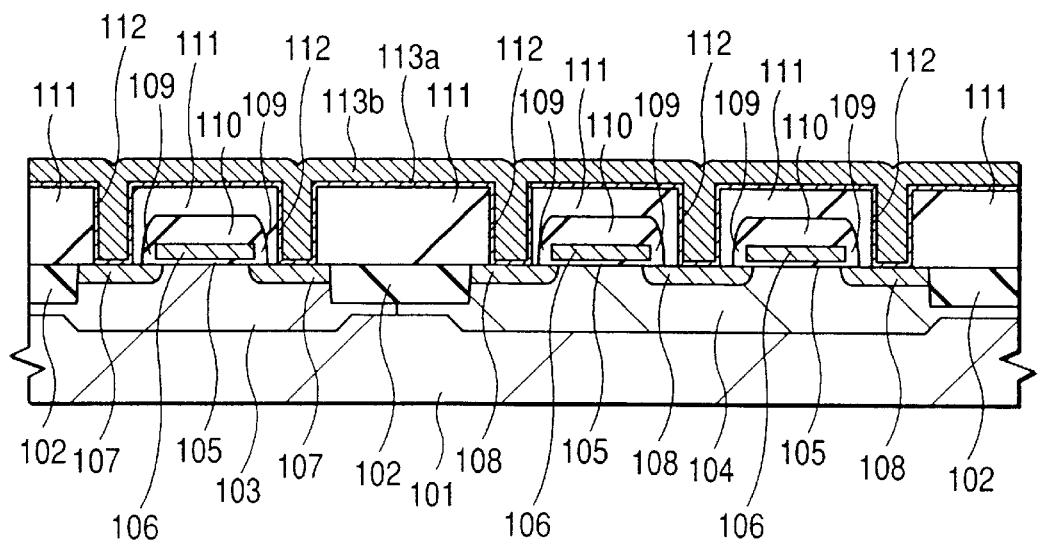
FIG. 26 is a cross-sectional view illustrating a step of the fabrication process of the semiconductor integrated circuit device of the third embodiment in the order of steps.

Then, a tungsten film 113a is deposited by the sputtering method, followed by the deposition of a tungsten film 113b by the blanket CVD method (FIG. 26).

Figure 27:
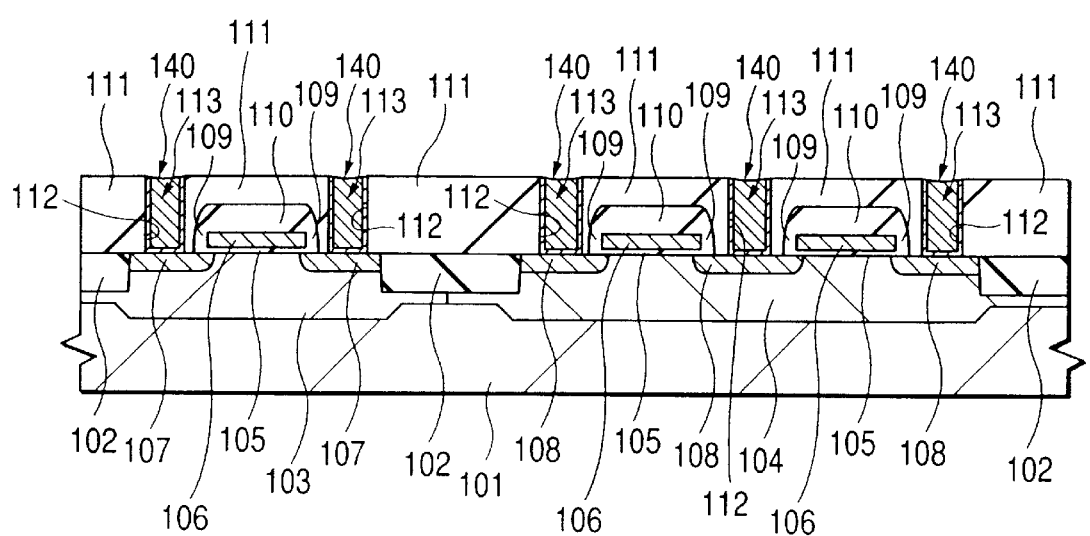
FIG. 27 is a cross-sectional view illustrating a step the fabrication process of the semiconductor integrated circuit device of the third embodiment in the it order of steps.

Portions of the tungsten film 113b and tungsten film 113a in a region over the interlayer insulating film 111 outside the connecting hole are removed by polishing through the CMP method to form a plug 113 (FIG. 27). At this time, on the surface of the plug 113, a concave portion (dishing portion) 140 attributable to a difference in the CMP rate among a silicon oxide film as the interlayer insulating film 111, tungsten film 113b and tungsten film 113a is formed. The etch back method can be used instead of the CMP method.

Figure 28:
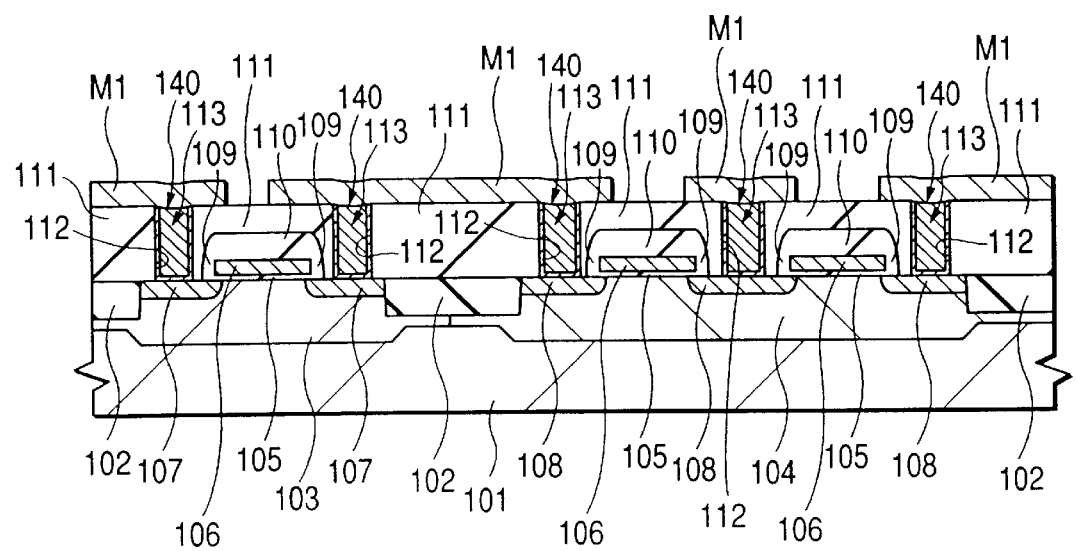
FIG. 28 is a cross-sectional view illustrating a step of the fabrication process of the semiconductor integrated circuit device of the third embodiment in the order of steps.

A tungsten film is then deposited all over the semiconductor substrate 1. The film is patterned by photolithography and etching techniques, whereby a first-layer interconnection M1 is formed (FIG. 28). The concave portion 140 which has appeared in the previous step has an influence on the surface of the tungsten film, but the uneven surface of the tungsten film owing to this concave portion 140 does not exert a large influence on the first-layer interconnection M1 because it is formed by patterning. In short, the first-layer interconnection M1 does not remain owing to the existence of the concave portion 140.

A silicon oxide film is deposited by the sputtering or CVD method, whereby an interconnection interlayer insulating film 114 is formed. Here, the silicon oxide film formed by the sputtering or CVD method is exemplified above, but a coated film such as SOG, an organic film, a fluorine-added CVD silicon oxide film, a silicon nitride film or a multi-layer film having plural kinds of insulating films stacked one after another may be used instead. The surface of the interconnection interlayer insulating film 114 is planarized by the CMP method. Such planarization makes it possible to carry out photolithography with good precision upon processing of a connecting hole 115, which will be described later, and to easily meet the integration heightening tendency of a semiconductor integrated circuit device.

Figure 29:
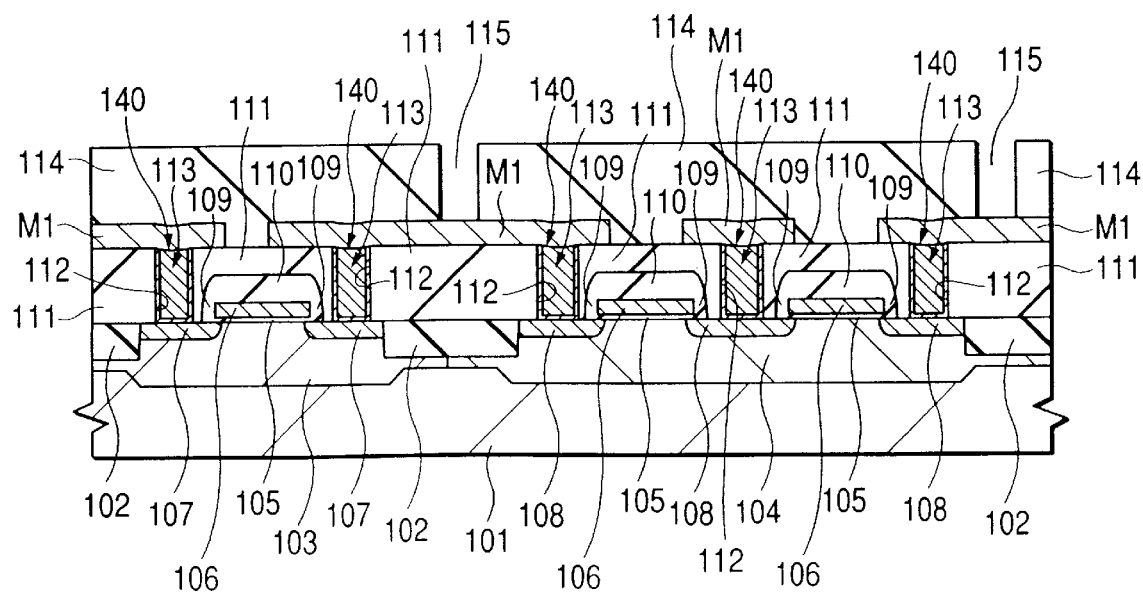
FIG. 29 is a cross-sectional view illustrating a step of the fabrication process of the semiconductor integrated circuit device of the third embodiment in the order of steps.

The connecting hole 115 which reaches the surface of the first interconnection M1 is opened by photolithography and etching techniques (FIG. 29).

Figure 30:
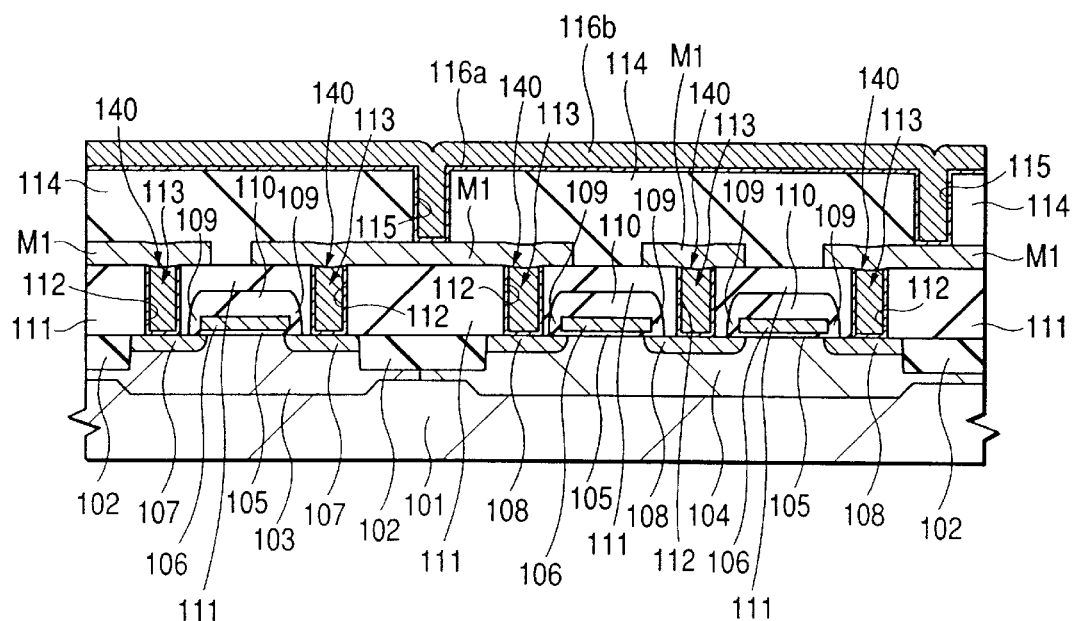
FIG. 30 is a cross-sectional view illustrating a step of the fabrication process of the semiconductor integrated circuit device of the third embodiment in the order of steps.

On the surface of the interconnection interlayer insulating film 114 including the inside surface of the connecting hole 115, a tungsten film 116a is deposited by the sputtering method, followed by deposition of a tungsten film 116b by the blanket CVD method (FIG. 30).

Figure 31:
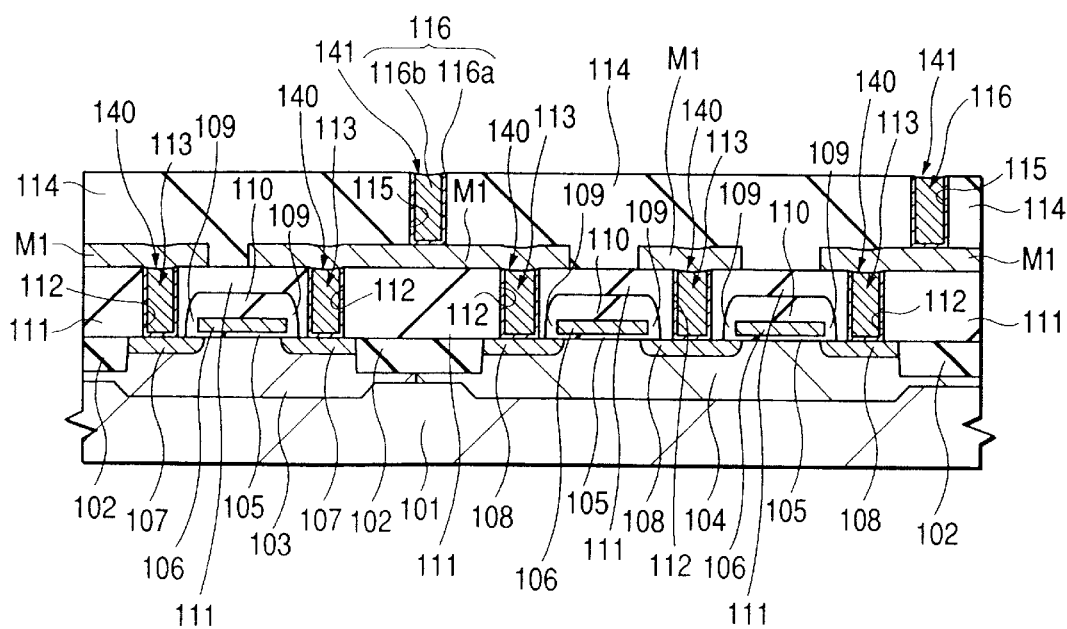
FIG. 31 is a cross-sectional view illustrating a step of the fabrication process of the semiconductor integrated circuit device of the third embodiment in the order of steps.

The portions of the tungsten film 116b and tungsten film 116a on the interconnection interlayer insulating film 114 outside the connecting hole 115 are removed by the CMP method, whereby a plug 116 is formed (FIG. 31). At this time, a concave portion 141 attributable to a difference in the CMP rate among the silicon oxide film as the 13 interconnection interlayer insulating film 114, tungsten film 116b and tungsten film 116a is formed on the surface of the plug 116. Here, the etch back method may be used instead of the CMP method.

Figure 32:
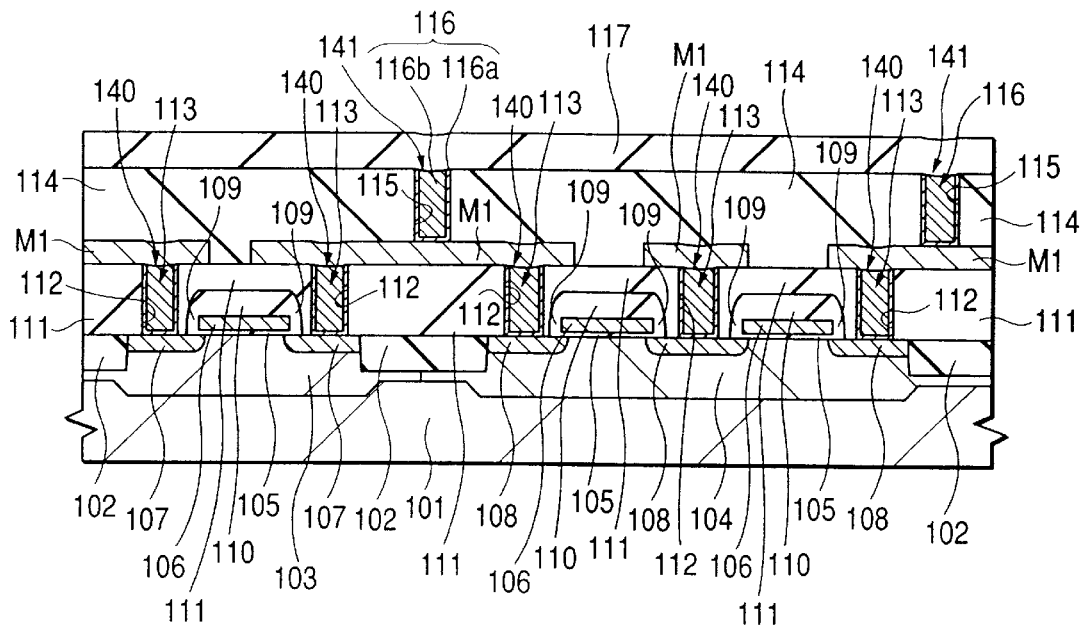
FIG. 32 is a cross-sectional view illustrating a step of the fabrication process of the semiconductor integrated circuit device of the third embodiment in the order of steps.

An interconnection-forming insulating film 117 for the formation of a second-layer interconnection M2 by the CMP method is then deposited (FIG. 32). As the interconnection-forming insulating film 117, a silicon oxide film formed by the CVD or sputtering method can be exemplified. It is formed to a film thickness of 0.5 µm, which is the thickness of the second-layer interconnection M2, or a little thicker. On the surface of the interconnection-forming insulating film 117, a concave portion influenced by the concave portion 141 is formed.

Figure 33:
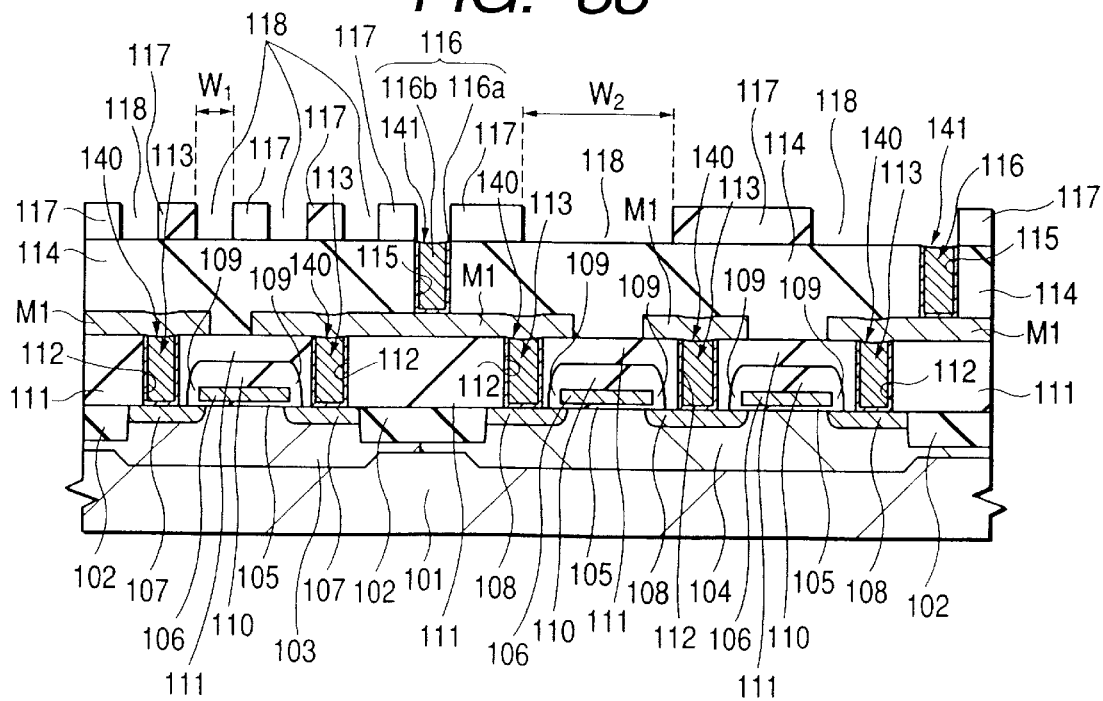
FIG. 33 is a cross-sectional view illustrating a step of the fabrication process of the semiconductor integrated circuit device of the third embodiment in the order of steps.

A photoresist film having an opening at a region where the second-layer interconnection M2 is to be formed is formed and with this photoresist film as a mask, the interconnection-forming insulating film 117 is etched, whereby an interconnection groove 118 is formed in the interconnection-forming insulating film 117 (FIG. 33). At this stage, the above-described concave portion on the surface of the interconnection-forming insulating film 117, said concave portion having been formed, influenced by the concave portion 141, is removed so that it has no influence on the subsequent steps. The width of the interconnection in groove 118 is formed to fall within a range from the minimum width W1 to the maximum width W2 provided that the 44 maximum width W2 is not greater than four times as much as the minimum width W1.

Figure 34:
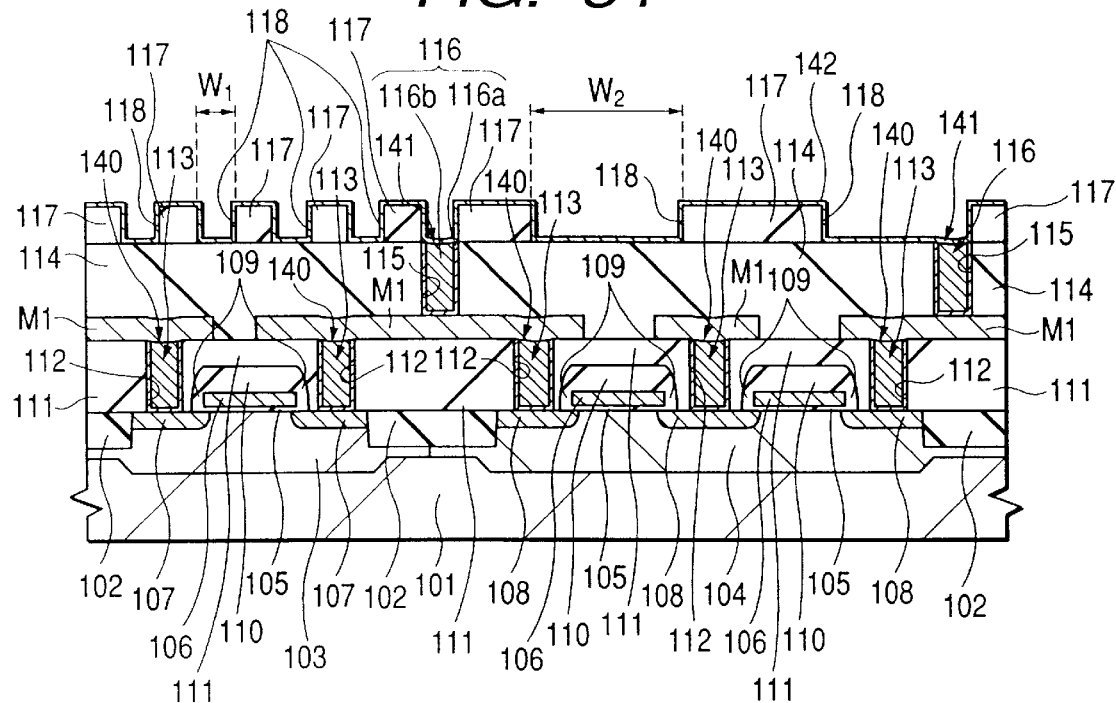
FIG. 34 is a cross-sectional view illustrating a step of the fabrication process of the semiconductor integrated circuit device of the third embodiment in the order of steps.

Then, a titanium nitride film 142 which will be a barrier film 119a is deposited over the surface of the interconnection-forming insulating film 117 including the inside surface of the interconnection groove 118 (FIG. 34). The titanium oxide film 142 can be deposited for example by the CVD or sputtering method. The deposition of the titanium nitride film 142 is carried out in order to improve the adhesion with a copper film, which will be described later, and to prevent the diffusion of copper. Instead of the titanium nitride film, a metal film such as tantalum or a tantalum nitride film may be used. It is also possible to carry out sputter etching of the surface of the titanium nitride film 142 just before the subsequent copper-film deposition step. Such sputter etching permits the removal of water, oxygen molecules or the like adsorbed onto the surface of the titanium nitride film 142, thereby improving the adhesion of the copper film.

Figure 35:
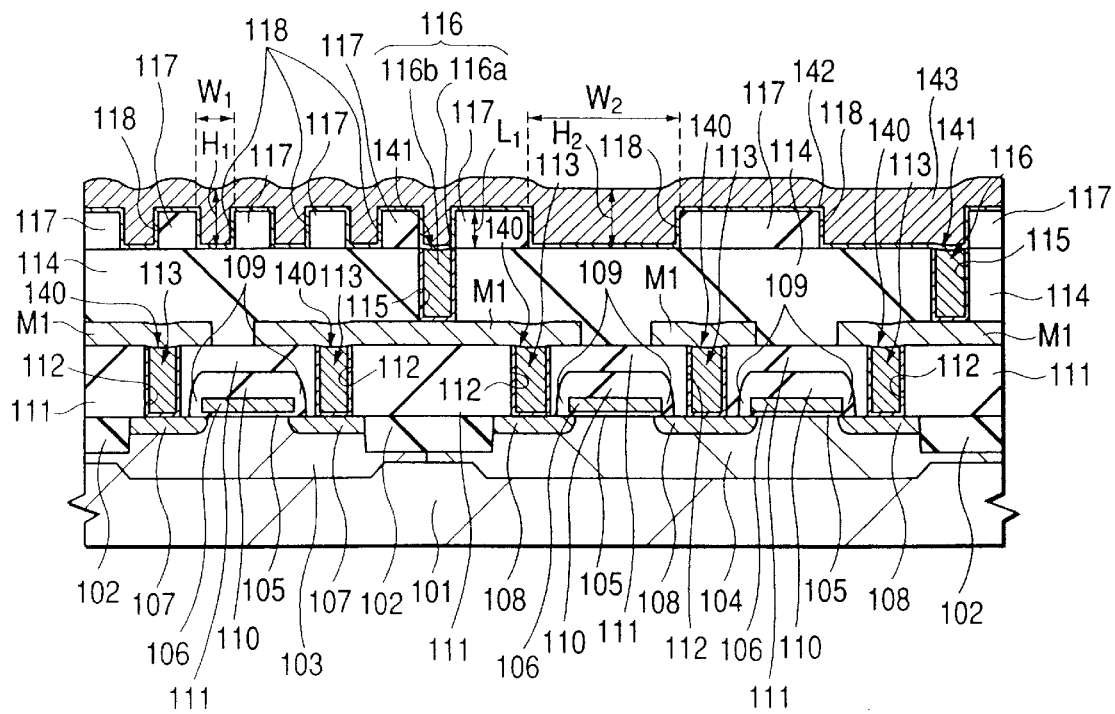
FIG. 35 is a cross-sectional view illustrating a step of the fabrication process of the semiconductor integrated circuit device of the third embodiment in the order of steps.

A metal film to be a main conductive film 119b, for example, a thin copper film is then deposited, followed by thermal treatment for fluidization, whereby a copper film 143 favorably embedded in the interconnection groove 118 is formed (FIG. 35). For the deposition of the copper film 143, an ordinarily-employed sputtering method can be used. The physical vapor deposition method can also be used. Alternatively, deposition may be carried out by the CVD method using an organic metal gas or the like as a raw material gas. As the thermal treatment conditions, temperature and time sufficient for fluidizing the copper film 143 are required. For example, 350° C. to 400° C. for 3 to 5 minutes can be exemplified. The copper film 143 can also be formed using the plating method such as electroplating or electroless plating.

The titanium nitride film 142 and copper film 143, each has a thickness of H1 in the interconnection groove 118 of the minimum width W1 and H2 in the interconnection groove 118 of the maximum width W2. Here, the thickness H1 and H2 are substantially same and they are larger than the depth L1 of the interconnection groove 118. In other words, the copper film 143 is completely embedded in each of the interconnection grooves 118 of the minimum width W1 and the maximum width W2. This makes it possible to form the second interconnection M2 in almost all the interconnection grooves 118, thereby reducing the resistance of the second-layer interconnection M2.

Figure 36:
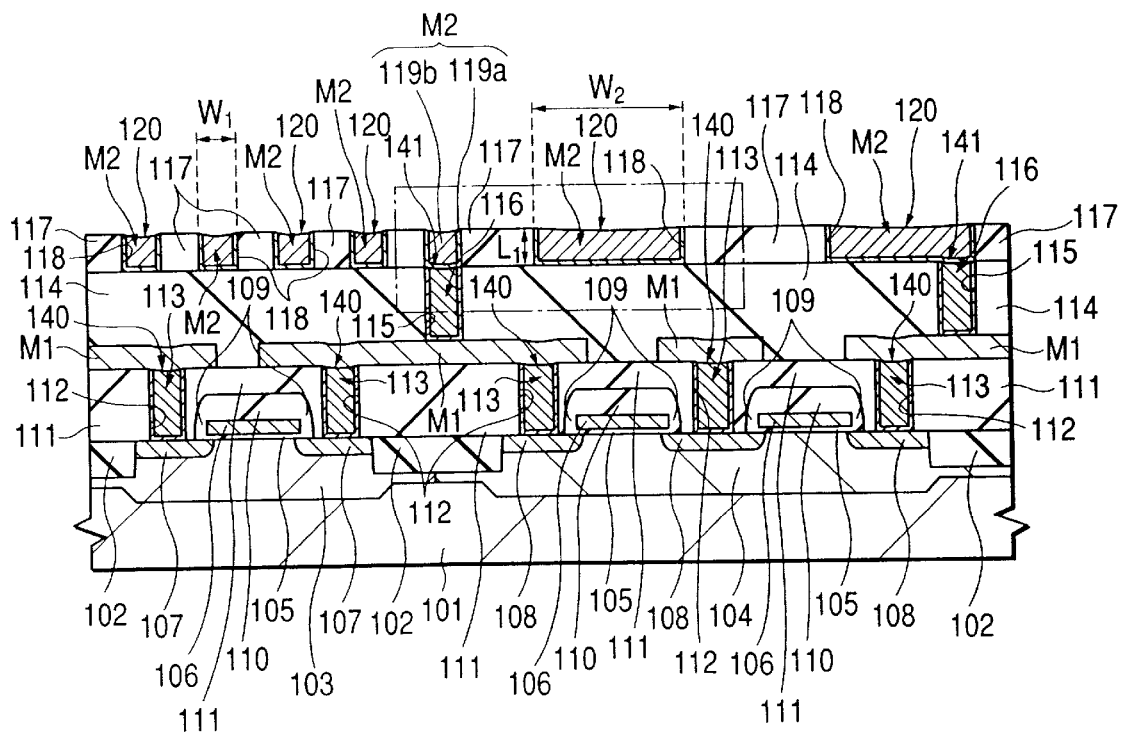
FIG. 36 is a cross-sectional view illustrating a step of the fabrication process of the semiconductor integrated circuit device of the third embodiment in the order of steps.
Figure 37:
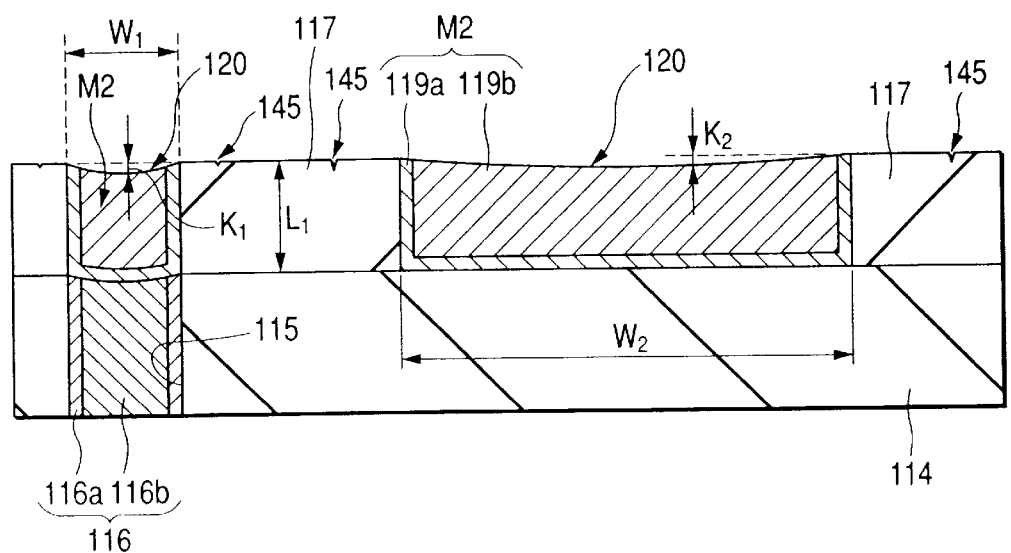
FIG. 37 is an enlarged view of a part of FIG. 36 surrounded by the dashed line.

Then, the unnecessary portions of the copper film 143 and titanium nitride film 142 over the interconnection-forming insulating film 117 are removed, whereby a main conductive film 119b and a barrier film 119a which constitute the second-layer interconnection M2 are formed (FIG. 36). For the removal of the copper film 143 and the titanium nitride film 142, the CMP method is employed. Since the CMP method is used for the formation of the second-layer interconnection M2, a dishing 120 which is a portion indented from the surface of the interconnection-forming insulting film 117 is formed on the surface of the second-layer interconnection M2. FIG. 37 is an enlarged view of the portion surrounded by a dashed line of FIG. 36. As illustrated in FIG. 37, a scratch 145 made by the polishing agent in CMP appears on the surface of the interconnection-forming insulating film 117.

The dishing amount K1 of a dishing 120 in the interconnection groove 118 of the minimum width W1 and the dishing amount K2 of another dishing 120 in the interconnection groove 118 of the maximum width W2 are substantially same.

Figure 38:
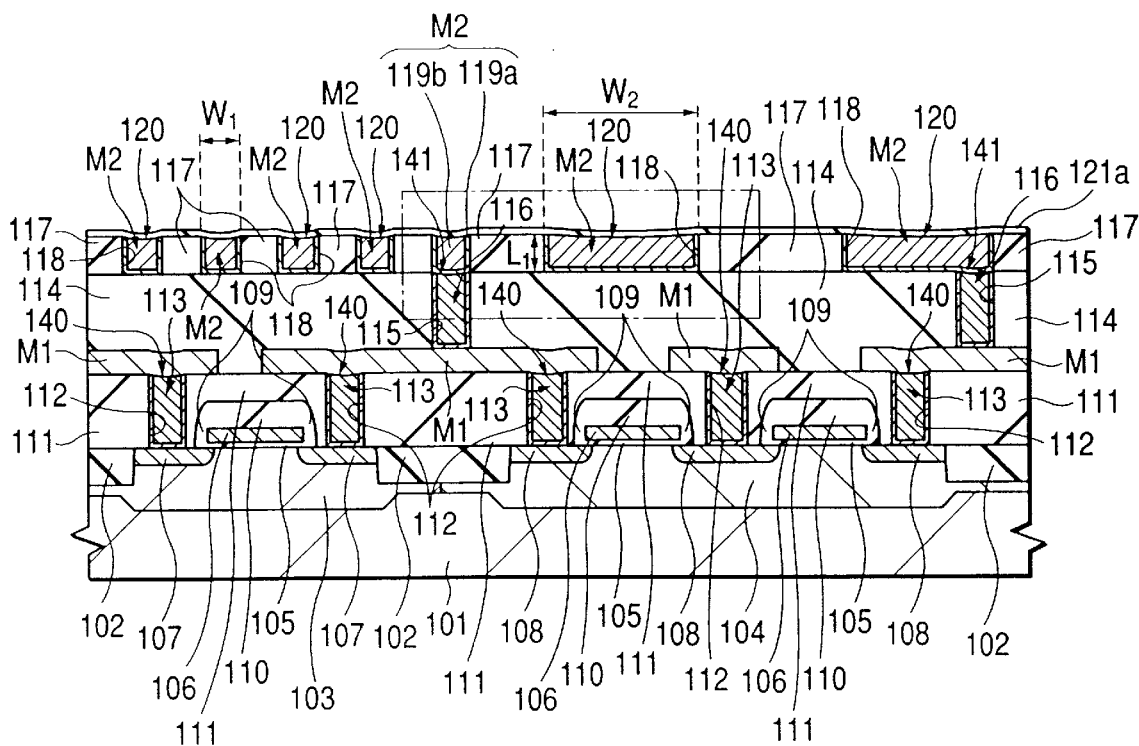
FIG. 38 is a cross-sectional view illustrating a step of the fabrication process of the semiconductor integrated circuit device of the third embodiment in the order of steps.
Figure 39:
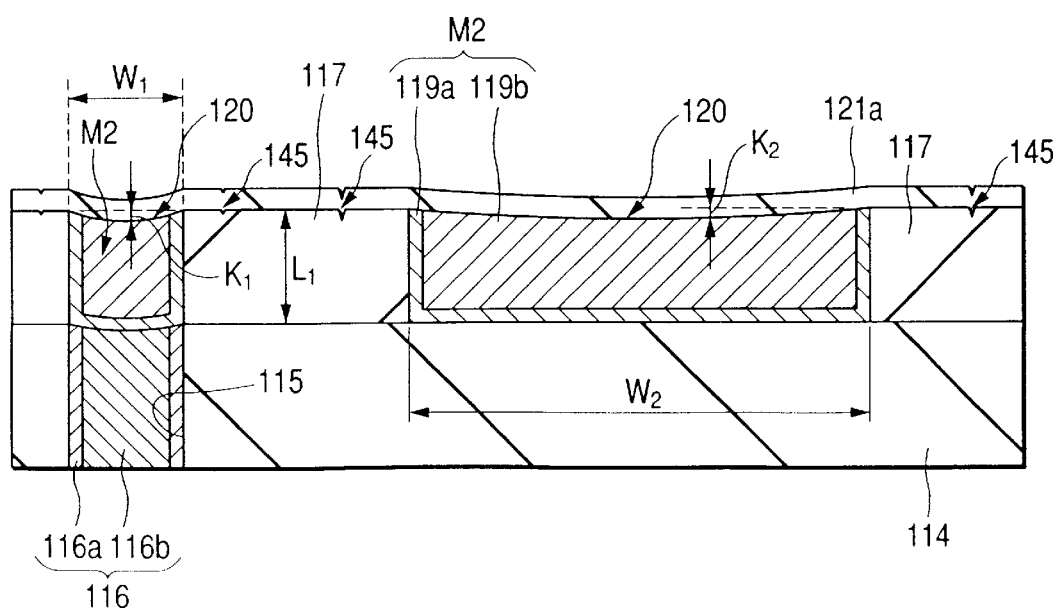
FIG. 39 is an enlarged view of a part of FIG. 38 surrounded by the dashed line.

A silicon nitride film is then deposited over the second-layer interconnection M2 and the interconnection-forming insulating film 117 to form a blocking film 121a (FIG. 38). For the deposition of the silicon nitride film, the plasma CVD method or the like can be used. The film is formed to a thickness of about 100 nm. Owing to excellent step covering property of the silicon nitride film formed by the CVD method, there exists unevenness attributable to the dishing 120 and scratch 145 on the surface of the blocking film 121a at this stage as illustrated in FIG. 39. Incidentally, FIG. 39 is an enlarged view of a portion surrounded by a dashed line of FIG. 38.

Figure 40:
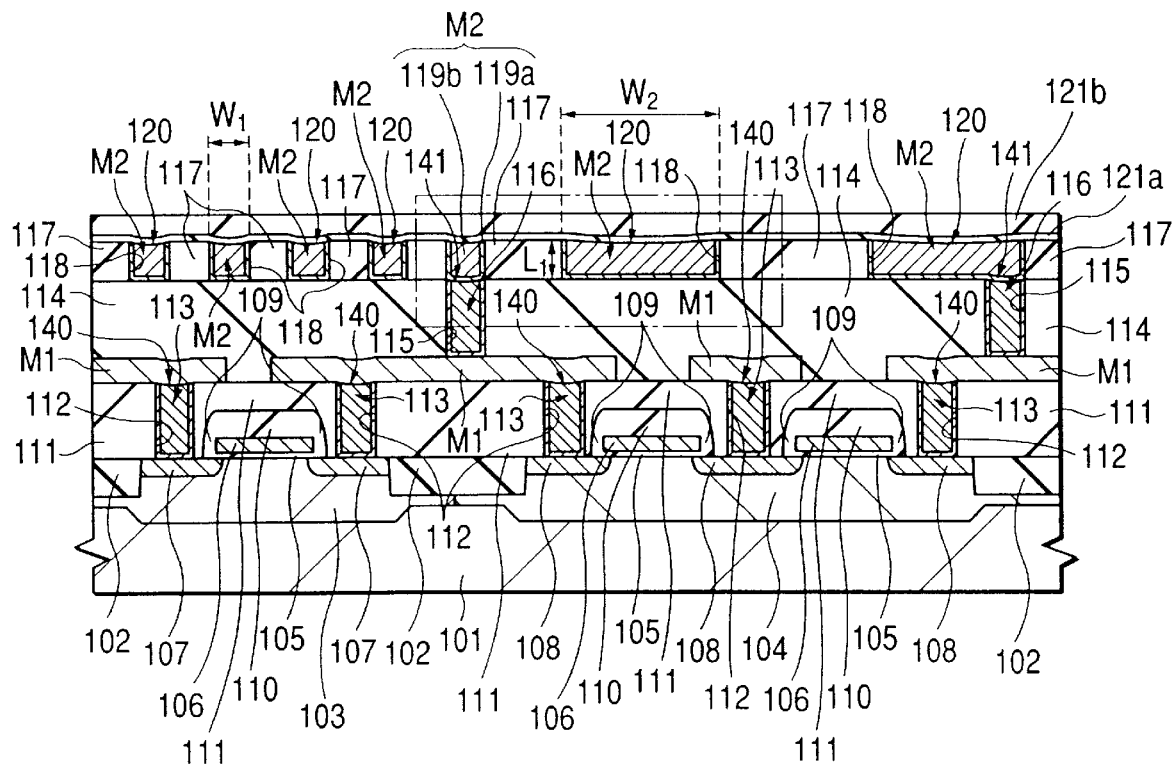
FIG. 40 is a cross-sectional view illustrating a step the fabrication process of the semiconductor integrated circuit device of the third embodiment in the order of steps.
Figure 41:
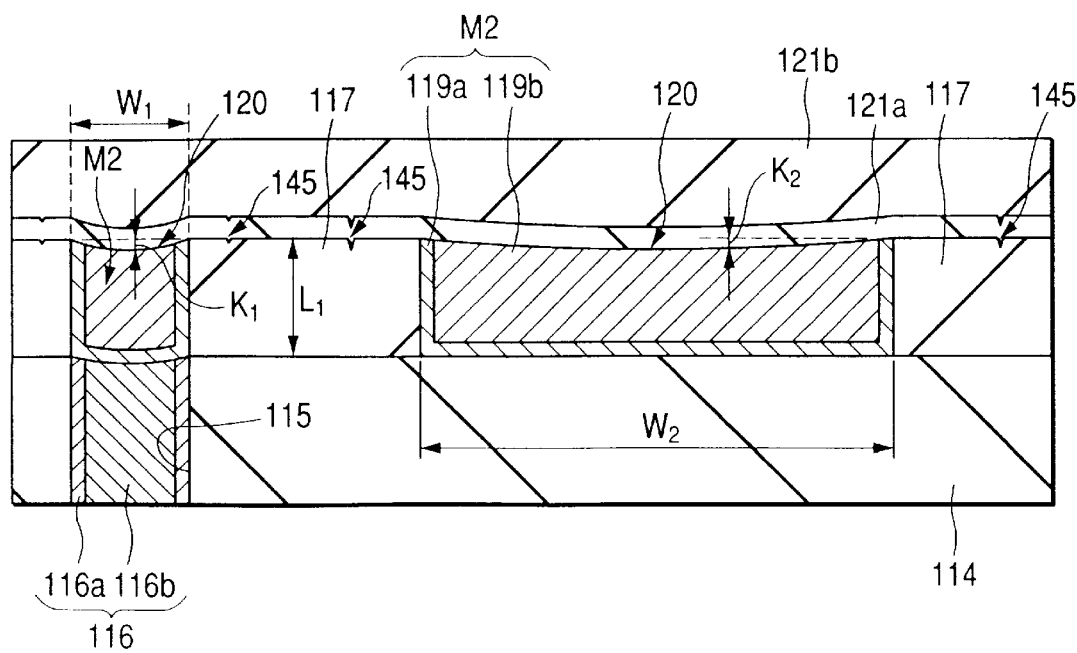
FIG. 41 is an enlarged view of a part of FIG. 40 surrounded by the dashed line.

Then, the blocking film 121a is coated with an SOG film having self fluidity, followed by thermal treatment at about 400° C. for curing, whereby a planarizing film 121b is formed (FIG. 40). As the SOG film, an organic or inorganic SOG film can be used. A polysilazane SOG film can also be used. The polysilazane SOG film has heat resistance and is able to bring about an improvement in the reliability of a semiconductor integrated circuit. FIG. 41 is an enlarged view of a portion surrounded by a dashed line of FIG. 40. As illustrated in FIG. 41, owing to the use of an SOG film having self fluidity as the planarizing film 121b, the surface is planarized and influences of the dishing 120 and scratch 145 can be eliminated.

Figure 42:
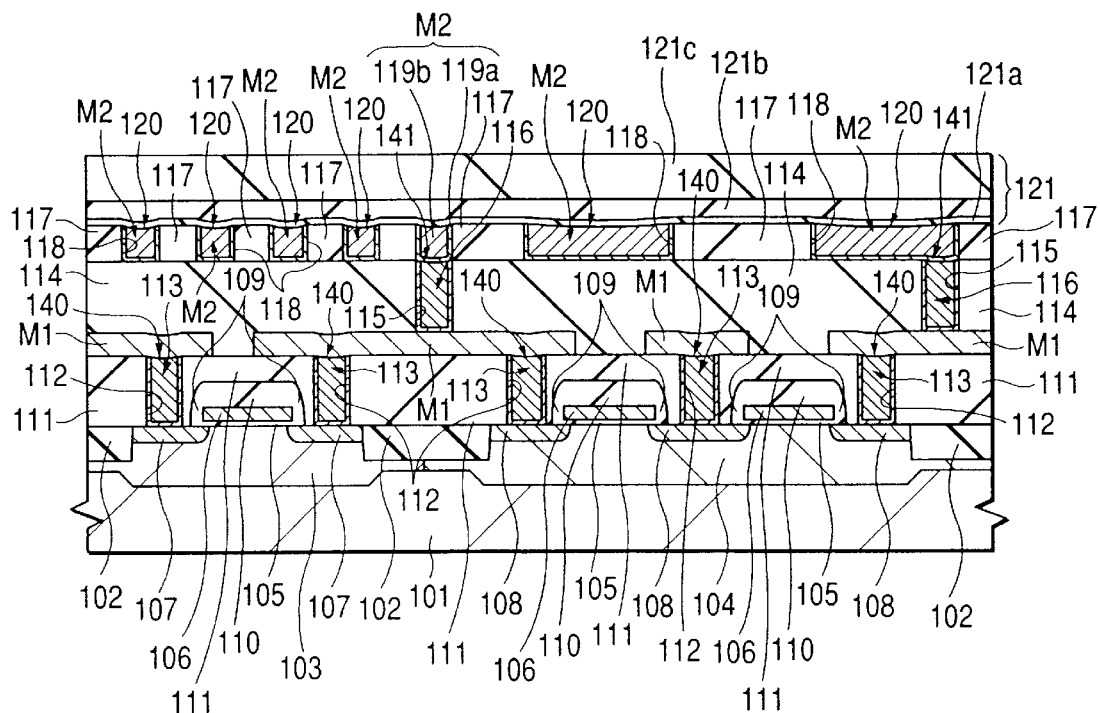
FIG. 42 is a cross-sectional view illustrating a step of the fabrication process of the semiconductor integrated circuit device of the third embodiment in the order of steps.

An insulating film 121c is then deposited, whereby an interconnection interlayer insulating film 121 is completed (FIG. 42). As the insulating film 121c, a silicon oxide film made for example by the CVD method can be used. The surface of the insulating film 121c, that is, the surface of the interconnection interlayer insulating film 121 is kept flat by the existence of the planarizing film 121b, whereby a conductive residue attributable to the dishing 120 or scratch 145 is not formed upon the formation of a conductive member such as a plug 123 which will be formed in the subsequent step and an insulating property between upper third-layer interconnections M3 can be secured. The surface of the interconnection interlayer insulating film 121 has been planarized so that the margin of photolithography is improved, which makes it possible to meet the miniaturization tendency of the semiconductor integrated circuit device.

Figure 43:
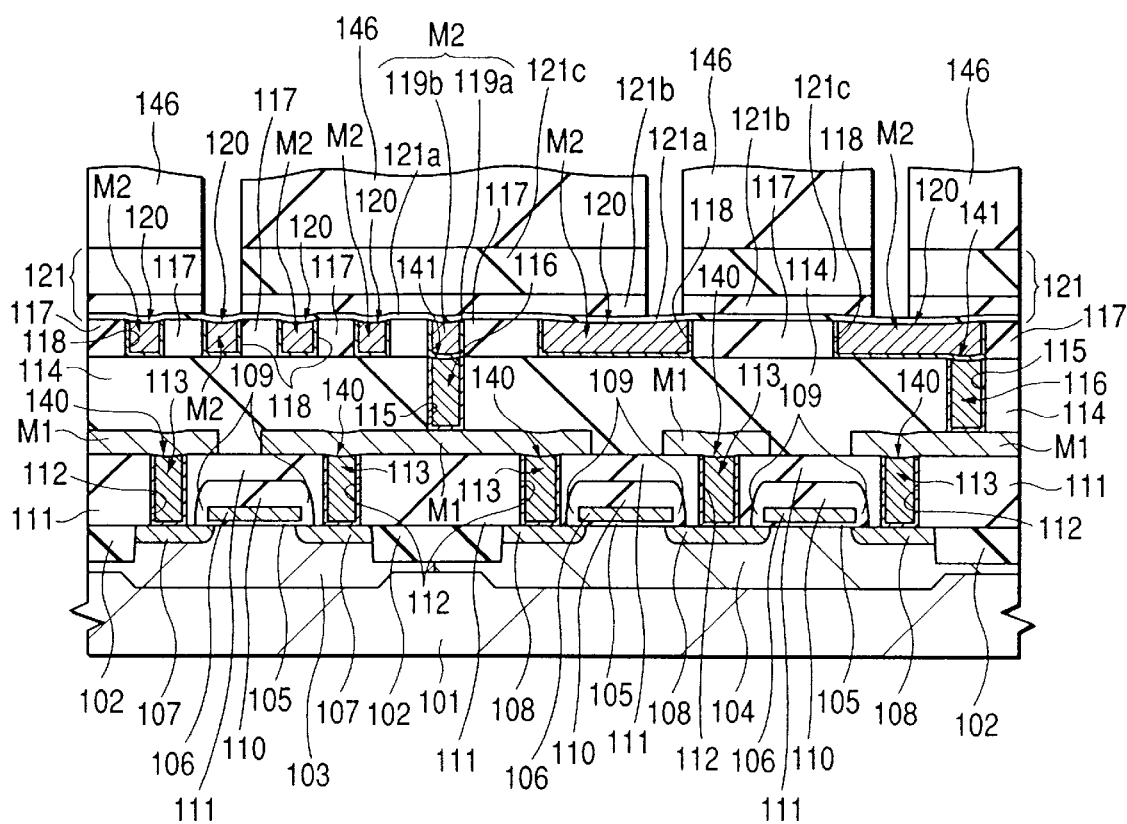
FIG. 43 is a cross-sectional view illustrating a step of the fabrication process of the semiconductor integrated circuit device of the third embodiment in the order of steps.

A photoresist film 146 having an opening at a region where a connecting hole 122 is to be formed is then patterned. With this photoresist film 146 as a mask, the insulating film 121c and planarizing film 121b are etched (FIG. 43). This etching is carried out under the condition that the etching rate of the silicon oxide film will become larger than that of the silicon nitride film. The blocking film 121a made of the silicon oxide film can be used as a stopper film of the etching.

Figure 44:
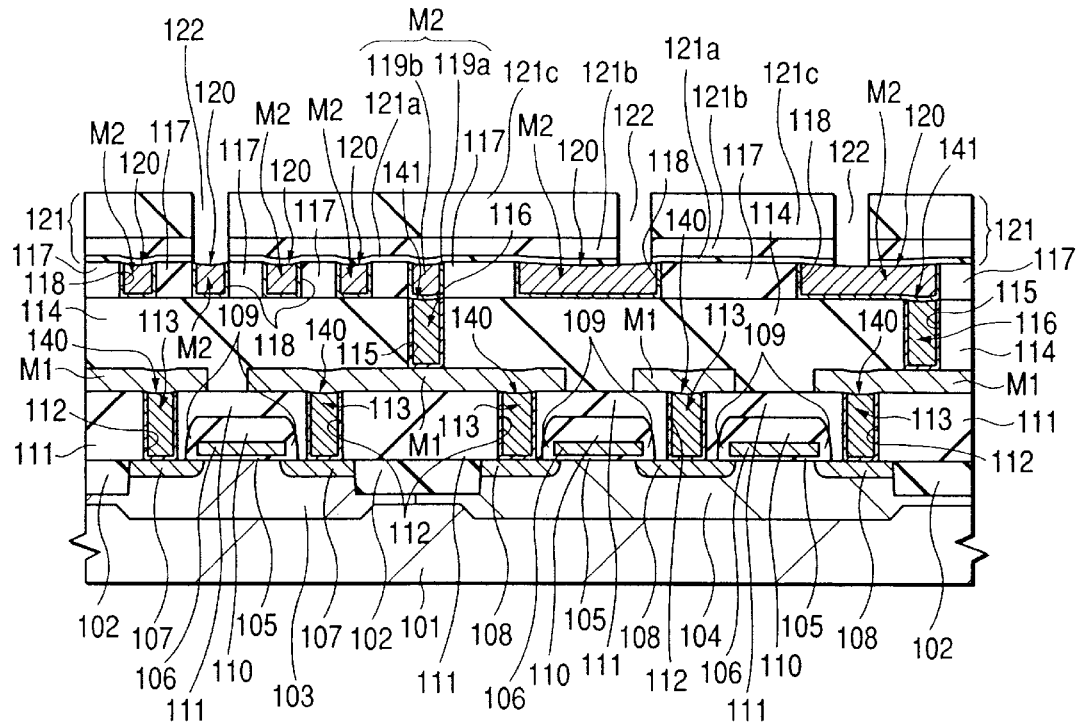
FIG. 44 is a cross-sectional view illustrating a step of the fabrication process of the semiconductor integrated circuit device of the third embodiment in the order of steps.

Under the etching condition changed that the etching rate of the silicon nitride film will become larger than that of the silicon oxide film, the blocking film 121a is etched, whereby the formation of the connecting hole 122 is completed (FIG. 44). Such two-step etching of the connecting hole 122 prevents excessive etching of the second-layer interconnection M2 even when over-etching is conducted sufficiently upon etching of the blocking film 121a, because the blocking film 121a is thin. As a result, the connecting hole 122 can be opened without failure and damage to the second-layer interconnection M2 can be reduced to the minimum.

Upon removal of the photoresist film 146, an ashing method using oxygen or ozone is generally employed. When inorganic SOG is used for the planarizing film 121b, damage to the cross-section of the planarizing film 121b on the side surface portions of the connecting hole 122 can be suppressed. Described specifically, if organic SOG is used for the planarizing film 121b, an Si—CH, bond in the organic SOG is converted to a Si—OH bond or Si—O bond upon ozone ashing, which heightens water absorption or causes film shrinkage of the converted portion, which is expected to bring about lowering of the reliability and yield of the semiconductor integrated circuit device. The use of the organic SOG is therefore not preferred. when the organic SOG is adopted, it becomes necessary to use a method which is not so familiar with compared as ashing, for example, peeling of the photoresist film 146 by wet process, reactive ion etching (RIE) using low-pressure oxygen plasma or the like. The use of inorganic SOG for the planarizing film 121b, on the other hand, does not cause such inconvenience.

Just before the subsequent plug (123) formation step, the surface of the second-layer interconnection M2 on the bottom of the connecting hole 122 can be subjected to reduction treatment by annealing at 350° C. for about 5 minutes in a hydrogen atmosphere. Furthermore, sputter etching can be given to the bottom of the connecting hole 122. By such treatment, copper oxide which has appeared on the bottom of the connecting hole 122 as a result of ashing upon removal of the photoresist film 146 or allowing the connecting hole to stand in the atmospheric environment can be removed, whereby resistance of the electric connection between the second-layer interconnection M2 and plug 123 can be reduced or the connection reliability can be improved.

Figure 45:
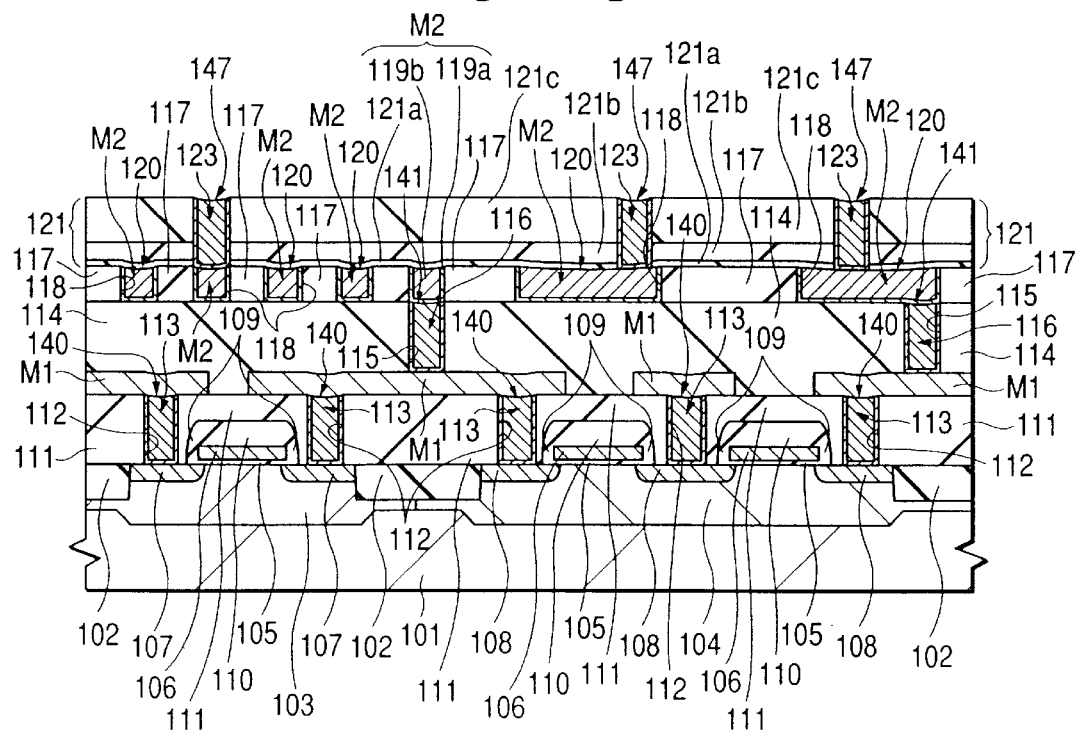
FIG. 45 is a cross-sectional view illustrating a step the fabrication process of the semiconductor integrated circuit device of the third embodiment in the order of steps.

The plug 123 is then formed in a similar manner to the above-described formation method of the plug 116 (FIG. 45). As described above, the CMP method is employed upon the formation of the plug 123. A conductive residue does not remain on the surface of the interconnection interlayer insulating film 121 because the interconnection insulating film 121 has a planarized surface. Both the insulation property between plugs 123 and that of the third-layer interconnections M3 formed on the interconnection interlayer insulating film 121 can be maintained. Incidentally, a concave portion 147 is formed on the surface of the plug 123 as a result of the polishing by the CMP method.

Figure 46:
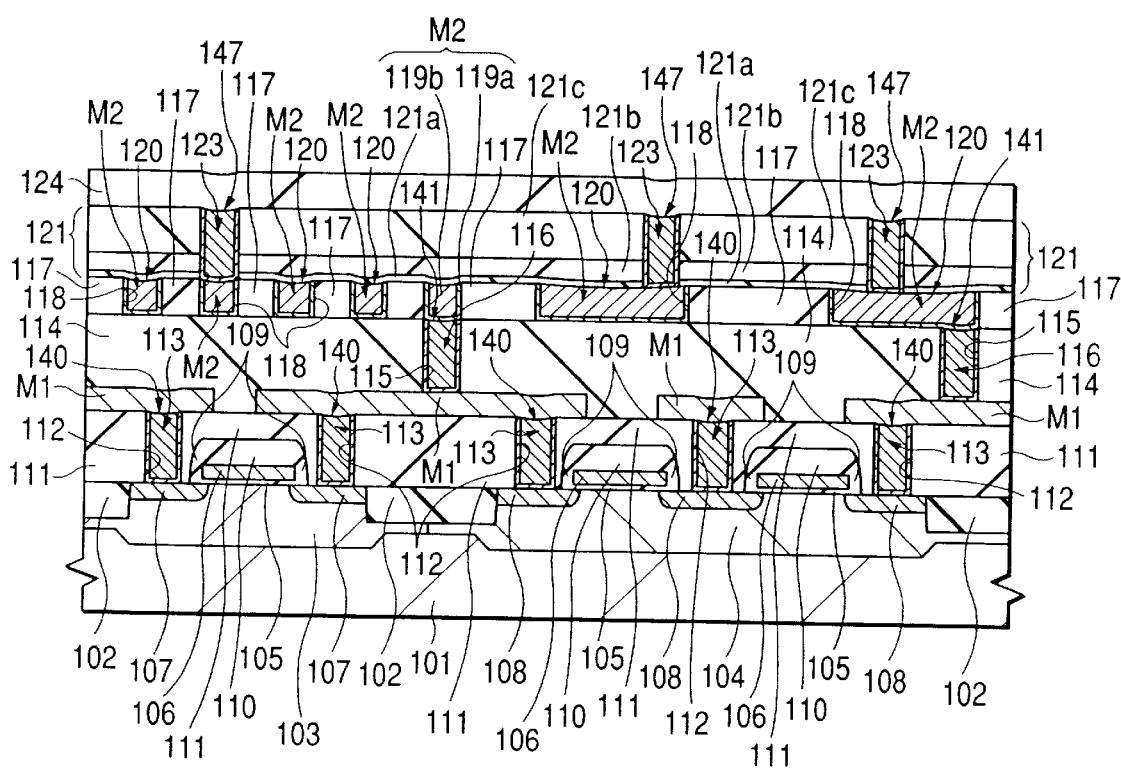
FIG. 46 is a cross-sectional view illustrating a step of the fabrication process of the semiconductor integrated circuit device of the third embodiment in the order of steps.

Over the interconnection interlayer insulating film 121 and plug 123, an interconnection-forming insulating film 124 for the formation of the third-layer interconnection M3 is formed (FIG. 46). The interconnection-forming insulating film 124 can be formed in a similar manner to that of the interconnection-forming insulating film 117. On the surface of the interconnection-forming insulating film 124, a concave portion attributable to the concave portion 147 is formed.

Figure 47:
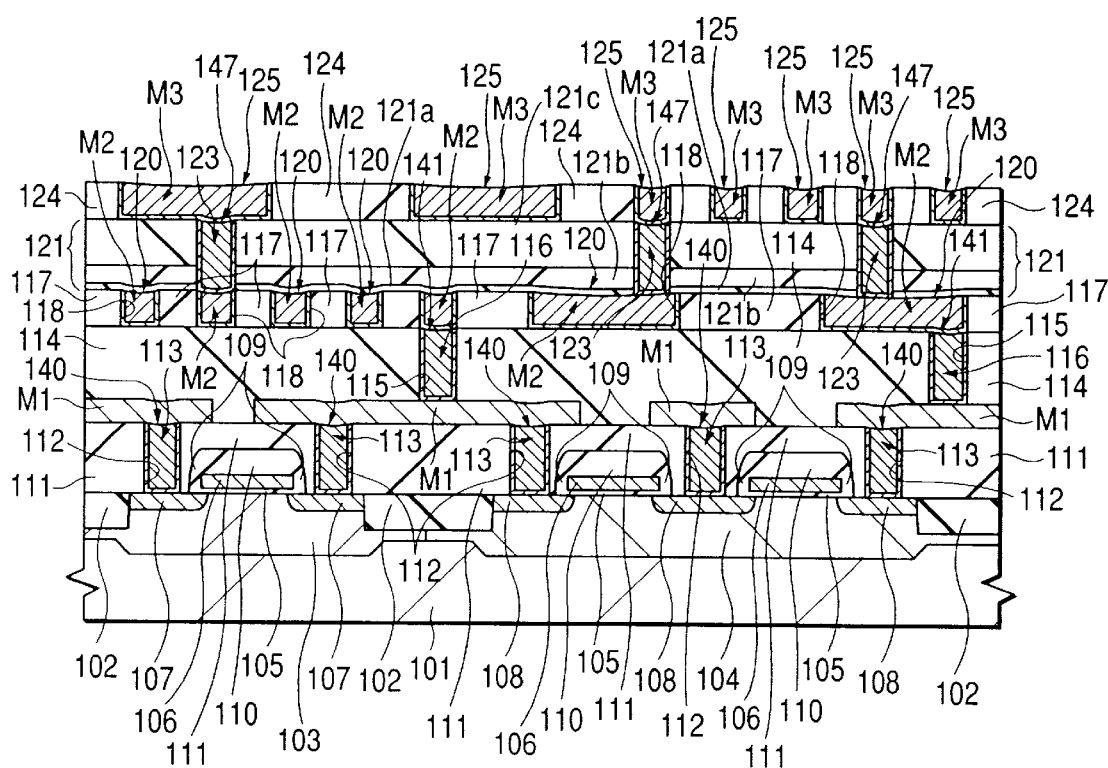
FIG. 47 is a cross-sectional view illustrating a step of the fabrication process of the semiconductor integrated circuit device of the third embodiment in the order of steps.

Then, the third-layer interconnection M3 made of a barrier film and a copper film is formed in a similar manner to the second-layer interconnection M2 (FIG. 47). Upon formation of the third-layer interconnection M3, no conductive residue remains in spite of the fact that the concave portion exists on the surface of the interconnection-forming insulating film 124 attributable to the concave portion 147, which is similar to the case of the second-layer interconnection M2. This is because the above-described concave portion is etched and removed upon processing of a shallow groove for the formation of the third-layer interconnection M3. Incidentally, on the surface of the third-layer interconnection M3, a concave portion 125 is formed as a result of the CMP method.

Figure 48:
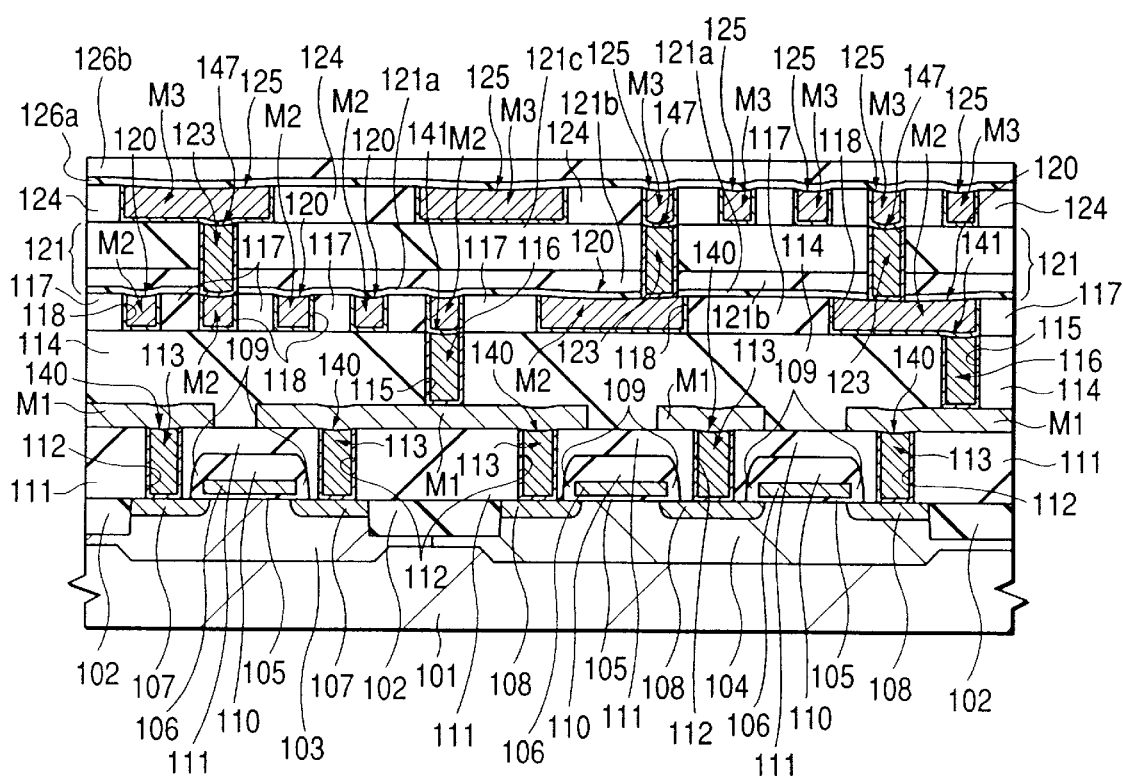
FIG. 48 is a cross-sectional view illustrating a step the fabrication process of the semiconductor integrated circuit device of the third embodiment in the order of steps.

Next, a blocking film 126a and a planarizing film 126b which constitute an interconnection interlayer insulating film 126 for insulating the third-layer interconnection M3 and the fourth-layer interconnection M4 are formed over the surfaces of the interconnection-forming insulating film 124 and third-layer interconnection M3 (FIG. 48). The blocking film 126a and the planarizing film 126b can be formed in a similar manner to the blocking film 121a and the In planarizing film 121b. The formation of the planarizing film 121b makes it possible to remove the influence of the concave portion 125, thereby planarizing the surface.

Figure 49:
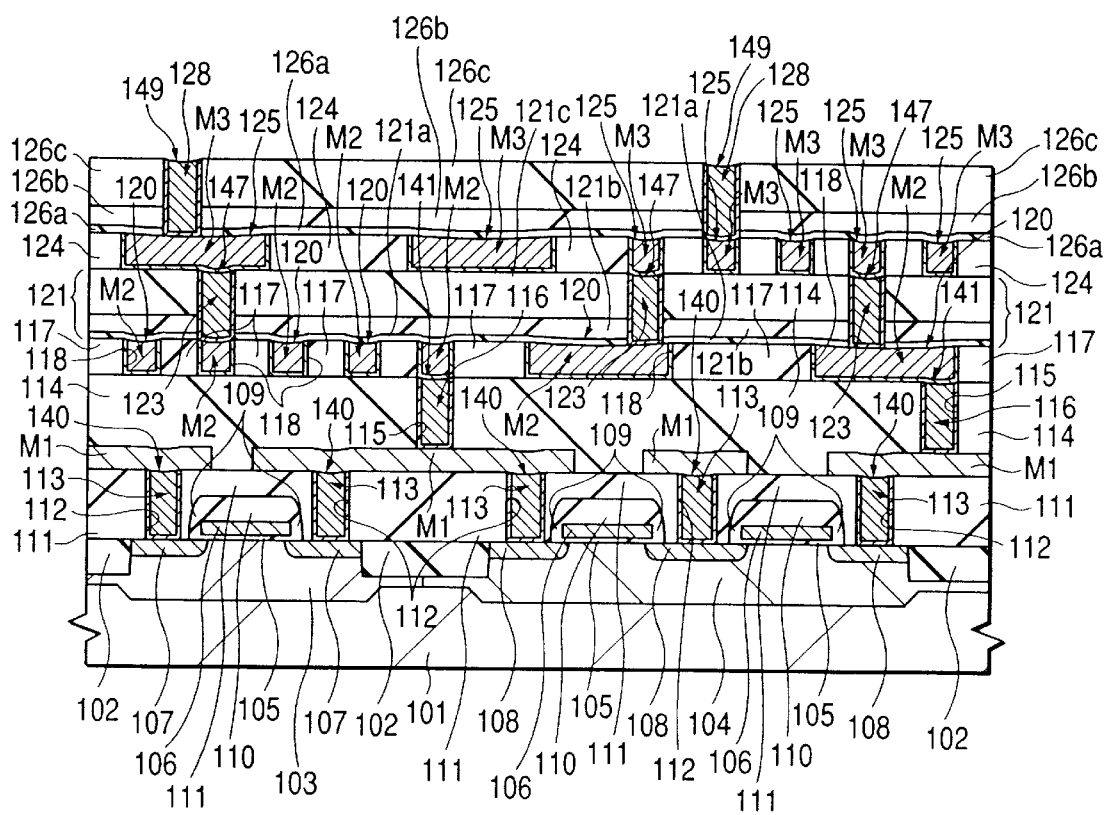
FIG. 49 is a cross-sectional view illustrating a step of the fabrication process of the semiconductor integrated circuit device of the third embodiment in the order of steps.

An insulating film 126c which is also a component film of the interconnection interlayer insulating film 126 is deposited, whereby the formation of the interconnection interlayer insulating film 126 is completed. The surface of the interconnection interlayer insulating film 126 has been planarized owing to the existence of the planarizing film 121b. A plug 128 is then formed in a similar manner to the plug 116 (FIG. 49). As described above, the CMP method is employed for the formation of the plug 128. Since the surface of the interconnection interlayer insulating film 126 has been planarized, no conductive residue remains on the surface of the interconnection interlayer insulating film 126, whereby the insulating properties between the plugs 128 and those between the fourth-layer interconnections M4 formed over the interconnection interlayer insulating film 16 can be maintained. On the surface of the plug 128, a concave portion 149 is formed as a result of the polishing by the CMP method. Similar to the case of the third-layer interconnection, the concave portion 149 does not induce the formation of a conductive residue in the subsequent step.

Figure 50:
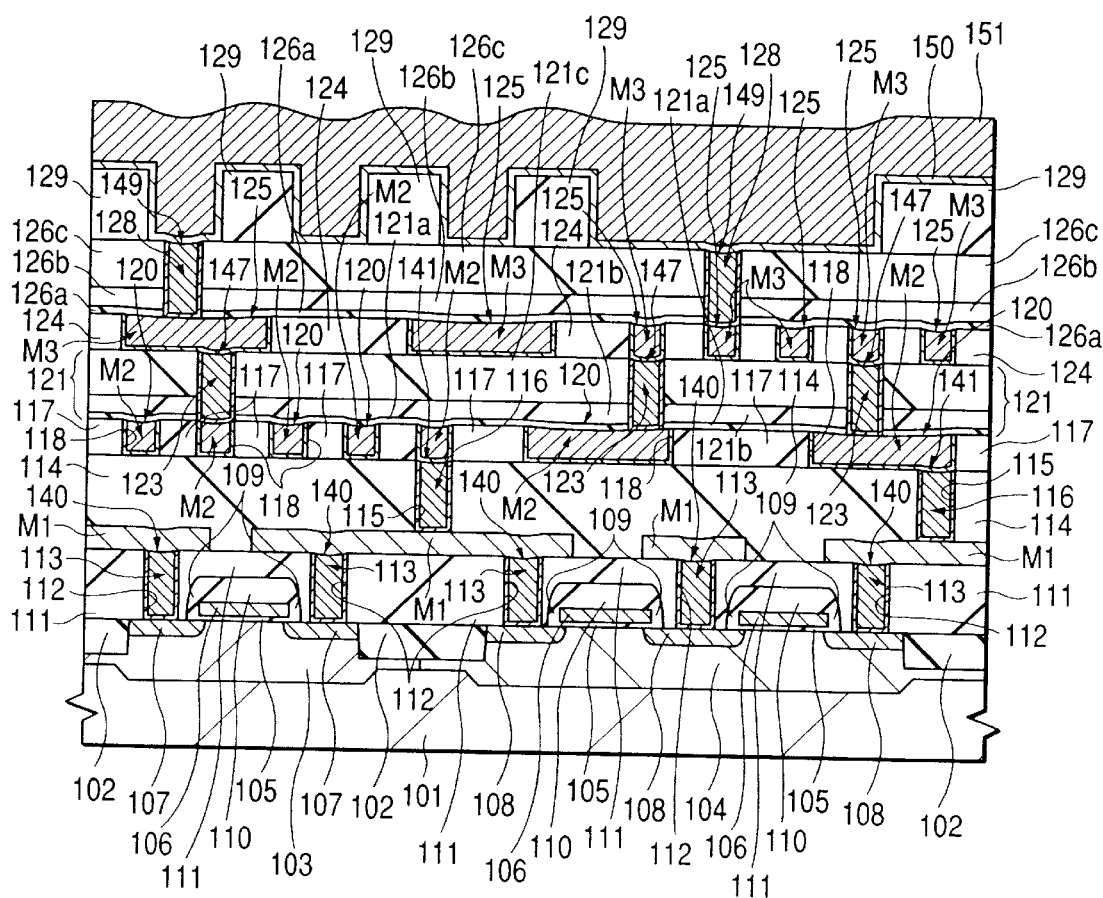
FIG. 50 is a cross-sectional view illustrating a step of the fabrication process of the semiconductor integrated circuit device of the third embodiment in the order of steps.

An interconnection-forming insulating film 129 for the formation of the fourth-layer interconnection M4 is then laid over the interconnection interlayer insulating film 126 and plug 128. The interconnection-forming insulating film 129 can be formed in a similar manner to the interconnection-forming insulating film 117. As the fourth-layer interconnection M4 becomes thicker, the interconnection-forming insulating film 129 is formed thicker than the interconnection-forming insulating film 117, for example, 1 μm or a little thicker. As in the cases of the second-layer interconnection M2 and the third-layer interconnection M3, an interconnection groove is formed, followed by the deposition of a titanium nitride film 150 and copper film 151 (FIG. 50). The titanium nitride film 150 and copper film 151 can be formed as in the cases of the second-layer interconnection M2 and the third-layer interconnection M3.

Figure 51:
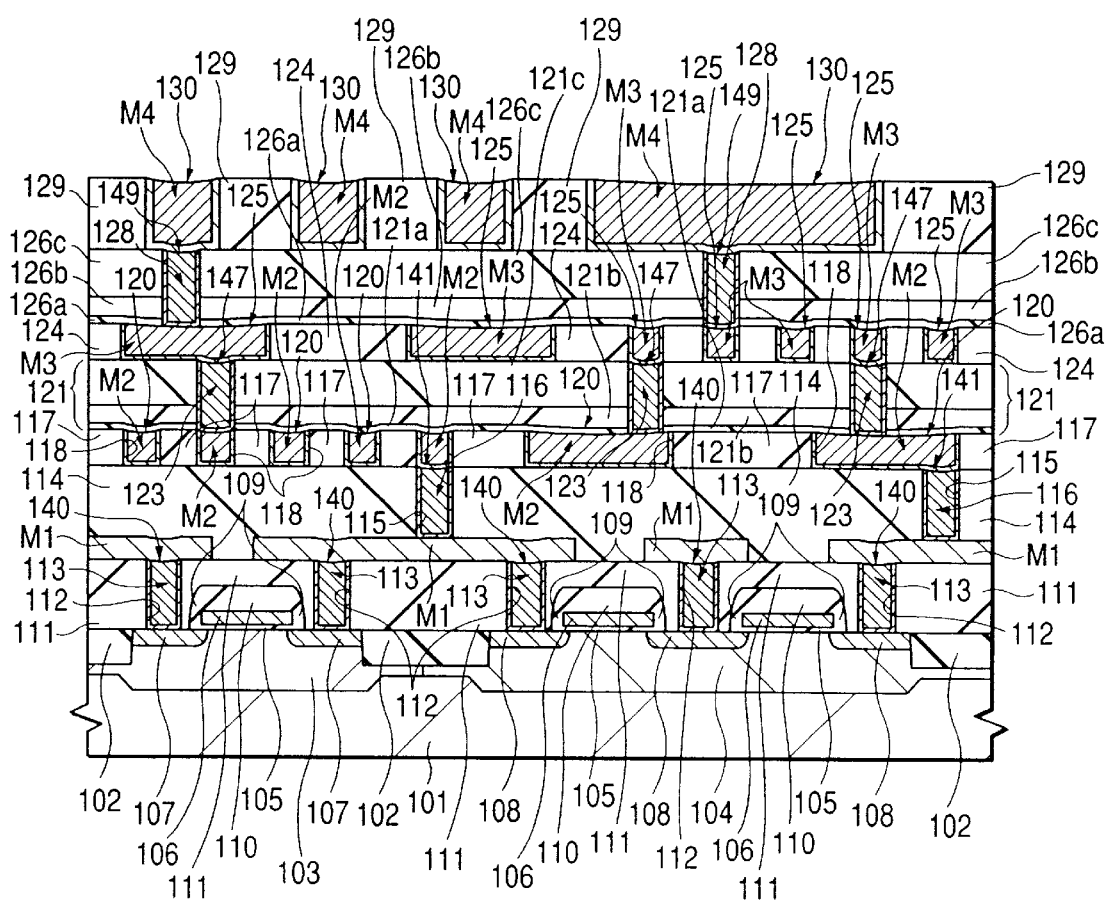
FIG. 51 is a cross-sectional view illustrating a step the fabrication process of the semiconductor integrated circuit device of the third embodiment in the order of steps.

The titanium nitride film 150 and copper film 151 are polished by the CMP method to remove the unnecessary portions of them on the surface of the interconnection-forming insulating film 129 are removed, whereby the fourth-layer interconnection M4 is formed (FIG. 51). Incidentally, a concave portion 130 appears on the surface of the fourth-layer interconnection M4 as a result of the polishing by the CMP method.

Figure 52:
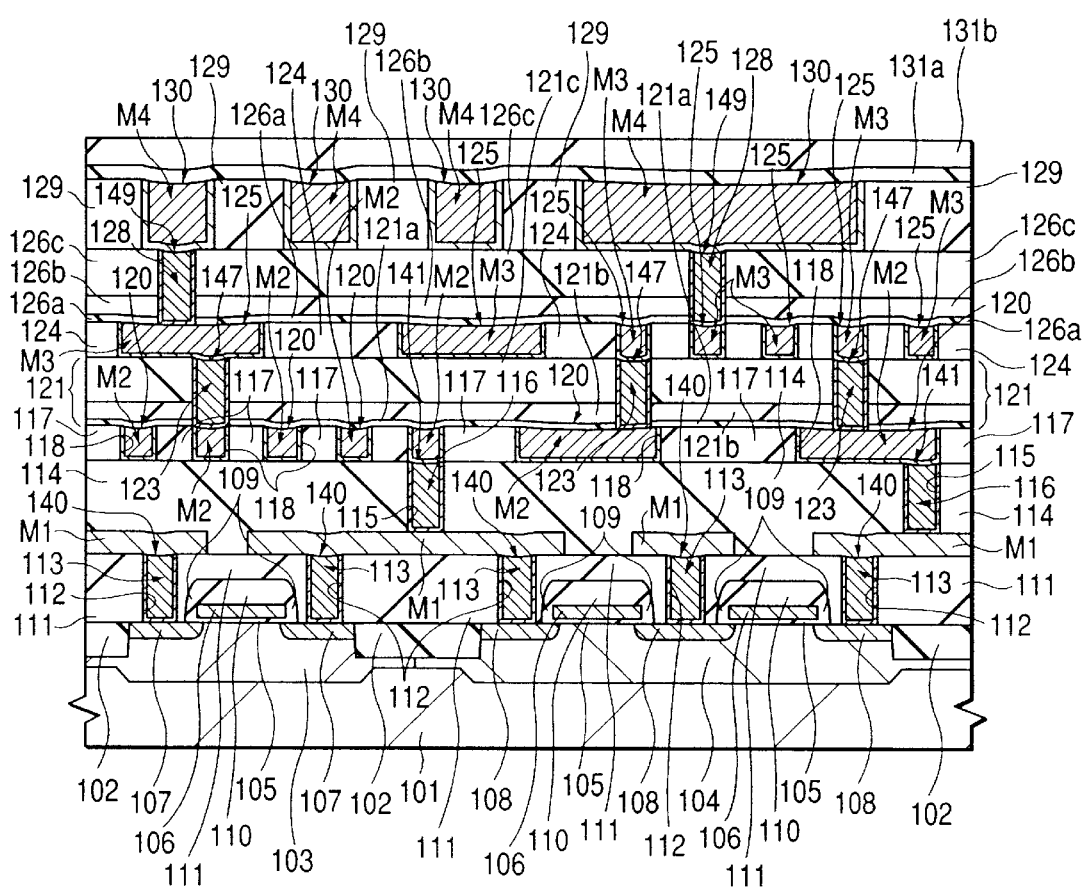
FIG. 52 is a cross-sectional view illustrating a step of the fabrication process of the semiconductor integrated circuit device of the third embodiment in the order of steps.

On the surfaces of the interconnection-forming insulating film 129 and fourth-layer interconnection M4, a blocking film 131a and a planarizing film 131b are formed which constitute an interconnection interlayer insulating film 131 for insulating the fourth-layer interconnection M4 and fifth-layer interconnection M5 (FIG. 52). The blocking film 131a and planarizing film 131b can be formed in similar manners to the blocking film 121a and planarizing film 121b, respectively. By the formation of the planarizing film 131b, the influence of the concave portion 130 can be eliminated, whereby a planarized surface can be obtained.

Figure 53:
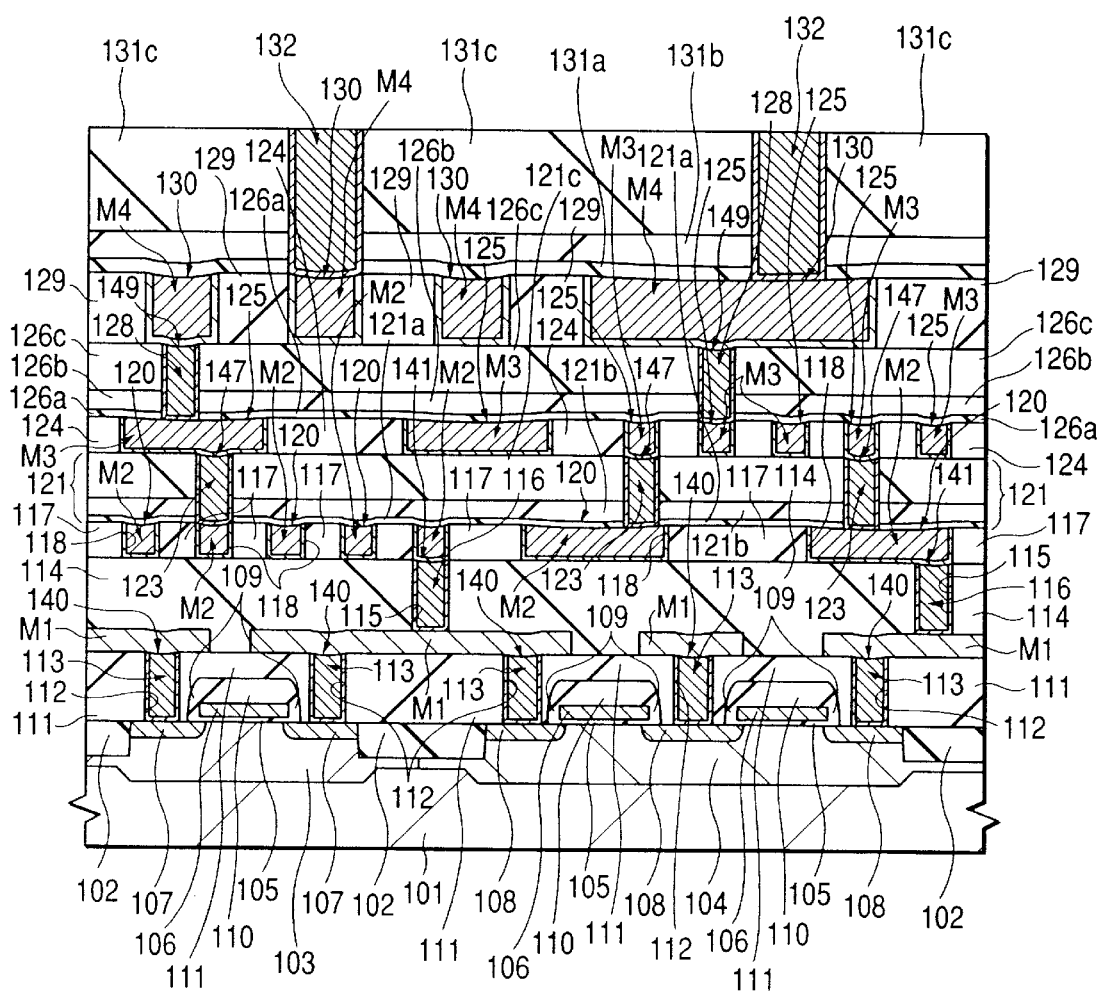
FIG. 53 is a cross-sectional view illustrating a step of the fabrication process of the semiconductor integrated circuit device of the third embodiment in the order of steps.

An insulating film 131c which is also a component film of the interconnection interlayer insulating film 131 is then deposited, whereby the formation of the interconnection interlayer insulating film 131 is completed. Owing to the existence of the planarizing film 131b, the surface of the interconnection interlayer insulating film 131 is planarized. A plug 133 is then formed in a similar manner to the plug 116 (FIG. 53).

Figure 54:
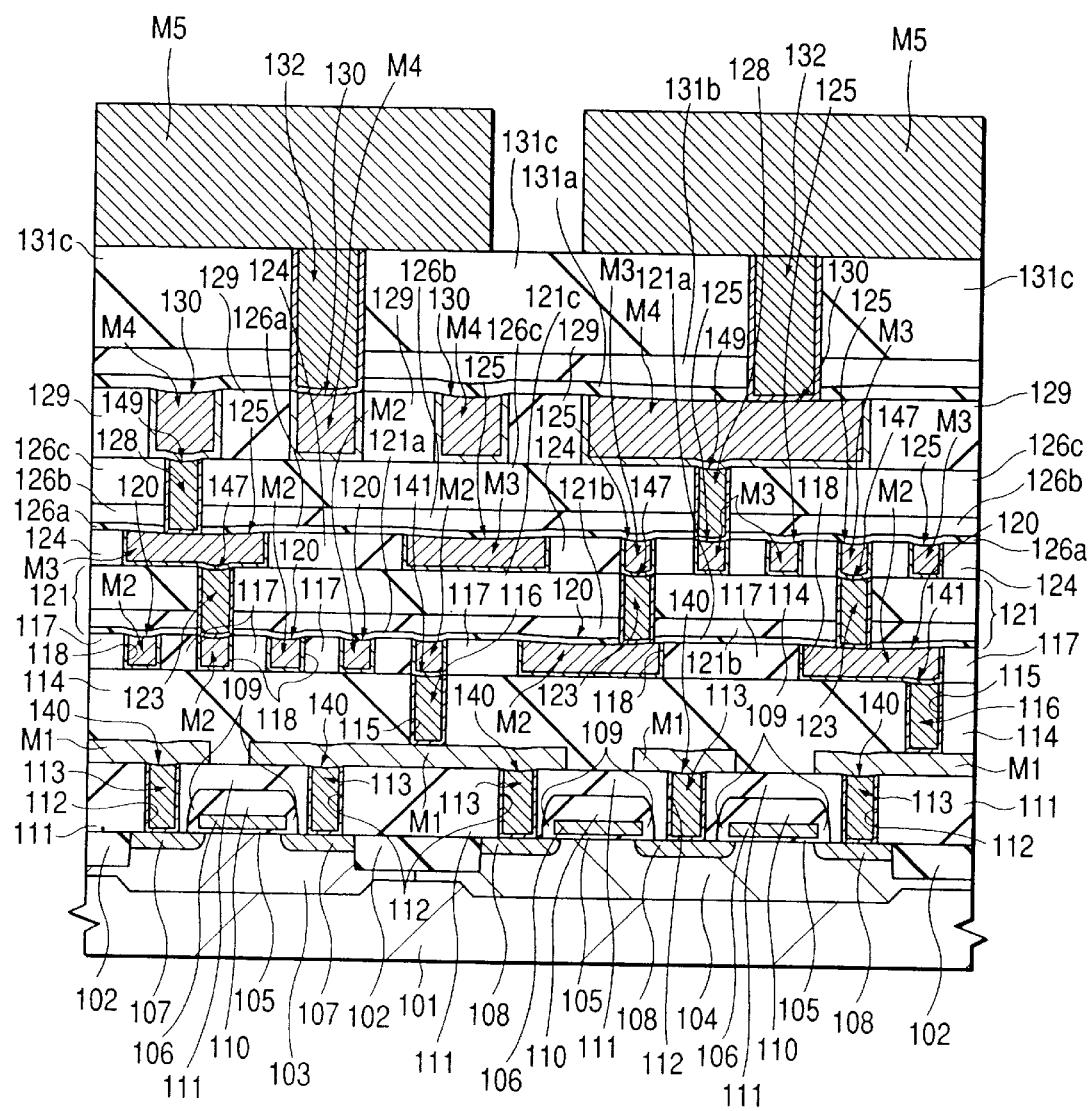
FIG. 54 is the cross-sectional view illustrating a step of a fabrication process of the semiconductor integrated circuit device of the third embodiment in the order of steps.

An aluminum film or the like is deposited all over the interconnection interlayer insulating film 131, followed by patterning, whereby the fifth-layer interconnection MS is formed (FIG. 54). The aluminum film can be deposited by the sputtering method, CVD method, deposition method or the like.

Next, a silicon oxide film is deposited to form an insulating film 134, followed by the formation of an opening in the insulating film 134 over the pad of the fifth-layer interconnection. A nickel film and gold film are deposited all over the surface by the sputtering, CVD or deposition method, followed by the removal of the portions of the nickel film and gold film in a region outside the pad portion, whereby a bump lower metal 135 is formed. A bump 136 is then formed by the transfer from a gold ball or deposition of a metal film and patterning, whereby the semiconductor integrated circuit device as illustrated in FIG. 21 is substantially completed.

As the insulating film 134, a laminate film of a silicon oxide film and a silicon nitride film or the laminate film having a PIQ film formed thereon can be used. The bump 136 can also be formed by forming a solder film from a solder ball and then patterning it.

According to the semiconductor integrated circuit device of the third embodiment and fabrication process thereof, the interconnection interlayer insulating films 121, 126 and 131 in which the plugs 123, 128 and 133 are to be formed contain the planarizing films 121b, 126b and 131b so that no conductive residue remains upon the formation of the plugs 123, 128 and 133 by the CMP method, respectively and insulation properties of the third to fifth-layer interconnections M3 to M5 formed over the respective plugs are secured, respectively, whereby predetermined properties of the semiconductor integrated circuit device can be maintained and its reliability and yield can be improved.

In the third embodiment, an SOG film was exemplified as each of the planarizing films 121b, 126b and 131b, but a silicon oxide film formed by the formation of a silanol ($H_nSi(OH)_{4-n}$) in a gaseous phase and reaction of the resulting silanol on a low-temperature substrate can be used instead. The formation process of such a silicon oxide film was already described in the first embodiment so that the description on it will be omitted.

Embodiment

Figure 55:
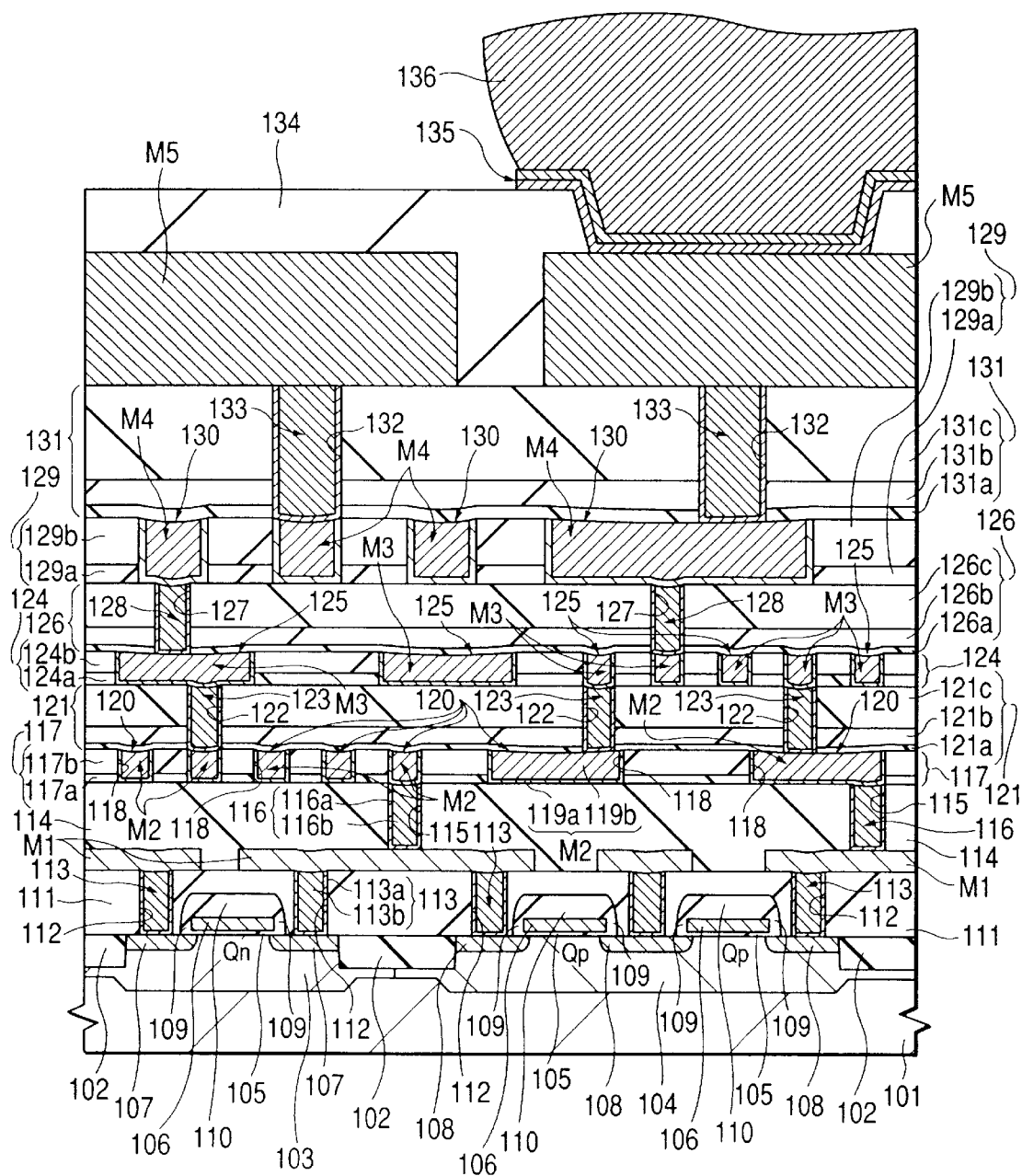
FIG. 55 is a cross-sectional view illustrating one example of a semiconductor integrated circuit device according to a fourth embodiment of the present invention.

FIG. 55 is a cross-sectional view illustrating one example of the semiconductor integrated circuit device according to a still further embodiment of the present invention.

The semiconductor integrated circuit device according to the fourth embodiment differs from that of the third embodiment only in the constitutions of the interconnection-forming insulating films 117, 124 and 129. Descriptions of the other component members thereof will therefore be omitted.

The interconnection-forming insulating films 117, 124 and 129 of the fourth embodiment include planarizing films 117a, 124a and 129a. These planarizing films 117a, 124a and 129a and insulating films 117b, 124b and 129b formed thereover constitute the interconnection-forming insulating films 117, 124 and 129, respectively. Since the interconnection-forming insulating films 117, 124 and 129 include the planarizing films 117a, 124aand 129a, respectively, the surfaces of the interconnection-forming insulating films 117, 124 and 129 are free from unevenness attributable to the concave portions formed upon the formation of plugs 116, 123 and 127 formed therebelow by the CMP method. It is therefore possible to carry out photolithography with good precision upon the formation of an interconnection groove in each of the interconnection-forming insulating films 117, 124 and 129, which makes it possible to meet the tendency to heighten the integration of a semiconductor integrated circuit.

The planarizing films 117a, 124a and 129a are similar to the planarizing films 121b, 126b and 131b in the third embodiment and each of them is made of an SOG film having self fluidity. Either one of an organic SOG film or inorganic SOG film can be used. When the inorganic SOG film is used, similar effects as described in the third embodiment are brought about. Described specifically, neither a hydrophilic nature nor shrinkage appears in the SOG film even if ashing is employed for the removal of a photoresist film to be used upon the formation of interconnection grooves in the interconnection-forming insulating films 117, 124 and 129. The use of an organic SOG film, on the other hand, is effective for reducing the line capacity between interconnections attributable to a low dielectric constant. Instead of the SOG film, a silicon oxide film obtained by the formation of a silanol in a gaseous phase and reaction of the resulting silanol on a low-temperature substrate can be used as the planarizing films 117a, 124a and 129a.

As each of the insulating films 117b, 124b and 129b, a silicon oxide film formed, for example, by the CVD or sputtering method can be used and it has a function of controlling the thickness of the interconnection-forming insulating films 117, 124 and 129, respectively.

The fabrication process of the semiconductor integrated circuit device of the fourth embodiment will next be described with reference to FIGS. 56 to 64. Each of FIGS. 56 to 64 is a cross-sectional view illustrating one example of the fabrication process of the semiconductor integrated circuit device according to the fourth embodiment in the order of steps.

The fabrication process of the device according to the fourth embodiment is similar to that of the third embodiment except for the steps after that illustrated in FIG. 31, so a description of the same steps will be omitted.

As illustrated in FIG. 31 concerning the third embodiment, a plug 116 is formed in the interconnection interlayer insulating film 114. On the surface of the plug 116, a concave portion 141 is formed as illustrated in FIG. 31.

Figure 56:
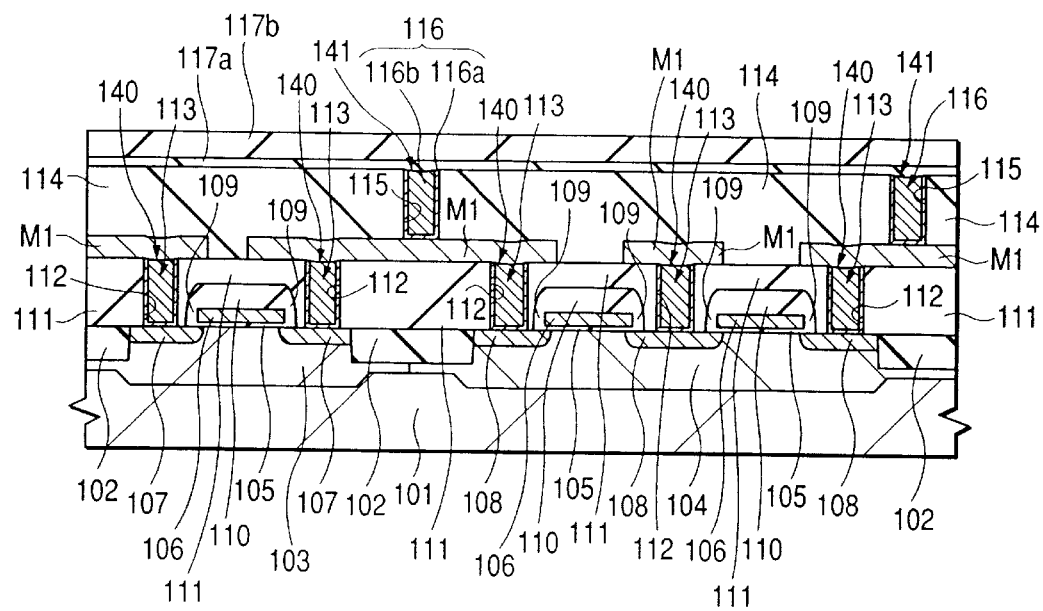
FIG. 56 is a cross-sectional view illustrating a step of the fabrication process of the semiconductor integrated circuit device of the fourth embodiment in the order of steps.

A planarizing film 117a is formed over the interconnection interlevel insulting film 114 and plug 116, followed by the deposition of an insulating film 117b, whereby an interconnection-forming insulating film 117 made of the planarizing film 117a and insulating film 117b is completed (FIG. 56). The planarizing film 117a is an SOG film having self fluidity. Owing to the use of such an SOG film having self fluidity, no influence of the concave portion 141 appears on the surface of the planarizing film 117a and it has a planarized surface. As the insulating film 117b, a silicon oxide film formed for example by the CVD method can be used. The surface of the insulating film 117b has been planarized by the existence of the planarizing film 117a.

Figure 57:
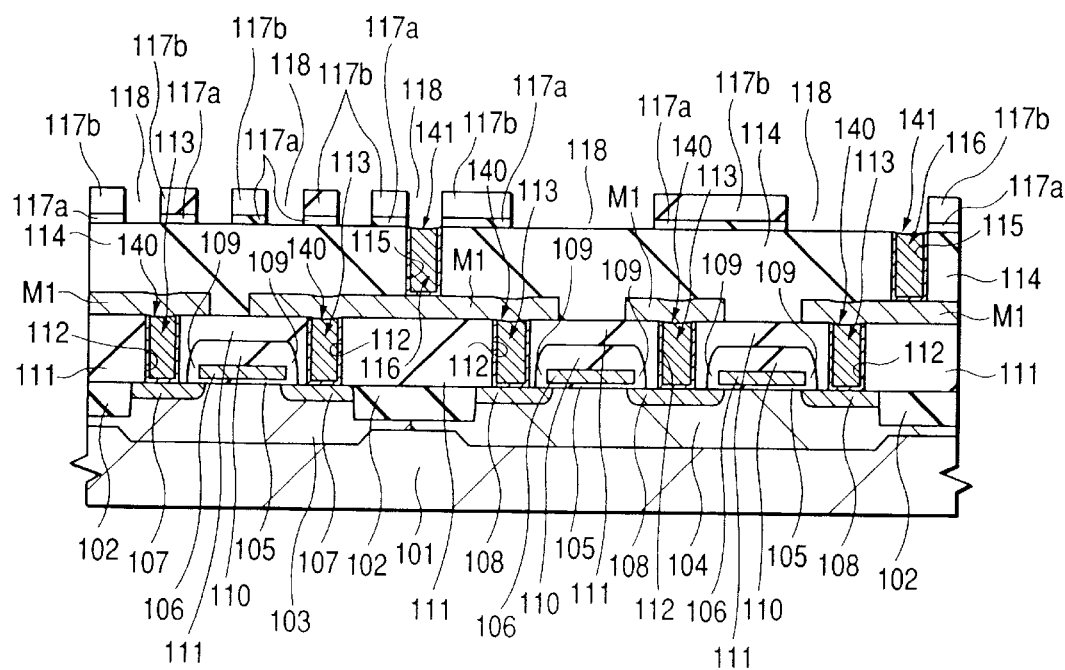
FIG. 57 is a cross-sectional view illustrating a step the fabrication process of the semiconductor integrated circuit device of the fourth embodiment in the order of steps.
Figure 58:
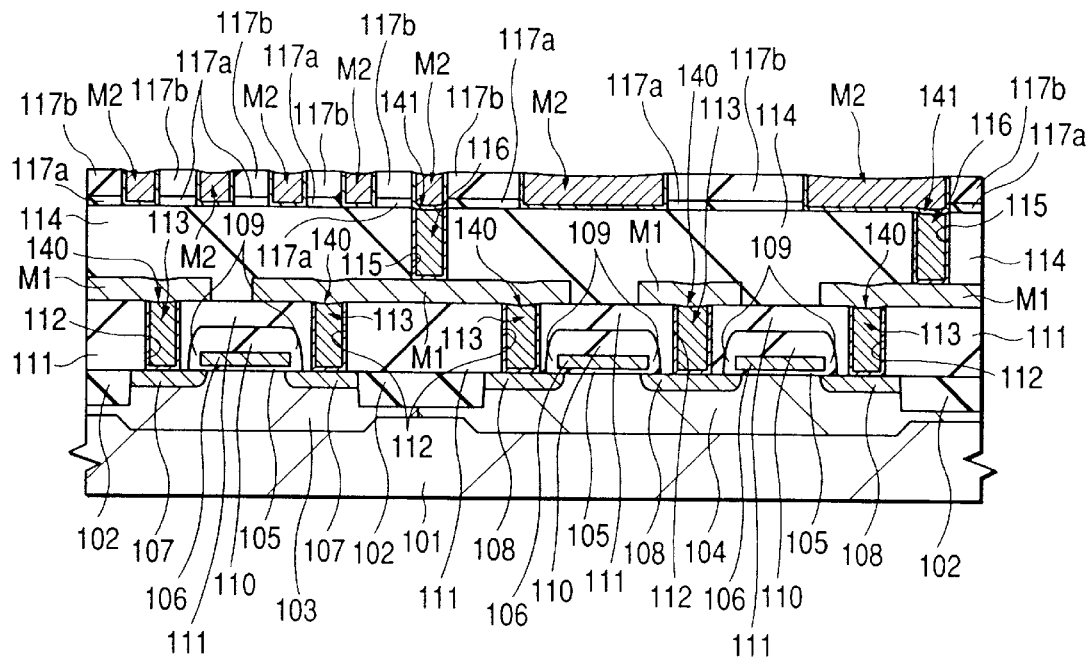
FIG. 58 is a cross-sectional view illustrating a step of the fabrication process of the semiconductor integrated circuit device of the fourth embodiment in the order of steps.

Over the interconnection-forming insulating film 117, a photoresist film having an opening in a region where a second-layer interconnection M2 is to be formed is patterned. Using the photoresist film as a mask, the interconnection-forming insulating film 117 is etched, whereby an interconnection groove 118 is formed (FIG. 57). Upon the formation of this interconnection groove 118, photolithography can be effected with high precision because the interconnection-forming insulating film 117 has a completely planarized surface and besides, even if the interconnection is not formed over the plug 116, no metal film for the formation of an interconnection remains on the surface of the interconnection-forming insulating film 117 over the plug. As a result, the semiconductor integrated circuit is able to have improved reliability.

Figure 59:
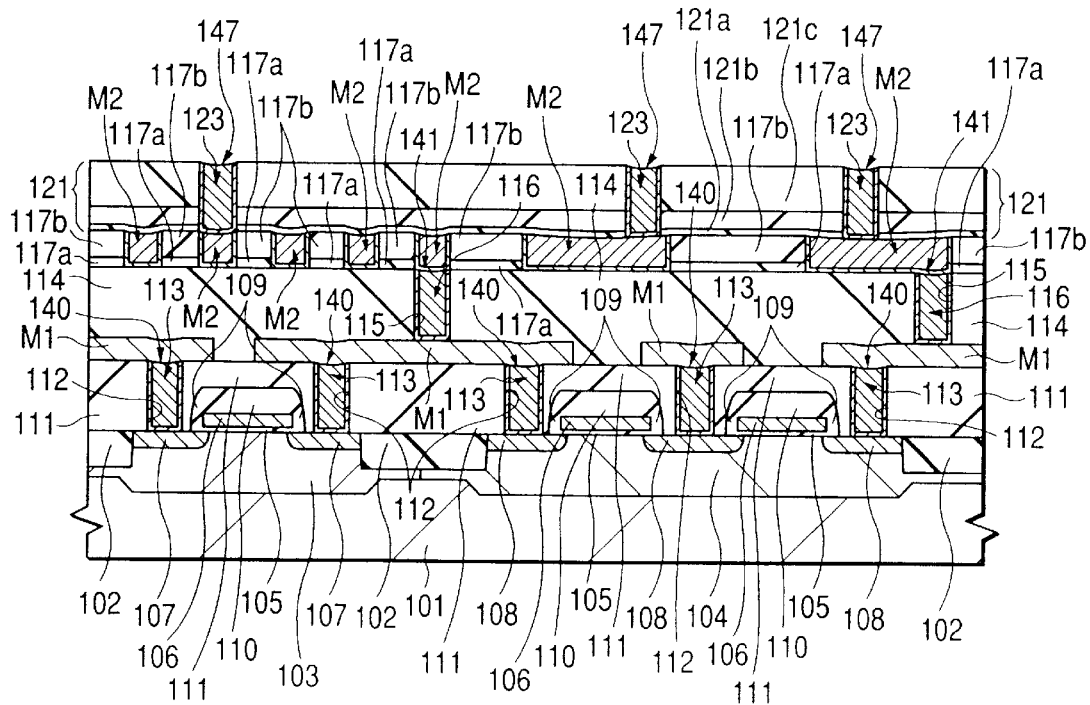
FIG. 59 is a cross-sectional view illustrating a step of the fabrication process of the semiconductor integrated circuit device of the fourth embodiment in the order of steps.

In a similar manner to the fabrication process of the second-layer interconnection M2 of the third embodiment, a second layer interconnection M2 is formed (FIG. 58), followed by the formation of an interconnection insulating film 121 and a plug 123 as in the case of the third embodiment (FIG. 59). On the surface of the plug 123, a concave portion 147 is formed.

Figure 60:
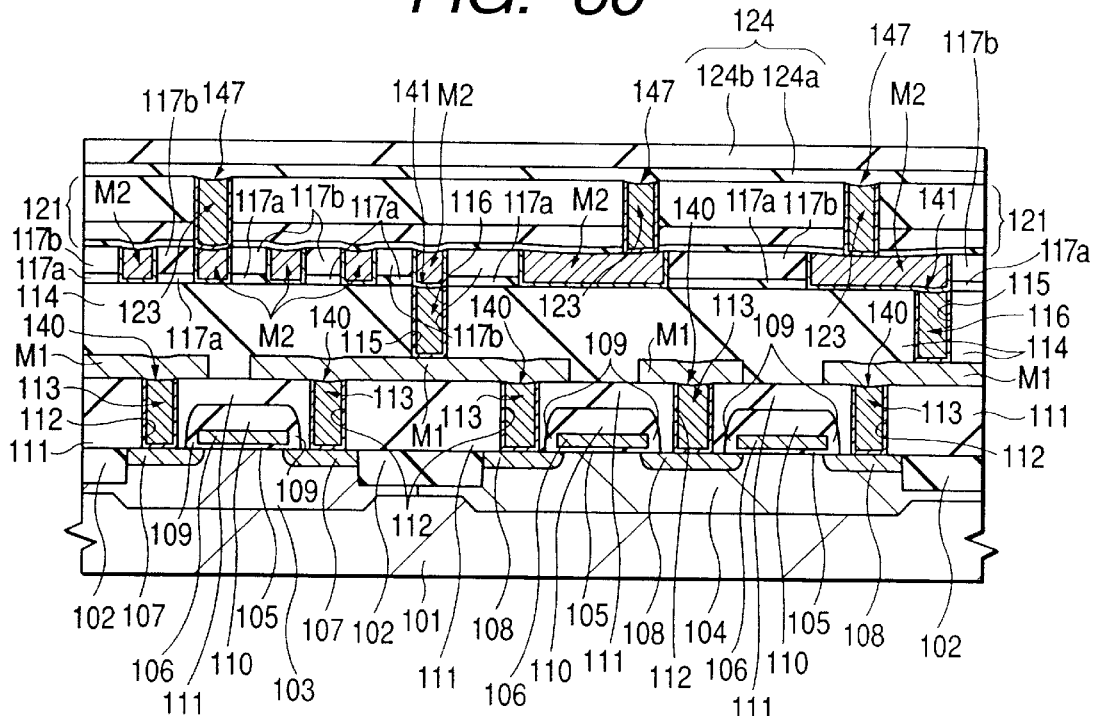
FIG. 60 is a cross-sectional view illustrating a step of the fabrication process of the semiconductor integrated circuit device of the fourth embodiment in the order of steps.
Figure 61:
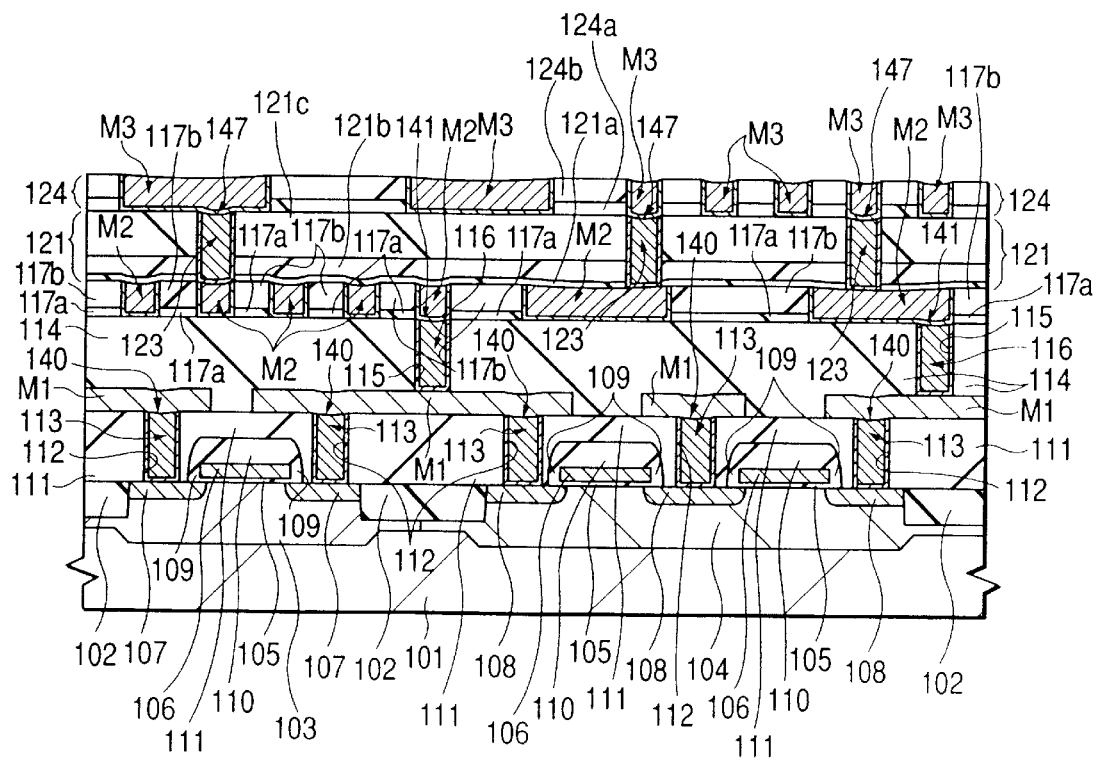
FIG. 61 is a cross-sectional view illustrating a step of the fabrication process of the semiconductor integrated circuit device of the fourth embodiment in the order of steps.

Over the interconnection interlayer insulating film 121 and plug 123, a planarizing film 124a is formed, followed by the deposition of an insulating film 124b, whereby the formation of an interconnection-forming insulating film 124 is completed (FIG. 60). The planarizing film 124a can be, similar to the planarizing film 117b, an SOG film having self fluidity, while the insulating film 124b can be, similar to the insulating film 117b, a silicon oxide film formed for example by the CVD method. The interconnection-forming insulating film 124 is free from the influence of the concave portion 147 and has a planarized surface because of the existence of the planarizing film 124a.

Figure 62:
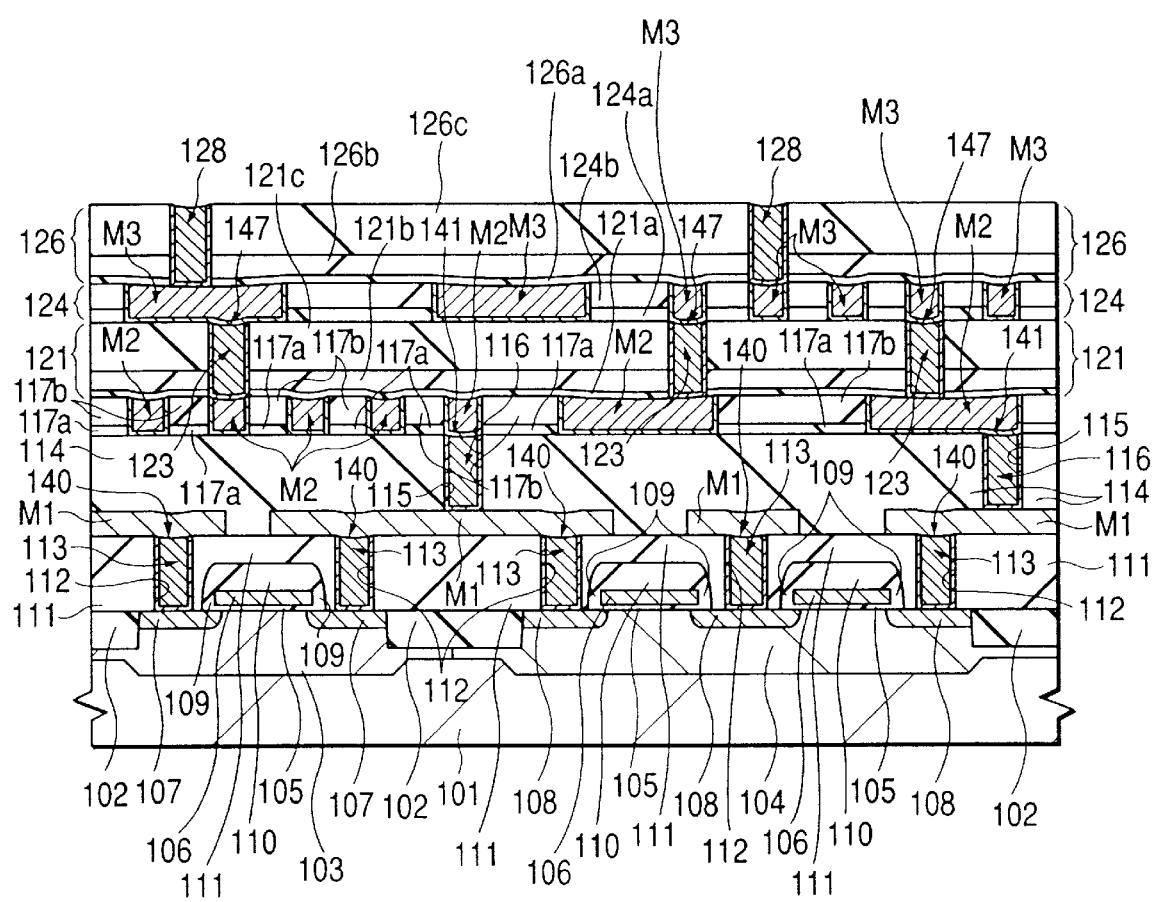
FIG. 62 is a cross-sectional view illustrating a step of the fabrication process of the semiconductor integrated circuit device of the fourth embodiment in the order of steps.

As in the second-layer interconnection M2, the third-layer interconnection M3 is formed in an interconnection groove which has been formed in the interconnection-forming insulating film 124 (FIG. 61), followed by the formation of an interconnection interlayer insulating film and a plug 128 in a similar manner to the third embodiment (FIG. 62).

Figure 63:
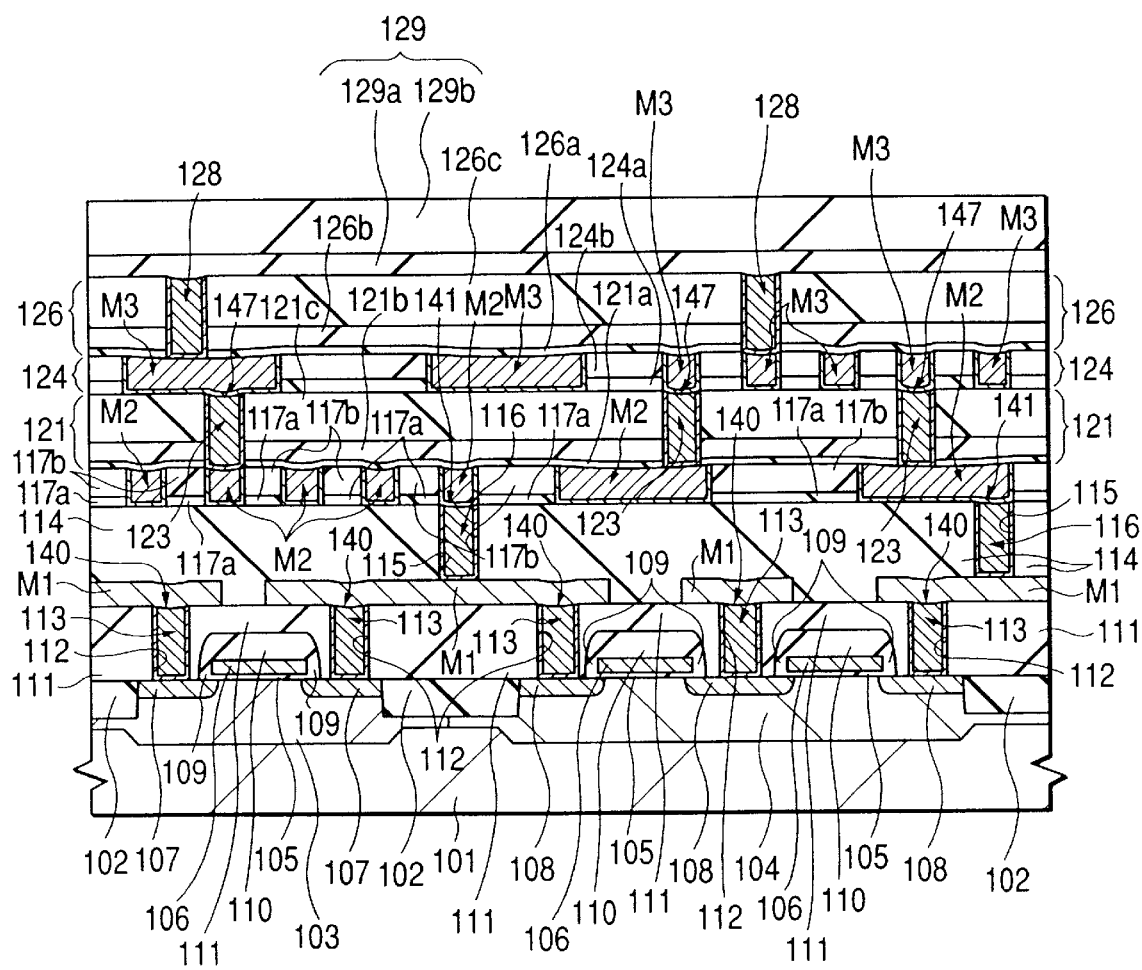
FIG. 63 is a cross-sectional view illustrating a step of the fabrication process of the semiconductor integrated circuit device of the fourth embodiment in the order of steps.

A planarizing film 129a is formed over the interconnection interlayer insulating film 126 and plug 128, followed by the deposition of an insulating film 129b, whereby the formation of an interconnection-forming insulating film 129 is completed (FIG. 63). The planarizing film 129a is, similar to the planarizing film 117a, an SOG film having self fluidity, while the insulating film 129b is, similar to the insulating film 117b, a silicon oxide film formed for example by the CVD method. Similar to the above-described interconnection-forming insulating films, the interconnection-forming insulating film 129 also has a planarized surface because of the existence of the planarizing film 129a.

Figure 64:
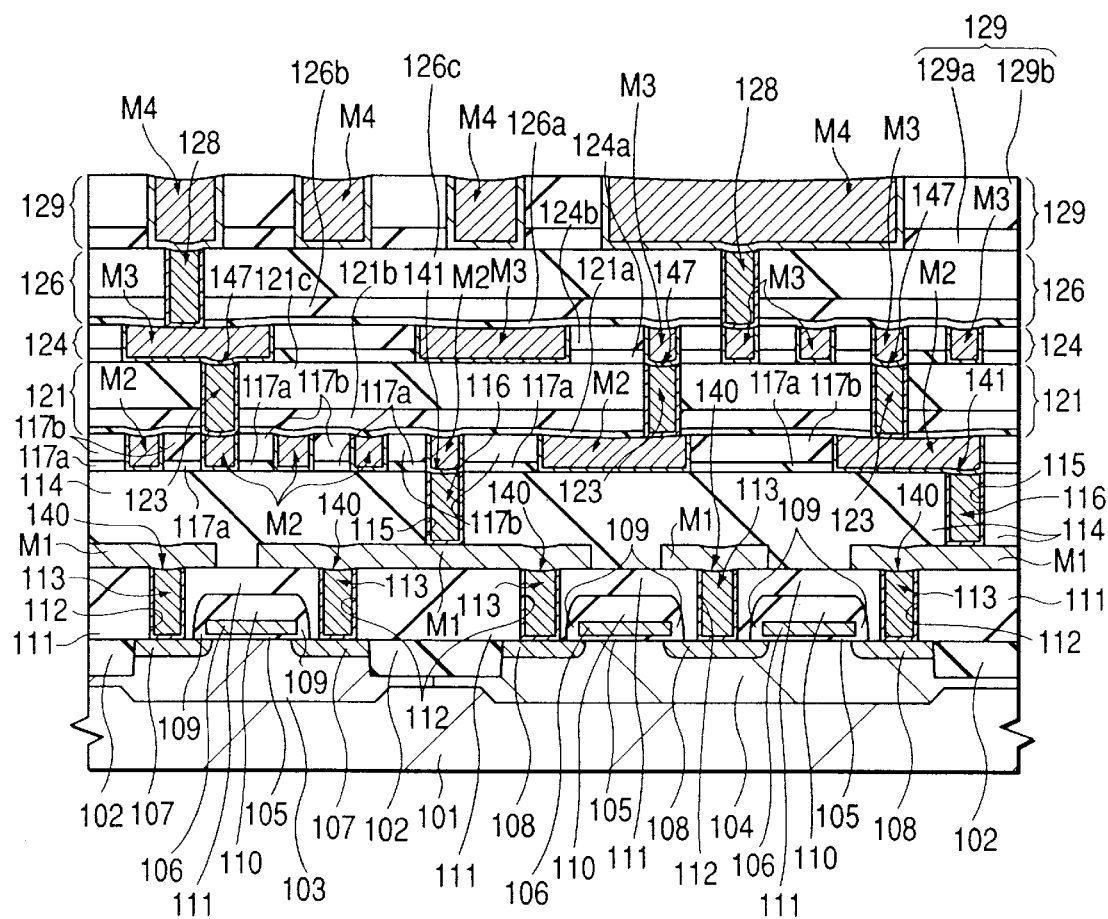
FIG. 64 is a cross-sectional view illustrating a step of the fabrication process of the semiconductor integrated circuit device of the fourth embodiment in the order of steps.

As in the case of the second insulating film M2 or the third insulating film M3, an interconnection groove is formed in the interconnection-forming insulating film 129 and in this interconnection groove, a fourth-layer interconnection M4 is formed (FIG. 64). The steps subsequent thereto are similar to those of the third embodiment so that a description of them will be omitted.

According to the semiconductor integrated circuit device of the fourth embodiment and fabrication process thereof, the interconnection-forming insulating films 117, 124, 129 contain the planarizing films 117a, 124a, 129a so that they are able to have a planarized surface, which brings about an improvement in the processing precision of photolithography. In addition, even if the plug formed below the interconnection-forming insulating film has a concave portion, the residue of a conductive film for the interconnection formation attributable to the concave portion does not appear so that the reliability of the semiconductor integrated circuit device can be improved.

Fifth Embodiment

Figure 65:
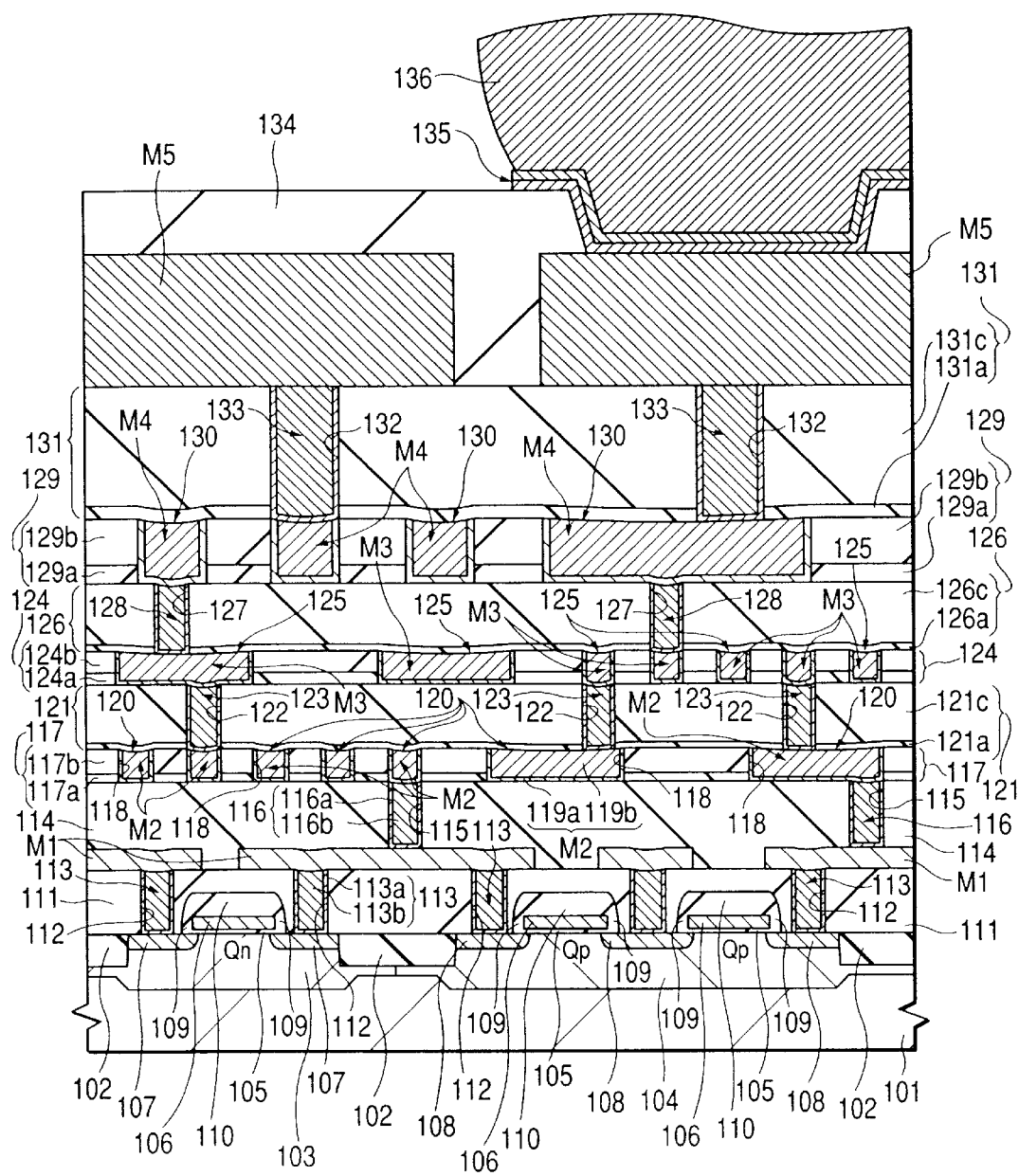
FIG. 65 is a cross-sectional view illustrating one example of a semiconductor integrated circuit device according to a fifth embodiment of the present invention.

FIG. 65 is a cross-sectional view illustrating one example of a semiconductor integrated circuit device according to a still further embodiment of the present invention.

The semiconductor integrated circuit device according to the fifth embodiment has interconnection-forming insulating films 117, 124 and 129 which contain planarizing films 117a, 124a and 129a. These planarizing films 117a, 124a and 129a and insulating films 117b, 124b and 129b formed thereover constitute the interconnection-forming insulating films 117, 124 and 129, respectively. The interconnection interlayer insulating films 121, 126 and 131 do not contain a planarizing film and they are made of blocking films 121a, 126a and 131a and insulating films 121c, 126c and 131c, respectively.

According to such a semiconductor integrated circuit device, effects as described in the fourth embodiment are available, while generation of a conductive residue can be suppressed to some extent by carrying out CMP excessively to some extent upon the formation of the plugs 123, 127 and 133.

Emibodiment 6

Figure 66:
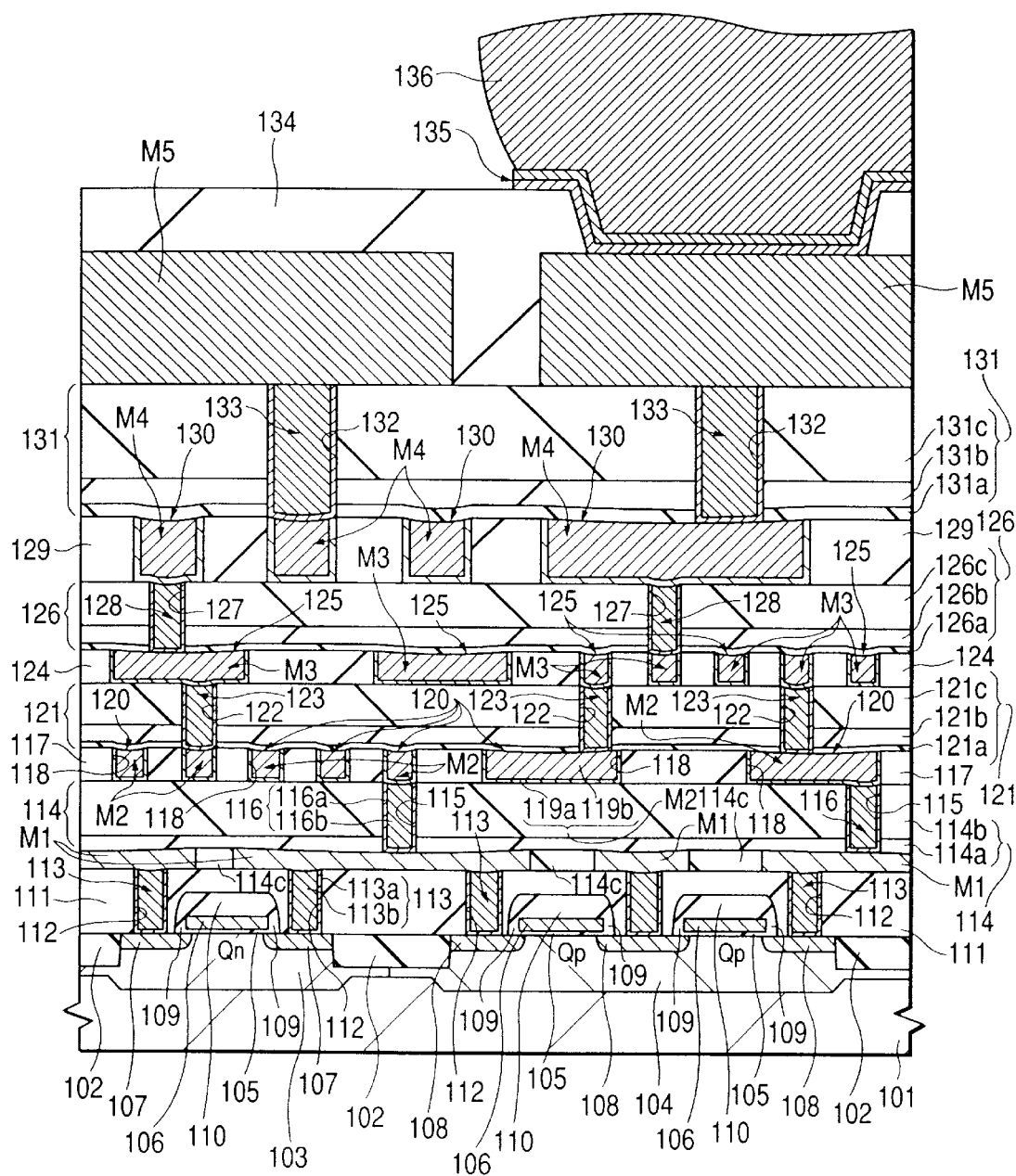
FIG. 66 is a cross-sectional view illustrating one example of a semiconductor integrated circuit device according to a sixth embodiment of the present invention.

FIG. 66 is a cross-sectional view illustrating one example of a semiconductor integrated circuit device according to a still further embodiment of the present invention.

The semiconductor integrated circuit device according to the sixth embodiment has a first-layer interconnection M1 formed by the CMP method and, between the first-layer interconnection M1 and a second-layer interconnection M2, an interconnection interlayer insulating film 114 containing a planarizing film 114a. The constitution of the second embodiment is similar to that of the third embodiment except for the above-described first-layer interconnection M1 and interconnection interlayer insulating film 114 so a description of it will be omitted.

The planarizing film 114a is a fluid insulating film having self fluidity and, for example, an SOG film can be used. Either one of an organic or inorganic SOG film can be used. Instead of the SOG film, a silicon oxide film formed by the formation of a silanol in a gaseous phase and reaction of the resulting silanol on a low temperature substrate can be used. The interconnection interlayer insulating film 114 is made of the planarizing film 114a and an insulating film 114b. As the insulating film 114b, in a silicon oxide film formed for example by the CVD or sputtering method can be used and it has a function of controlling the thickness of the interconnection interlayer insulating film 114.

The fabrication process of the semiconductor integrated circuit device according to the sixth embodiment will next be described with reference to the accompanying drawings FIGS. 67 to 71. FIGS. 67 to 71 are cross-sectional views illustrating one example of the fabrication process of the semiconductor integrated circuit device of the sixth embodiment in the order of steps.

The fabrication process of the sixth embodiment is similar to that of the third embodiment except for the steps subsequent to that illustrated in FIG. 27. The steps common to these processes will therefore be omitted.

Figure 67:
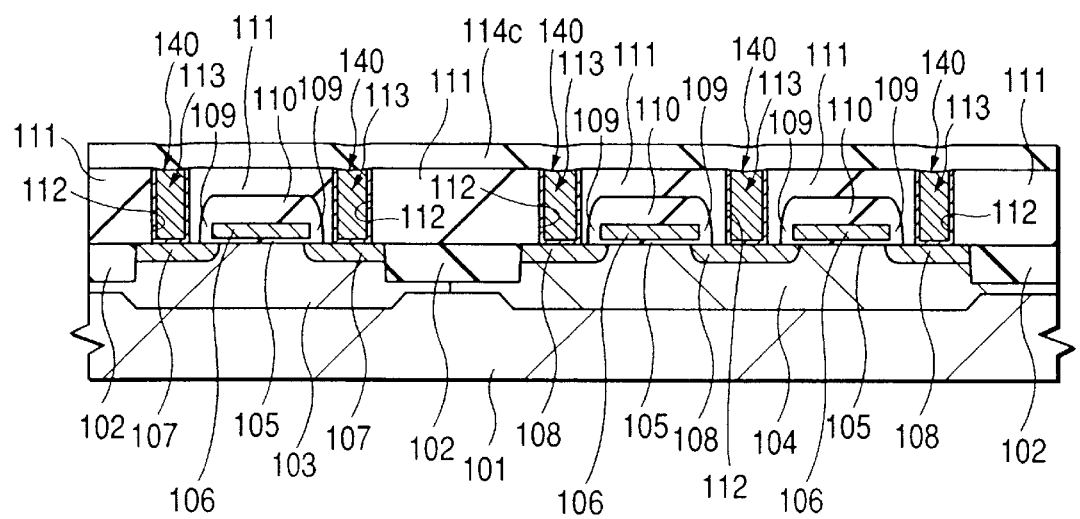
FIG. 67 is a cross-sectional view illustrating a step of the fabrication process of the semiconductor integrated circuit device of the sixth embodiment of the present invention in the order of steps.

After formation of the plug 113 illustrated in FIG. 27 of the-third embodiment, an interconnection-forming insulating film 114c for the formation of a first-layer interconnection M1 is formed (FIG. 67). As the interconnection-forming insulating film 114c, a silicon oxide film formed for example by the CVD method can be used. On the surface of the interconnection-forming insulating film 114c, a concave portion is formed, influenced by the concave portion 140.

Figure 68:
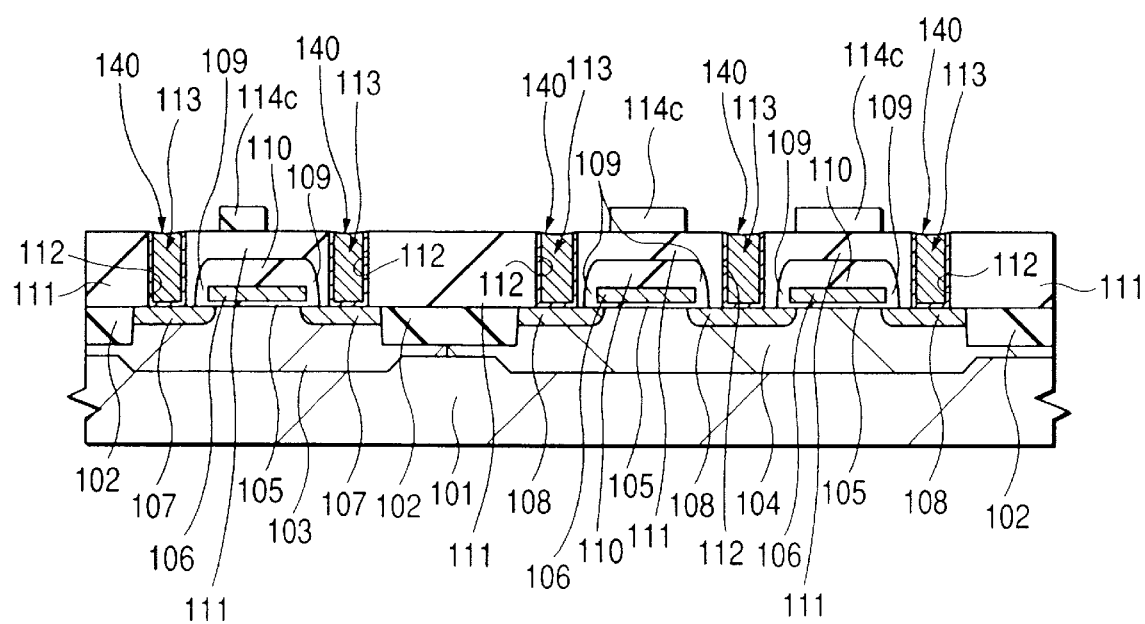
FIG. 68 is a cross-sectional view illustrating a step of the fabrication process of the semiconductor integrated circuit device of the sixth embodiment of the present invention in the order of steps.
Figure 69:
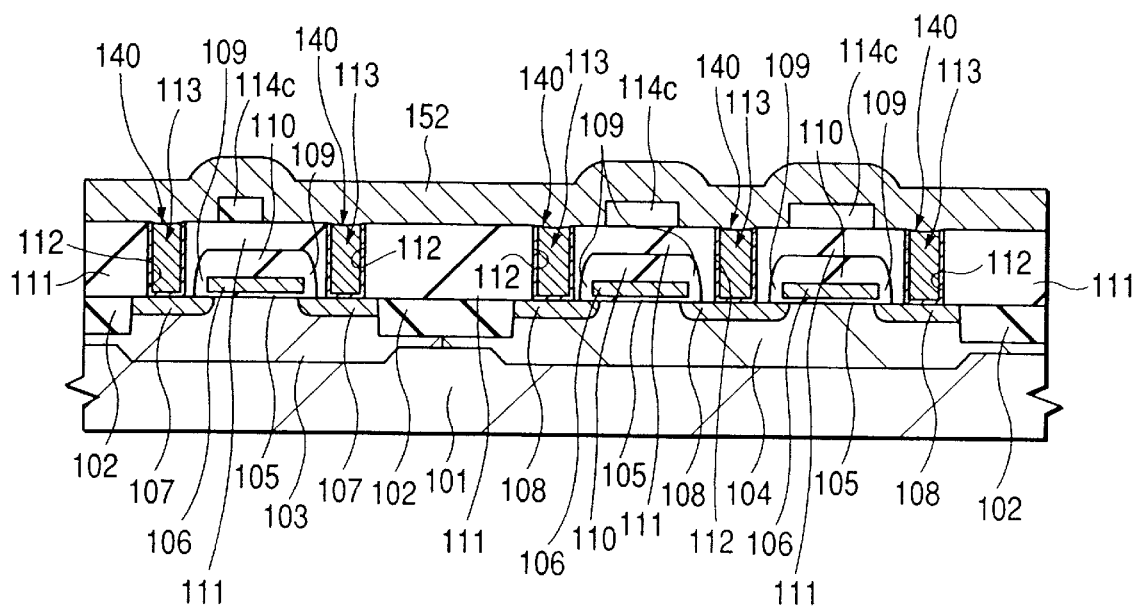
FIG. 69 is a cross-sectional view illustrating a step of the fabrication process of the semiconductor integrated circuit device of the sixth embodiment of the present invention in the order of steps.

A photoresist film having an opening in a region where the first-layer interconnection M1 is to be formed is patterned. With this photoresist film as a mask, the interconnection-forming insulating film 114c is etched (FIG. 68).

Figure 70:
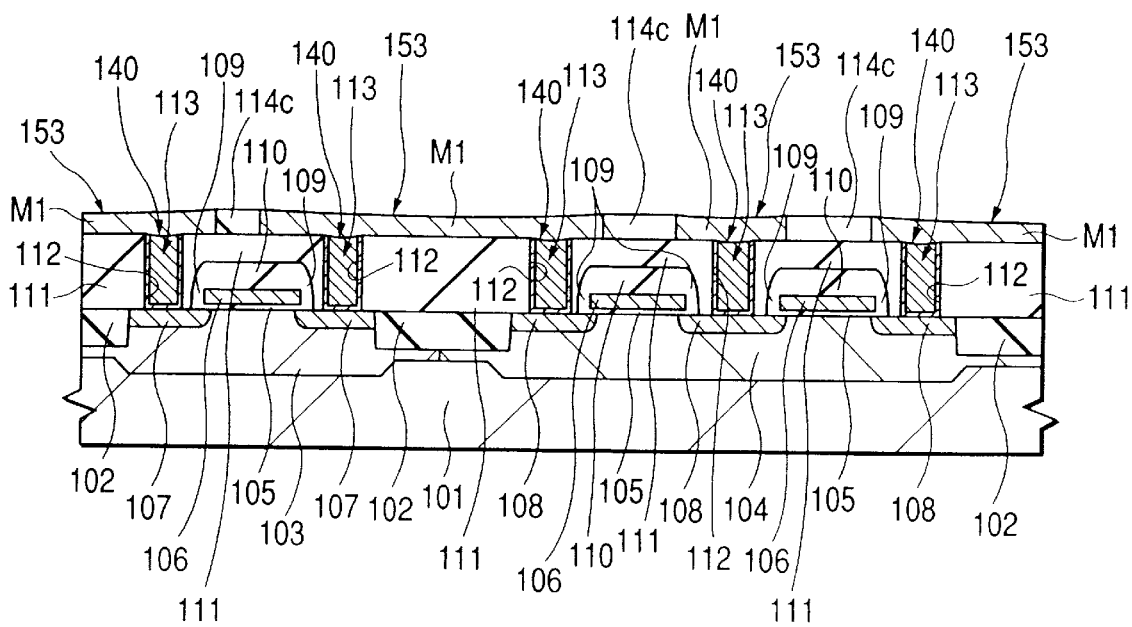
FIG. 70 is a cross-sectional view illustrating a step of the fabrication process of the semiconductor integrated circuit device of the sixth embodiment of the present invention in the order of steps.

A tungsten film 152 is deposited all over the semiconductor substrate 101 (FIG. 69), followed by polishing the tungsten film 152 by the CMP method. The tungsten film 152 is polished until the surface of the interconnection-forming insulating film 114c is exposed. An unnecessary portion of the tungsten film 152 is removed from the surface of the interconnection-forming insulating film 114c, whereby the first-layer interconnection M1 is formed (FIG. 70). Incidentally, a concave portion (dishing) 153 is formed on the surface of the first-layer interconnection M1 owing to a difference in the CMP rate between tungsten which constitutes the first-layer interconnection M1 and a silicon oxide film which constitutes the interconnection-forming insulating film 114c.

Figure 71:
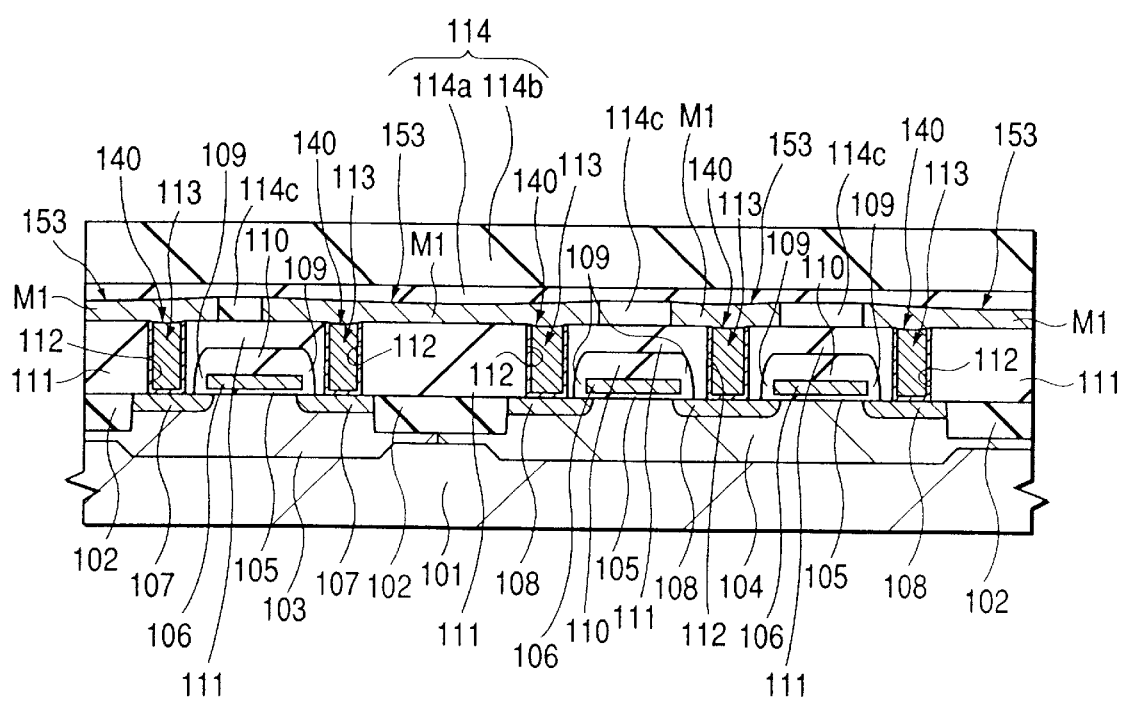
FIG. 71 is a cross-sectional view illustrating a step of the fabrication process of the semiconductor integrated circuit device of the sixth embodiment of the present invention in the order of steps.

Over the interconnection-forming insulating film 114c and first-layer interconnection M1, a planarizing film 114a is formed. As the planarizing film 114a, an SOG film can be used for example. Either one of an organic or inorganic SOG film may be used. As described above, it is also possible to use, instead of the SOG film, a silicon oxide film obtained by the formation of a silanol in a gaseous phase and reaction of the resulting silanol on a low temperature substrate. By the formation of the planarizing film 114a as described above, the concave portion 153 on the surface of the first-layer interconnection M1 can be absorbed in the planarizing film 114a, whereby the planarizing film 114a has a planarized surface. An insulating film 114b is deposited thereover, whereby the formation of the interconnection interlayer insulating film 114 is completed (FIG. 71). As the insulating film 114b, a silicon oxide film formed for example by the CVD method may be used. The surface of the interconnection interlayer insulating film 114 can be planarized by the existence of the planarizing film 114a so that a conductive residue attributable to the concave portion 153 does not appear in the subsequent steps, particularly, the formation step of a plug 116. As a result, a predetermined performance of the semiconductor integrated circuit device can be secure and its reliability and yield can be improved.

The present invention completed by the present inventors has been described above in detail based on various embodiments. It should however be borne in mind that the present invention is not limited to or by the above embodiments. It is needles to say that many changes can be made thereto without departing from the spirit or scope of the invention as set forth herein.

For example, the main conductive film made of copper is exemplified, but it may be made of tungsten or aluminum.

The interconnection interlevel insulating layer equipped with a blocking film was described, but the blocking film is not essential and does not need to be disposed.

Figure 72:
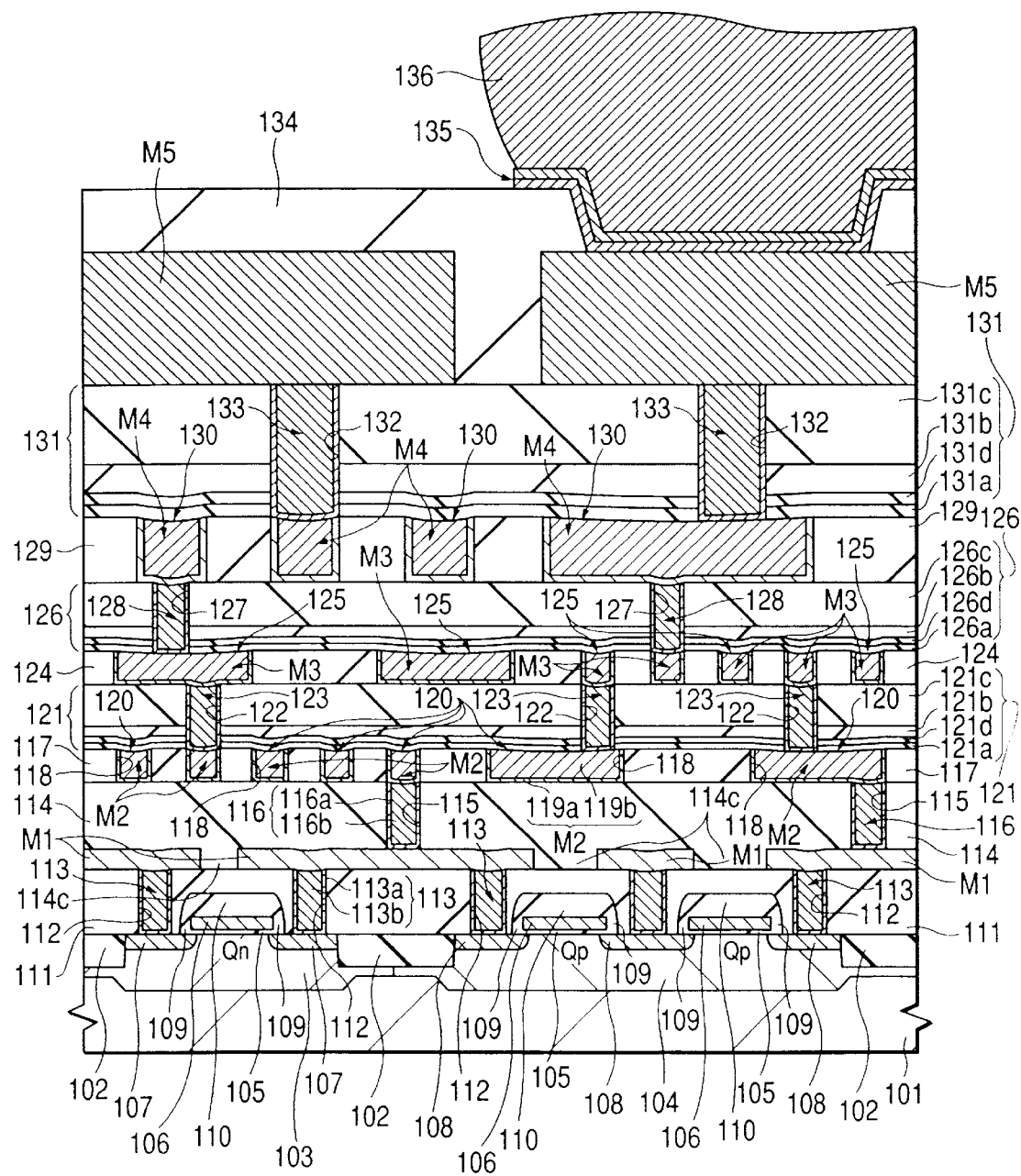
FIG. 72 is a cross-sectional view illustrating one example of a semiconductor integrated circuit device according to a still further embodiment of the present invention.
Figure 73A:
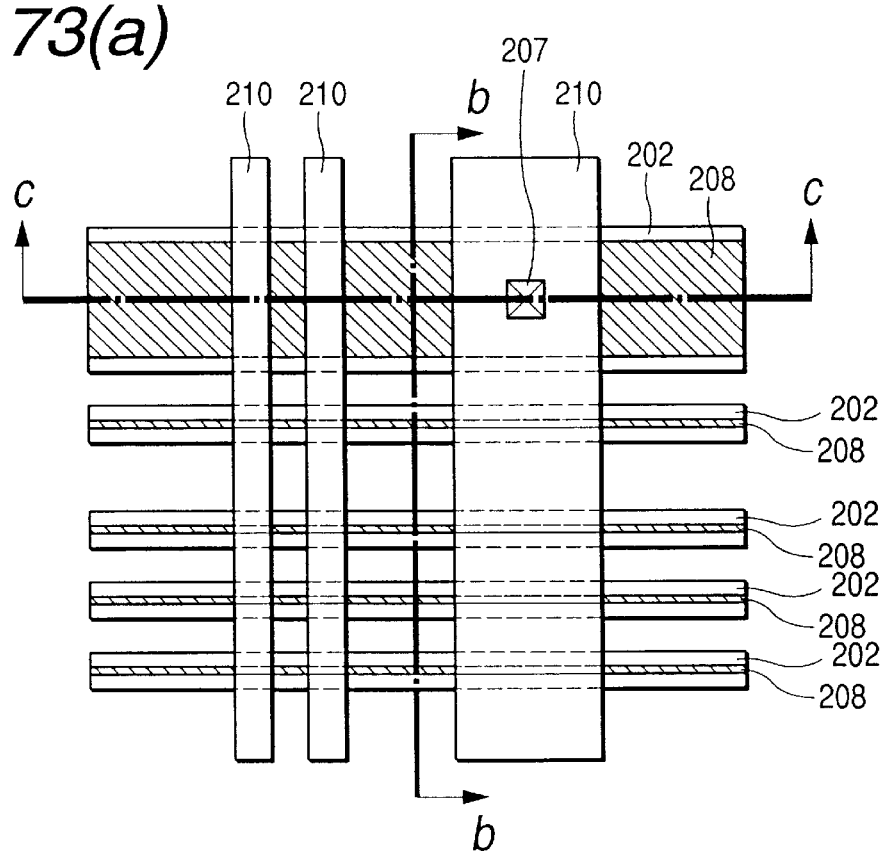
FIG. 73(a) is a plain view.
Figure 73B:
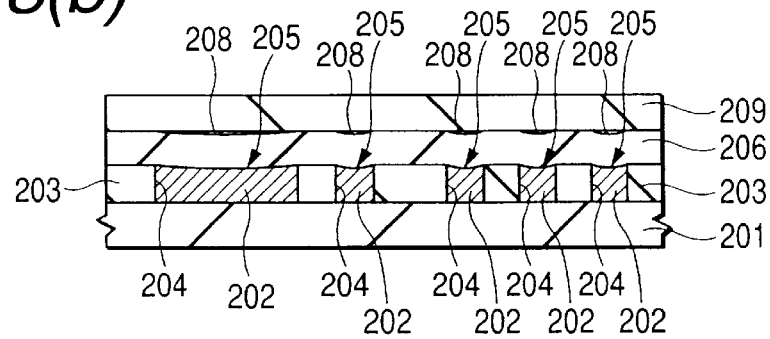
FIG. 73(b) is a cross-sectional view taken along a line b—b of FIG. 73(a) and FIG. 73(c) is a cross-sectional view taken along a line c—c of FIG. 73(a)
Figure 73C:
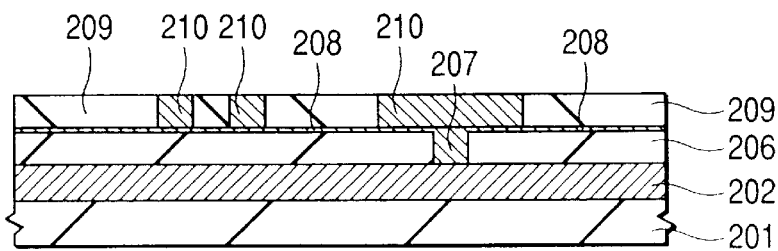

In the third, fourth and sixth embodiments, the interconnection interlayer insulating films 121, 126 and 131 having three-layer structures of the blocking films 121a, 126a and 131a, planarizing films 121b, 126b and 131b and insulating films 121c, 126c and 131a, respectively were exemplified, but insulating films 121d, 126d and 131d as illustrated in FIG. 72 may be formed between the blocking films 121a, 126a and 131a and planarizing films 121b, 126b and 131b, respectively. As the insulating film 121d, 126d or 131d, a silicon oxide film formed for example by the CVD method can be used.

The blocking films 121a, 126a and 131a are not essential. When these blocking films are not formed, films having blocking action can be formed over each of the second to fourth-layer interconnections M2 to M4 by depositing a thin film capable of blocking the diffusion of copper or the like, for example, a titanium nitride film (TiN) after formation of the second to fourth-layer interconnections M2 to M4; and polishing the titanium nitride film by the CMP method by using a rigid pad or the like, thereby removing the portions of the titanium nitride films on the interconnection-forming insulating films 117, 124 and 129.

Figure 74:
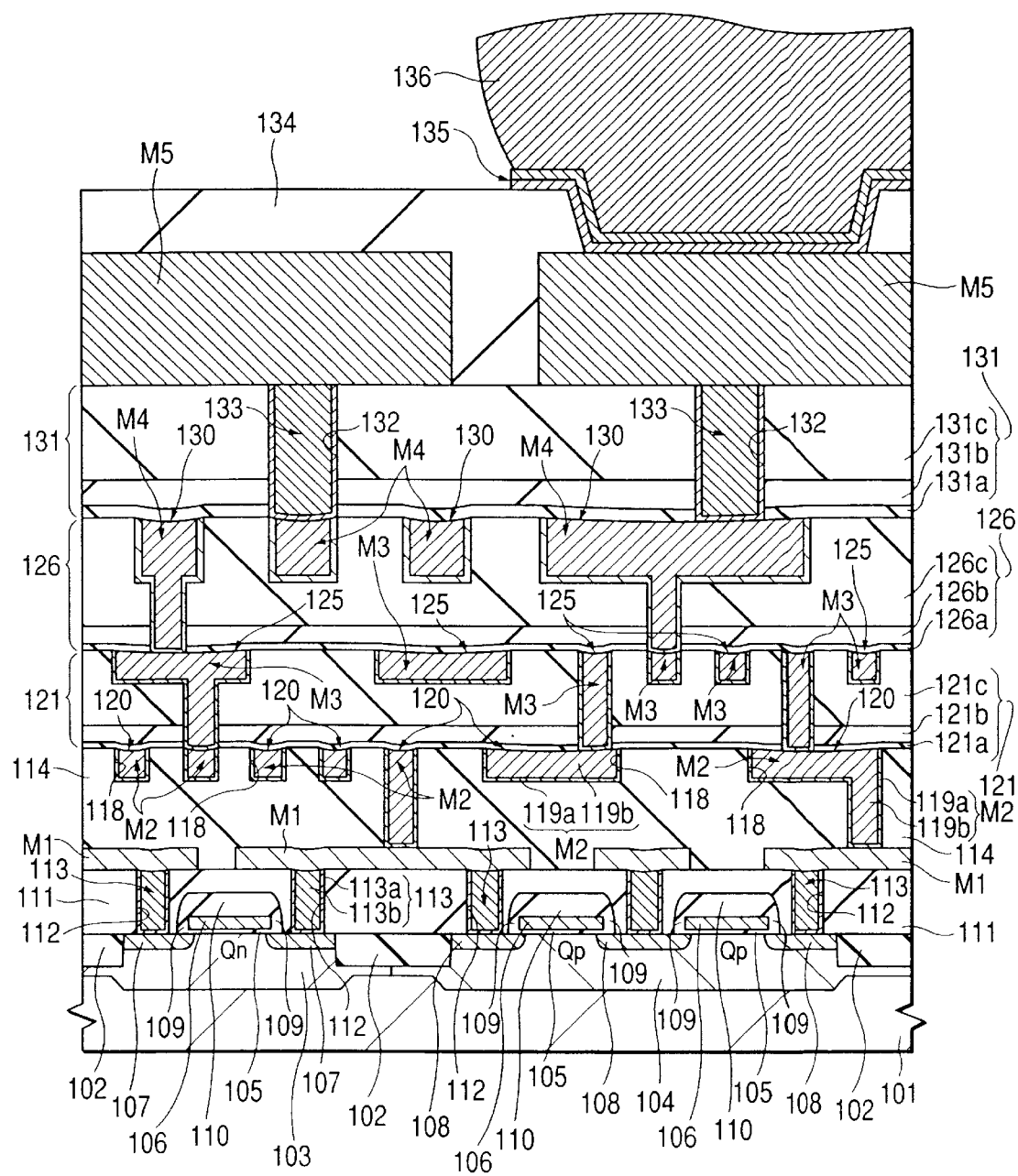
FIG. 74 is a cross-sectional view illustrating one example of a semiconductor integrated circuit device according to a still further embodiment of the present invention.
Figure 75:
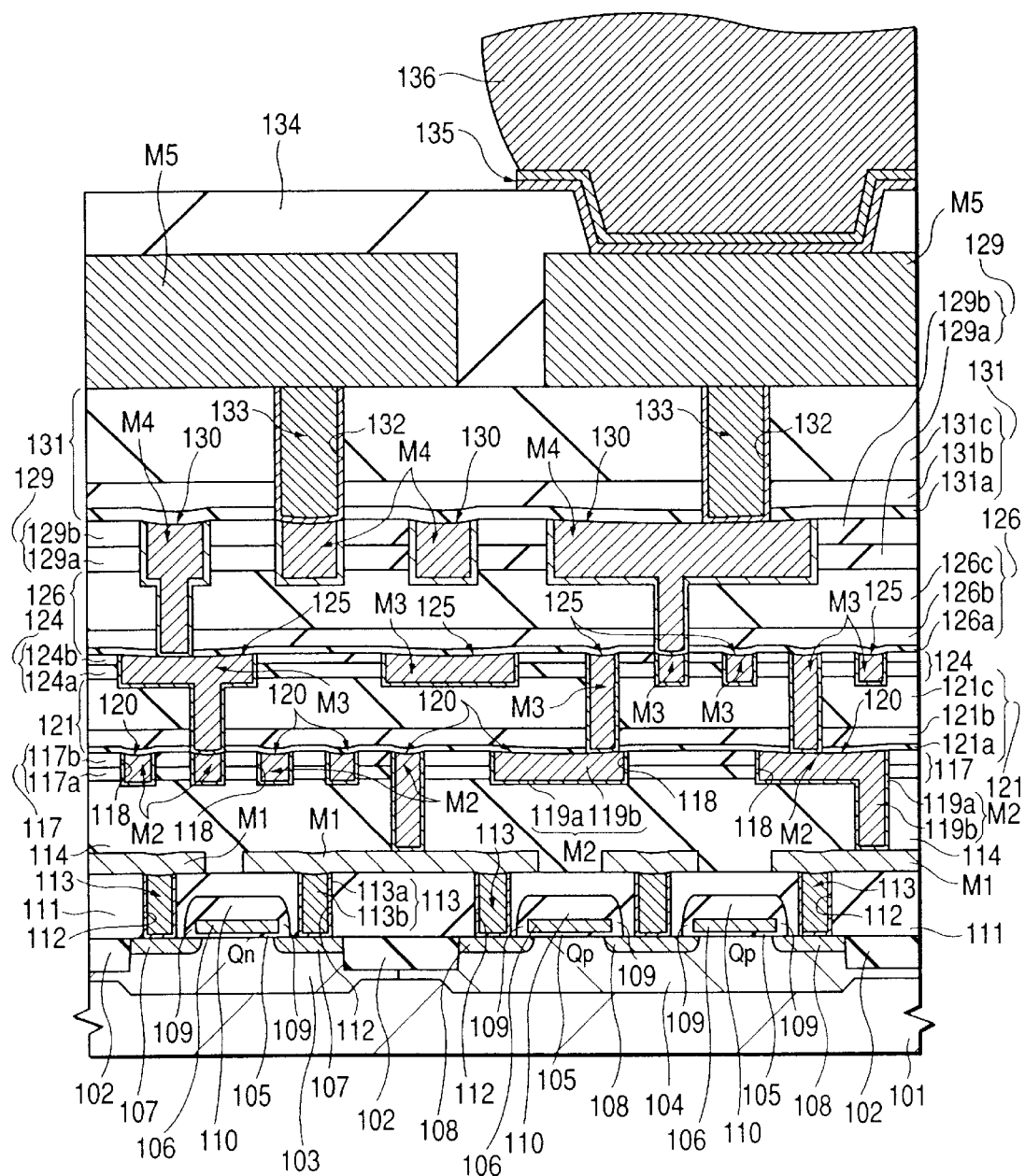
FIG. 75 is a cross-sectional view illustrating one example of a semiconductor integrated circuit device according to a still further embodiment of the present invention.
Figure 76:
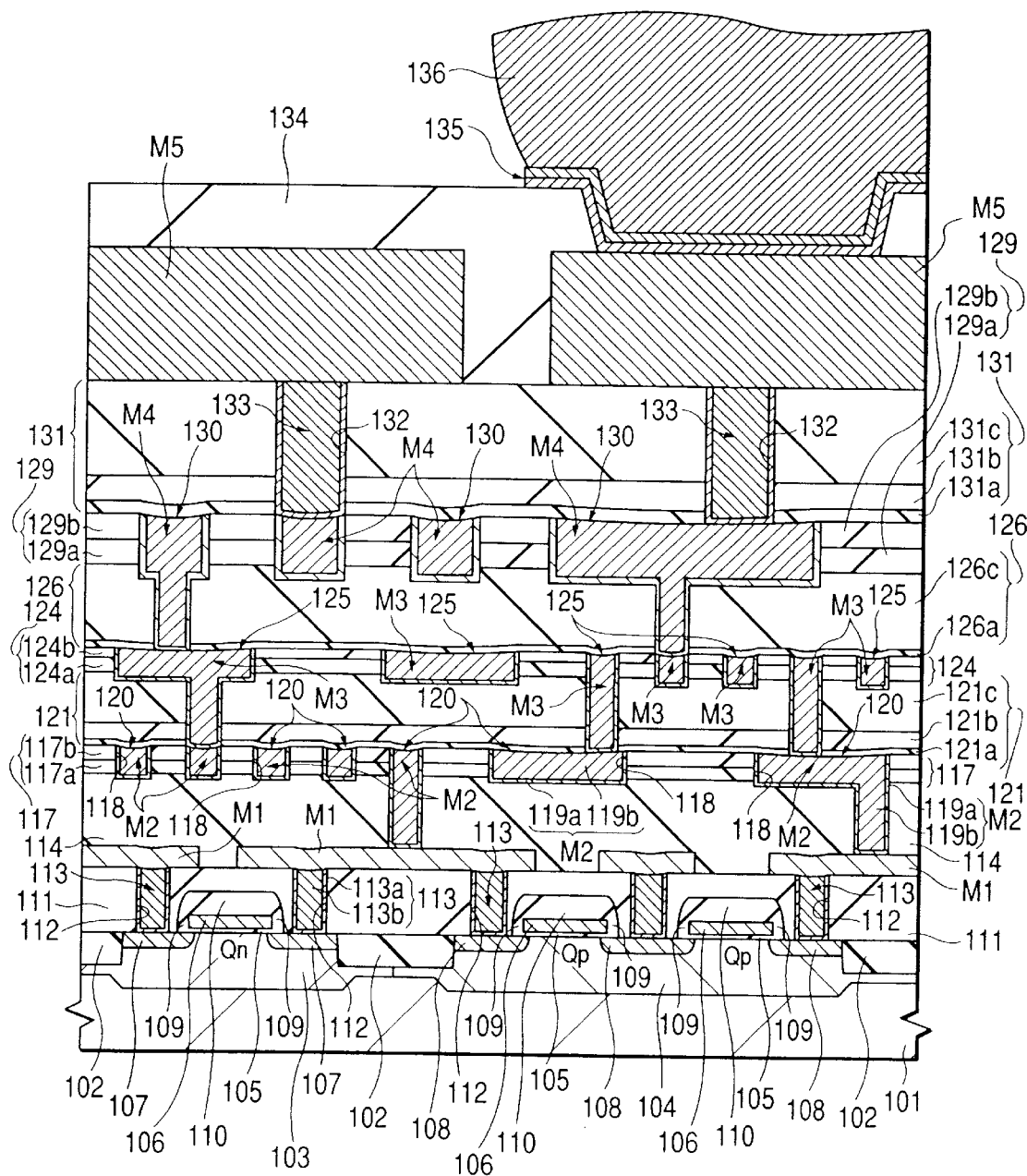
FIG. 76 is a cross-sectional view illustrating one example of a semiconductor integrated circuit device according to a still further embodiment of the present invention.
Figure 77:
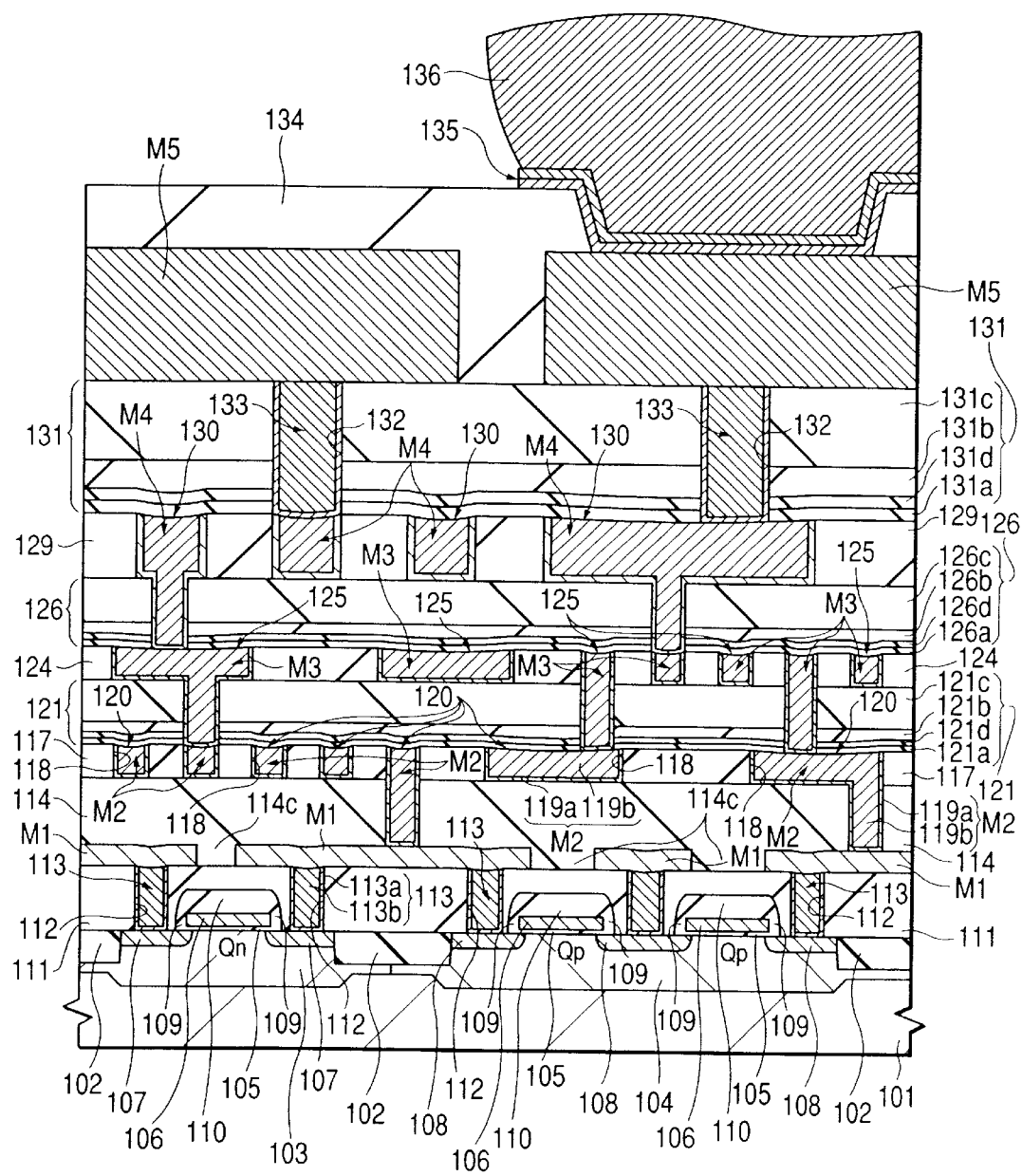
FIG. 77 is a cross-sectional view illustrating one example of a semiconductor integrated circuit device according to a still further embodiment of the present invention.

The second-layer interconnection M2, the third-layer interconnection M3 and fourth-layer interconnection M4 according to the third to six embodiments can be formed by the dual damascene method as described in the interconnection 18 of the first or second embodiment. For example, FIG. 74 illustrates a semiconductor integrated circuit device wherein the dual damascene method has been applied to the second-, third- and fourth-layer interconnections M2, M3 and M4 of the third embodiment. FIG. 75 illustrates a semiconductor integrated circuit device wherein the dual damascene method has been applied to the second-, third- and fourth-layer interconnections, M2, M3 and M4 of the fourth embodiment. FIG. 76 illustrates a semiconductor integrated circuit device wherein the dual damascene method has been applied to the second-, third- and fourth-layer interconnections M2, M3 and M4 of the fifth embodiment. FIG. 77 illustrates a semiconductor integrated circuit device wherein the dual damascene method has been applied to the second-, third- and fourth-layer interconnections M2, M3 and M4 of the device illustrated in FIG. 72.

In addition to the first to fifth-layer interconnections M1 to M5, it is possible to form upper interconnections such as sixth or seventh interconnection.

Effects available by the typical features, among the inventions disclosed herein, will next be described simply.

(1) The present invention makes it possible to improve the surface flatness of the insulating film laid over the conductive member (such as interconnection, plug) formed by the CMP method by being embedded in an interconnection groove or a connecting hole formed in an insulating film.

(2) The present invention makes it possible to prevent the occurrence of a short circuit of the second conductive member over the first conductive member formed by the CMP method by being embedded in an interconnection groove or a connecting hole formed in an insulating film, thereby improving the yield and reliability of the semiconductor integrated circuit device.

What is claimed is:

1. A process for fabricating a semiconductor integrated circuit device, comprising the steps of:
   (a) forming a first insulating film over a semiconductor substrate;
   (b) polishing the surface of said first insulating film;
   (c) performing an etching in order to form first concave portions in said first insulating film;
   (d) forming a first conductive film over a surface of said first insulating film and an inside of said first concave portions;
   (e) forming a second conductive film on said first conductive film;
   (f) polishing said first and second conductive films to form a first conductive member and a second conductive member in said first concave portions;
   (g) forming a second insulating film on said second conductive member;
   (h) forming a third insulating film including a fluid insulating film having self fluidity over said second insulating film and over said first concave portions such that a surface of said third insulating film is planarized;
   (i) forming a second concave portion in said third insulating film;
   (j) forming a third conductive film in said second concave portion and over said third insulating film;
   (k) forming a fourth conductive film on said third conductive film in said second concave portion; and
   (l) polishing said third and fourth conductive films to form a third conductive member and a fourth conductive member in said second concave portion.

2. A process according to claim 1, wherein said second insulating film is a silicon nitride film formed by a plasma chemical vapor deposition method.

3. A process according to claim 1, wherein each of said second and fourth conductive films comprises a copper film.

4. A process according to claim 3, wherein each of said first and third conductive films comprises a TiN film.

5. A process according to claim 1, wherein, in step (j), said second conductive member is exposed through said second concave portion.

6. A process for fabricating a semiconductor integrated circuit device, comprising the steps of:
   (a) forming a first insulating film, having a surface, over a semiconductor substrate;
   (b) polishing the surface of said first insulating film;
   (c) performing an etching in order to form first concave portions in said first insulating film;
   (d) forming a first conductive film over said first insulating film and an inside of said first concave portions;
   (e) forming a second conductive film on said first conductive film;
   (f) polishing said first and second conductive films to form a first conductive member and a second conductive member in said first concave portions;
   (g) forming a second insulating film comprising a nitride film on said second conductive member;
   (h) forming a third insulating film comprising an organic film and having self fluidity over said second insulating film and over said first concave portions to cover said first concave portions and said second insulating film such that a surface of said third insulating film is planarized;
   (i) forming a second concave portion in said second and third insulating films;
   (j) forming a third conductive film in said second concave portion and over said third insulating film;
   (k) forming a fourth conductive film on said third conductive film in said second concave portion; and
   (l) polishing said third and fourth conductive films to form a third conductive member and a fourth conductive member in said second concave portion.

7. A process according to claim 6, wherein each of said second and fourth conductive films comprises a copper film.

8. A process for fabricating a semiconductor integrated circuit device, comprising the steps of:
   (a) forming a first insulating film, having a surface, over a semiconductor substrate;
   (b) polishing the surface of said first insulating film;
   (c) performing an etching in order to form first concave portions in said first insulating firm;
   (d) forming a first conductive film over said first insulating film and an inside of said first concave portions;
   (e) polishing said first conductive film to form a first conductive member in said first concave portions;
   (f) forming a second insulating film comprising a nitride film on said first conductive member;
   (g) forming a third insulating film comprising an organic film and having self fluidity over said second insulating film and over said first concave portions such that a surface of said third insulating film is planarized rather than a surface of said second insulating film;
   (h) forming a second concave portion in said second and third insulating films;
   (i) forming a second conductive film in said second concave portion and over said third insulating film; and
   (j) polishing said second conductive film to form a second conductive member in said second concave portion.

9. A process according to claim 8, wherein each of said first and second conductive films comprises a copper film.

10. A process according to claim 8, wherein, in step (h), said first conductive member is exposed through said second concave portion.

11. A method of fabricating a semiconductor integrated circuit device, comprising the steps of:

polishing a first insulating film, formed over a semiconductor substrate, to have a planarized surface;

forming a second insulating film over said planarized surface of said first insulating film;

forming first concave portions in said second insulating film;

forming a first blocking film over said second insulating film and inside of said first concave portions;

forming a first conductive film on said first blocking film;

polishing said first conductive film and said first blocking film to form first conductive members in said first concave portions;

forming a second blocking film on said first conductive members;

planarizing a surface of a film, to form a planarized film formed over said second blocking film and over said first concave portions to cover said first concave portions and such that a surface of said planarized film is planarized rather than a surface of said second blocking film;

forming second concave portions in said planarized film and said second blocking film;

forming a third blocking film over said planarized film and inside of said second concave portions;

forming a second conductive film on said third blocking film; and polishing said second conductive film and said third blocking film to form second conductive members in said second concave portions.

12. A method of fabricating a semiconductor integrated circuit device according to claim 11, wherein each of said first and second conductive films comprises a copper film.

13. A method of fabricating a semiconductor integrated circuit device according to claim 11, wherein said planarizing film has self fluidity.

14. A method of fabricating a semiconductor integrated circuit device according to claim 11, wherein said planarizing film comprises an organic film.

15. A method of fabricating a semiconductor integrated circuit device according to claim 11, wherein said planarizing film comprises a spin-on-glass film.

16. A method of fabricating a semiconductor integrated circuit device, comprising the steps of:

polishing a first insulating film formed over a semiconductor substrate to have a planarized surface;

forming a second insulating film over said planarized surface of said first insulating film;

forming first concave portions in said second insulating film;

forming a first conductive film over said second insulating film and inside of said first concave portions;

polishing said first conductive film to form first conductive members in said first concave portions;

forming a first blocking film on said first conductive members;

forming a third interlayer insulating film comprising an organic film and having self fluidity over said first blocking film and over said first concave portions to cover said first concave portions and said first blocking film such that a surface of said third interlayer insulating film is planarized;

forming second concave portions in said third interlayer insulating film and said first blocking film;

forming a second conductive film over said third interlayer insulating film and inside of said second concave portions; and polishing said second conductive film to form second conductive members in said second concave portions.

17. A method of fabricating a semiconductor integrated circuit device according to claim 16, wherein each of said first and second conductive films comprises a copper film.

18. A method of fabricating a semiconductor integrated circuit device according to claim 16, wherein said third interlayer insulating film comprises a spin-on-glass film.

19. A method of fabricating a semiconductor integrated circuit device, comprising the steps of:

polishing a first interlayer insulating film formed over a semiconductor substrate to have a planarized surface;

forming a second interlayer insulating film over said planarized surface of said first interlayer insulating film;

forming first concave portions in said second interlayer insulating film;

forming a first conductive film comprising a copper film over said second interlayer insulating film and inside of said first concave portions;

polishing said first conductive film to form first conductive members in said first concave portions;

forming a first blocking film on said first conductive members;

forming a coating film comprising an organic film and having self fluidity over said first blocking film and over said first concave portions to cover said first concave portions and said first blocking film such that a surface of said coating film is planarized rather than a surface of said first blocking film;

forming second concave portions in said coating film and said first blocking film;

forming a second conductive film comprising a copper film over said coating film and inside of said second concave portions; and polishing said second conductive film to form second conductive members in said second concave portions.

20. A method of fabricating a semiconductor integrated circuit device according to claim 19, wherein said coating film comprises a spin-on-glass film.

21. A method of fabricating a semiconductor integrated circuit device, comprising the steps of:

planarizing a surface of a first interlayer insulating film formed over a semiconductor substrate;

forming a second interlayer insulating film over said planarized surface of said first interlayer insulating film;

forming first concave portions in said second interlayer insulating film;

forming a first conductive film comprising a copper film over said second interlayer insulating film and inside of said first concave portions;

polishing said first conductive film to form first conductive members in said first concave portions;

forming a first blocking film on said first conductive members;

forming a third interlayer insulating film comprising an organic film and having self fluidity over said first blocking film and over said first concave portions such that a surface of said third interlayer insulating film is planarized;

forming a fourth interlayer insulating film over said third interlayer insulating film;

forming second concave portions in said fourth interlayer insulating film, said third interlayer insulating film, and said first blocking film;

forming a second conductive film comprising a copper film over said fourth interlayer insulating film and inside of said second concave portions; and polishing said second conductive film to form second conductive members in said second concave portions.

22. A method of fabricating a semiconductor integrated circuit device according to claim 21, wherein said third interlayer insulating film comprises a spin-on-glass film.

23. A method of fabricating a semiconductor integrated circuit device, comprising the steps of:

polishing a first interlayer insulating film formed over a semiconductor substrate to have a planarized surface;

forming a second interlayer insulating film over said planarized surface of said first interlayer insulating film;

forming first concave portions in said second interlayer insulating film;

forming a first conductive film comprising a copper film over said second interlayer insulating film and inside of said first concave portions;

polishing said first conductive film to form first conductive members in said first concave portions;

forming a first blocking film on said first conductive members;

planarizing a surface of a planarizing film formed over said first blocking film and covering said first concave portions such that a surface of said planarizing film is planarized rather than a surface of said first blocking film;

forming second concave portions in said planarizing film and said first blocking film;

forming a second conductive film comprising a copper film over said planarizing film and inside of said second concave portions; and polishing said second conductive film to form second conductive members in said second concave portions.

24. A method of fabricating a semiconductor integrated circuit device according to claim 23, wherein said planarizing film has self fluidity.

25. A method of fabricating a semiconductor integrated circuit device according to claim 23, wherein said planarizing film comprises a spin-on-glass film.

26. A method of fabricating a semiconductor integrated circuit device according to claim 23, wherein said planarizing film comprises an organic film.

27. A method of fabricating a semiconductor integrated circuit device according to claim 23, wherein said planarizing film comprises a silicon oxide film formed by using a silanol.

28. A method of fabricating a semiconductor integrated circuit device according to claim 23, wherein said planarizing film comprises a coating film comprised of an organic film.

29. A method for fabricating a semiconductor integrated circuit device according to claim 1, wherein, in said step (h), said third insulating film is formed such that said surface of said third insulating film is planarized rather than a surface of said second insulating film.

30. A method for fabricating a semiconductor integrated circuit device according to claim 6, wherein, in said step (h), said third insulating film is formed such that said surface of said third insulating film is planarized rather than a surface of said second insulating film.

31. A method for fabricating a semiconductor integrated circuit device according to claim 16, wherein said third interlayer insulating film is formed such that said surface of said third interlayer insulating film is planarized rather than a surface of said first blocking film.

32. A method for fabricating a semiconductor integrated circuit device according to claim 21, wherein said third interlayer insulating film is formed such that said surface of said third interlayer insulating film is planarized rather than a surface of said first blocking film.

33. A method of fabricating a semiconductor integrated circuit device according to claim 23, wherein said planarizing includes performing chemical mechanical polishing of said planarizing film, after forming said planarizing film.

34. A method of fabricating a semiconductor integrated circuit device according to claim 11, wherein said planarizing includes performing chemical mechanical polishing of said surface of said film to form the planarized film.

35. A method of fabricating a semiconductor integrated circuit device according to claim 1, wherein said fluid insulating film is formed by forming a silanol in a gas phase and then reacting said silanol over said second insulating film.

36. A method of fabricating a semiconductor integrated circuit device according to claim 1, wherein said fluid insulating film is an inorganic spin-on-glass film.

* * * * *